US012733182B2

(12) United States Patent
Iwasaki et al.

(10) Patent No.: US 12,733,182 B2
(45) Date of Patent: Sep. 8, 2026

(54) MEMORY DEVICE

(71) Applicant: Kioxia Corporation, Tokyo (JP)

(72) Inventors: Taichi Iwasaki, Yokkaichi Mie (JP); Keisuke Kubota, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 538 days.

(21) Appl. No.: 18/360,696

(22) Filed: Jul. 27, 2023

(65) Prior Publication Data

US 2024/0074213 A1 Feb. 29, 2024

(30) Foreign Application Priority Data

Aug. 23, 2022 (JP) ................................ 2022-132648

(51) Int. Cl.
*H10B 80/00* (2026.01)
*H10W 90/00* (2026.01)
*H10W 80/00* (2026.01)

(52) U.S. Cl.
CPC ............ *H10B 80/00* (2023.02); *H10W 90/00* (2026.01); *H10W 80/312* (2026.01); *H10W 80/327* (2026.01); *H10W 90/792* (2026.01)

(58) Field of Classification Search
None
See application file for complete search history.

(56) References Cited

U.S. PATENT DOCUMENTS 9,711,502 B2 7/2017 Huang
11,043,532 B2 6/2021 Yokoyama
11,094,714 B2 8/2021 Chen
11,289,467 B2 3/2022 Kwon
11,315,639 B2 4/2022 Oh
11,342,352 B2 5/2022 Chen
11,348,910 B2 5/2022 Kim
11,923,339 B2 3/2024 Liu
2017/0008760 A1* 1/2017 Lloyd .................. B81B 7/0074
2018/0350785 A1* 12/2018 Fong ...................... H01L 24/94
2021/0065801 A1 3/2021 Kwon
2022/0037267 A1 2/2022 Zhang
2022/0077088 A1 3/2022 Okada
2022/0359441 A1* 11/2022 Hasnat .................... H01L 25/50
2024/0196631 A1* 6/2024 Chen ...................... H10B 43/40

FOREIGN PATENT DOCUMENTS

JP 2022046249 A 3/2022
TW I716864 B 1/2021
TW 202107688 A 2/2021
TW I743507 B 10/2021
TW 202207375 A 2/2022

* cited by examiner

*Primary Examiner* — Michelle Mandala
(74) *Attorney, Agent, or Firm* — Kim & Stewart LLP

(57) ABSTRACT

According to one embodiment, a memory device includes a first substrate and a second substrate. The first substrate is provided with a first circuit layer on a front surface. The first circuit layer includes a CMOS circuit. The second substrate has a front surface that faces the first substrate. The second substrate is provided with a second circuit layer on the front surface contacting the first circuit layer. The second substrate includes a memory circuit and transistors of a silicon-on-insulator (SOI) structure.

20 Claims, 33 Drawing Sheets

15
16
10
DRIVER CIRCUIT
ROW DECODER MODULE
MEMORY CELL ARRAY
RD0
BLK0
BLOCK DECODER
BD
bTG
TG
SGDD4
TR13
SGD4
TR19
SGDD0
TR9
SGD0
USGD
TR15
CG7
TR8
WL7
CG6
TR7
WL6
CG1
TR2
WL1
CG0
TR1
WL0
SGSD
TR0
SGS
USGS
TR14
RDn
BLKn
SIGNAL LINE

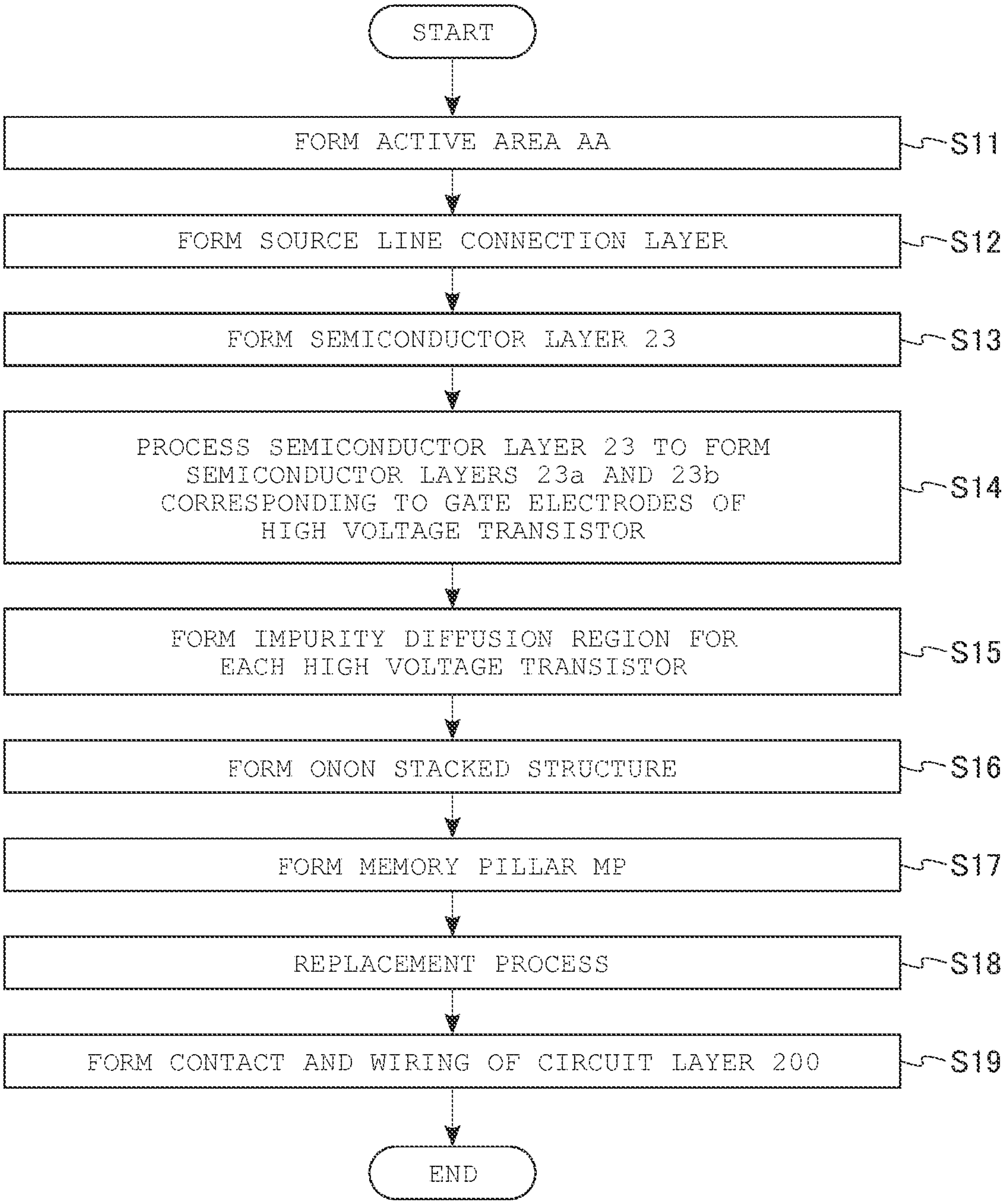

FIG. 14
START
FORM ACTIVE AREA AA
S11
FORM SOURCE LINE CONNECTION LAYER
S12
FORM SEMICONDUCTOR LAYER 23
S13
PROCESS SEMICONDUCTOR LAYER 23 TO FORM SEMICONDUCTOR LAYERS 23a AND 23b CORRESPONDING TO GATE ELECTRODES OF HIGH VOLTAGE TRANSISTOR
S14
FORM IMPURITY DIFFUSION REGION FOR EACH HIGH VOLTAGE TRANSISTOR
S15
FORM ONON STACKED STRUCTURE
S16
FORM MEMORY PILLAR MP
S17
REPLACEMENT PROCESS
S18
FORM CONTACT AND WIRING OF CIRCUIT LAYER 200
S19
END (A) FIRST COMPARATIVE EXAMPLE

MEMORY CELL ARRAY

CMOS CIRCUIT (B) SECOND COMPARATIVE EXAMPLE

MEMORY CELL ARRAY

CMOS CIRCUIT (C) FIRST EMBODIMENT

MEMORY CELL ARRAY + FIRST PORTION OF CMOS CIRCUIT

SECOND PORTION OF CMOS CIRCUIT

10B HR MR Z Y X PW 61 60 300 21 W2 36 37 22 23 24 25 25 25 25 25 25 25 25 26 MP 33 CV 200 CC M0 28 27 V0 M1 29 BP 34 V1 B1 B2 35 52 C3 D2 55 C2 D1 54 C1 D0 53 C0 51 100 GC DR STI 50 W1 TR0 T8

| | MEMORY SUBSTRATE W2 | CMOS SUBSTRATE W1 |
|---|---|---|
| (A) THIRD COMPARATIVE EXAMPLE | PL1 PL2 PL3 PL4 | PL1 PL2 PL3 PL4 |
| (B) FOURTH COMPARATIVE EXAMPLE | PL1 PL2 PL3 PL4 | PL1 PL2 PL3 PL4 |
| (C) SECOND EMBODIMENT | PL1 PL2 PL3 PL4 | PL1 PL2 PL3 PL4 |

MEMORY DEVICE

CROSS-REFERENCE TO RELATED APPLICATION(S)

This application is based upon and claims the benefit of priority from Japanese Patent Application No. 2022-132648, filed Aug. 23, 2022, the entire contents of which are incorporated herein by reference.

FIELD

Embodiments described herein relate generally to a memory device.

BACKGROUND

A NAND flash memory is known that can store data in a non-volatile manner.

BRIEF DESCRIPTION OF THE DRAWINGS

FIG. 14 is a flowchart illustrating an example of a manufacturing process of a memory substrate before bonding for a memory device according to a first embodiment.

DETAILED DESCRIPTION

Figure 1:
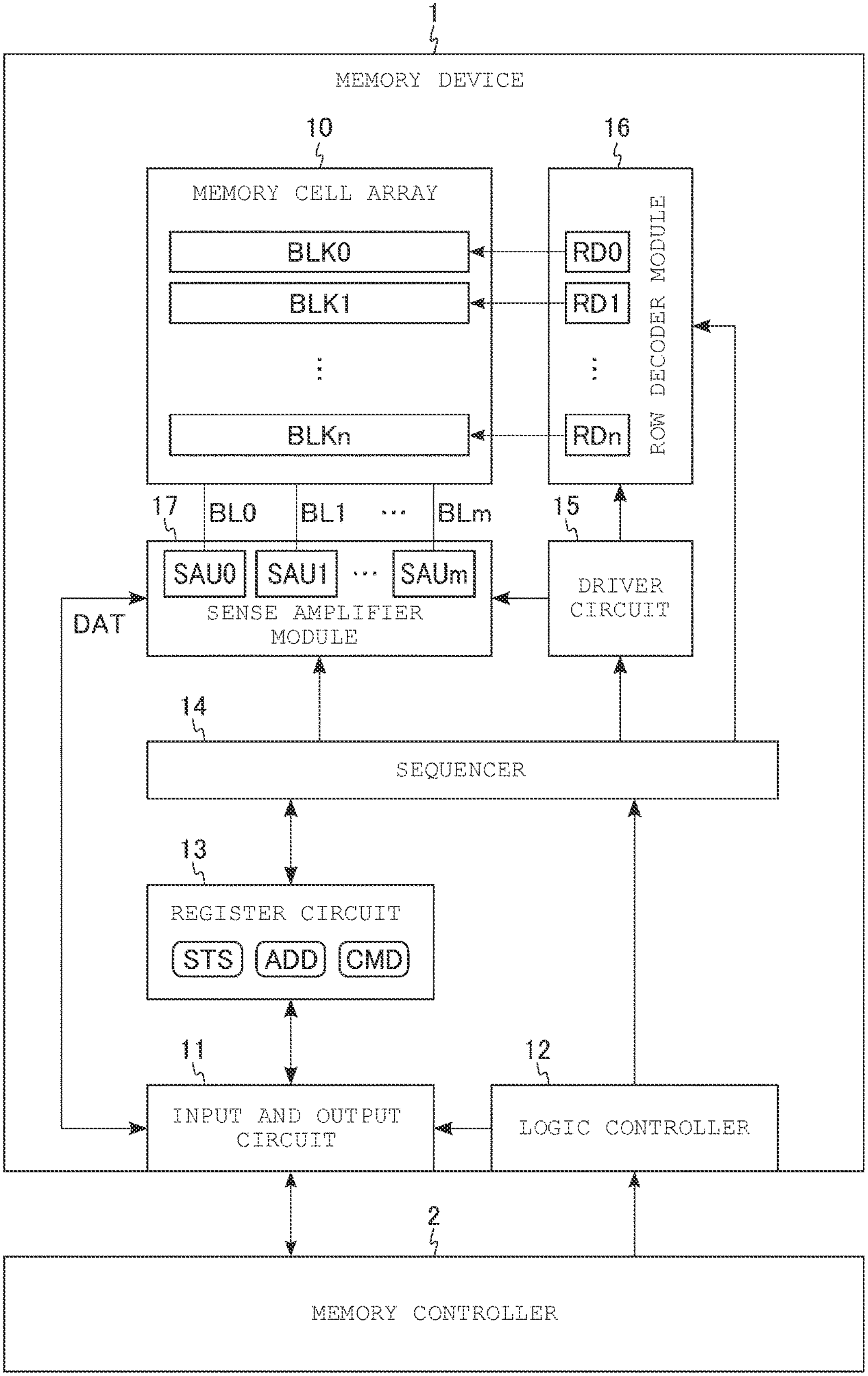
FIG. 1 is a block diagram of a memory system including a memory device according to a first embodiment.

In general, according to one embodiment, a memory device includes a first substrate and a second substrate. The first substrate is provided with a first circuit layer on a front surface. The first circuit layer includes a CMOS circuit. The second substrate has a front surface facing the front surface of the first substrate. The second substrate is provided with a second circuit layer on the front surface contacting the first circuit layer. The second circuit layer includes a memory circuit and transistors with a silicon-on-insulator (SOI) structure.

Certain example embodiments will be described below with reference to the drawings. The drawings are schematic and/or conceptual. As such, depicted dimensions and proportions in the drawing are not necessarily the same as the actual ones. Additionally, the drawings are schematic and thus illustration of certain aspects of configuration may be omitted as appropriate for purposes of explanation of other aspects. Any hatching added to a planar view is not necessarily related to the material or properties of the components but is provided for purposes of explanatory clarity. In the present specification, the same reference numerals are used to denote components having substantially the same function and configuration. In some cases, numbers, letters, and the like appended to reference numerals as suffixes or the like are used to distinguish among multiple instances of substantially similar elements that might otherwise be referred to by the same reference numeral.

<1> First Embodiment

A memory device 1 according to a first embodiment has a structure in which a substrate on which memory cells are formed and a substrate on which a CMOS circuit is formed are bonded together. In the memory device 1 according to the first embodiment, a part of the CMOS circuit may also be disposed on the substrate on which the memory cells are formed.

<1-1> Configuration

<1-1-1> Overall Configuration of Memory Device 1

FIG. 1 is a block diagram illustrating an example of the overall configuration of a memory system including a memory device 1 according to the first embodiment. As illustrated in FIG. 1, the memory device 1 is controlled by an external memory controller 2. The memory device 1 is, for example, a NAND flash memory that can store data in a non-volatile manner. The memory device 1 includes, for example, a memory cell array 10, an input and output circuit 11, a logic controller 12, a register circuit 13, a sequencer 14, a driver circuit 15, a row decoder module 16, and a sense amplifier module 17.

The memory cell array 10 includes a plurality of blocks BLK (BLK0 to BLKn) (here "n" is an integer equal to or greater than 1). A block BLK is a set of a plurality of memory cells. The block BLK corresponds to, for example, a unit of erasing data. The block BLK includes a plurality of pages. A page corresponds to a unit in which data is read and written. Although the specific illustration is omitted, the memory cell array 10 is provided with a plurality of bit lines BL0 to BLm (here "m" is an integer equal to or greater than 1) and a plurality of word lines WL. Each memory cell is associated with one bit line BL and one word line WL. A block address is assigned to each block BLK. A column address is assigned to each bit line BL. A page address is assigned to each word line WL.

The input and output circuit 11 is an interface circuit that controls transmission and reception of input and output signals with the memory controller 2. Input and output signals include, for example, data DAT, status information STS, address information ADD, command CMD, and the like. The input and output circuit 11 can input and output data DAT between the sense amplifier module 17 and the memory controller 2, respectively. The input and output circuit 11 can output the status information STS transferred from the register circuit 13 to the memory controller 2. The input and output circuit 11 can output each of the address information ADD and the command CMD transferred from the memory controller 2 to the register circuit 13.

The logic controller 12 controls the input and output circuit 11 and the sequencer 14 based on control signals input from the memory controller 2. For example, the logic controller 12 controls the sequencer 14 and enables the memory device 1. The logic controller 12 notifies the input and output circuit 11 that the input and output signal received by the input and output circuit 11 is the command CMD, the address information ADD, or the like. The logic controller 12 commands the input and output circuit 11 to input or output an input and output signal.

The register circuit 13 temporarily stores the status information STS, the address information ADD, and the command CMD. The status information STS is updated under the control of the sequencer 14 and transferred to the input and output circuit 11. The address information ADD includes the block addresses, page addresses, column addresses, and the like. The command CMD includes commands regarding various operations of the memory device 1.

The sequencer 14 controls the overall operation of the memory device 1. The sequencer 14 executes read operation, write operation, erase operation, and the like based on the command CMD and the address information ADD stored in the register circuit 13.

The driver circuit 15 generates voltages used in read, write, and erase operations. The driver circuit 15 supplies the generated voltage to the row decoder module 16, the sense amplifier module 17, and the like.

The row decoder module 16 is a circuit used for selecting a block BLK to be operated and transferring voltage to wiring such as word lines WL. The row decoder module 16 includes a plurality of row decoders RD0 to RDn. The row decoders RD0 to RDn are associated with blocks BLK0 to BLKn, respectively.

The sense amplifier module 17 is a circuit used for transferring voltage to each bit line BL and reading data. The sense amplifier module 17 includes a plurality of sense amplifier units SAU0 to SAUm. The sense amplifier units SAU0 to SAUm are associated with a plurality of bit lines BL0 to BLm, respectively.

The combination of the memory device 1 and the memory controller 2 may be provided as one integrated semiconductor device. Such a semiconductor device includes, for example, a memory card such as an SD™ card, a solid-state drive (SSD), and the like. A set (group) including the memory cell array 10, the row decoder module 16, and the sense amplifier module 17 can also be referred to as a "plane". A plane may contain other circuits. The memory device 1 may include a plurality of planes.

<1-1-2> Circuit Configuration of Memory Device 1

Next, the circuit configuration of the memory device 1 according to the first embodiment will be described.

(1: Circuit Configuration of Memory Cell Array 10)

Figure 2:
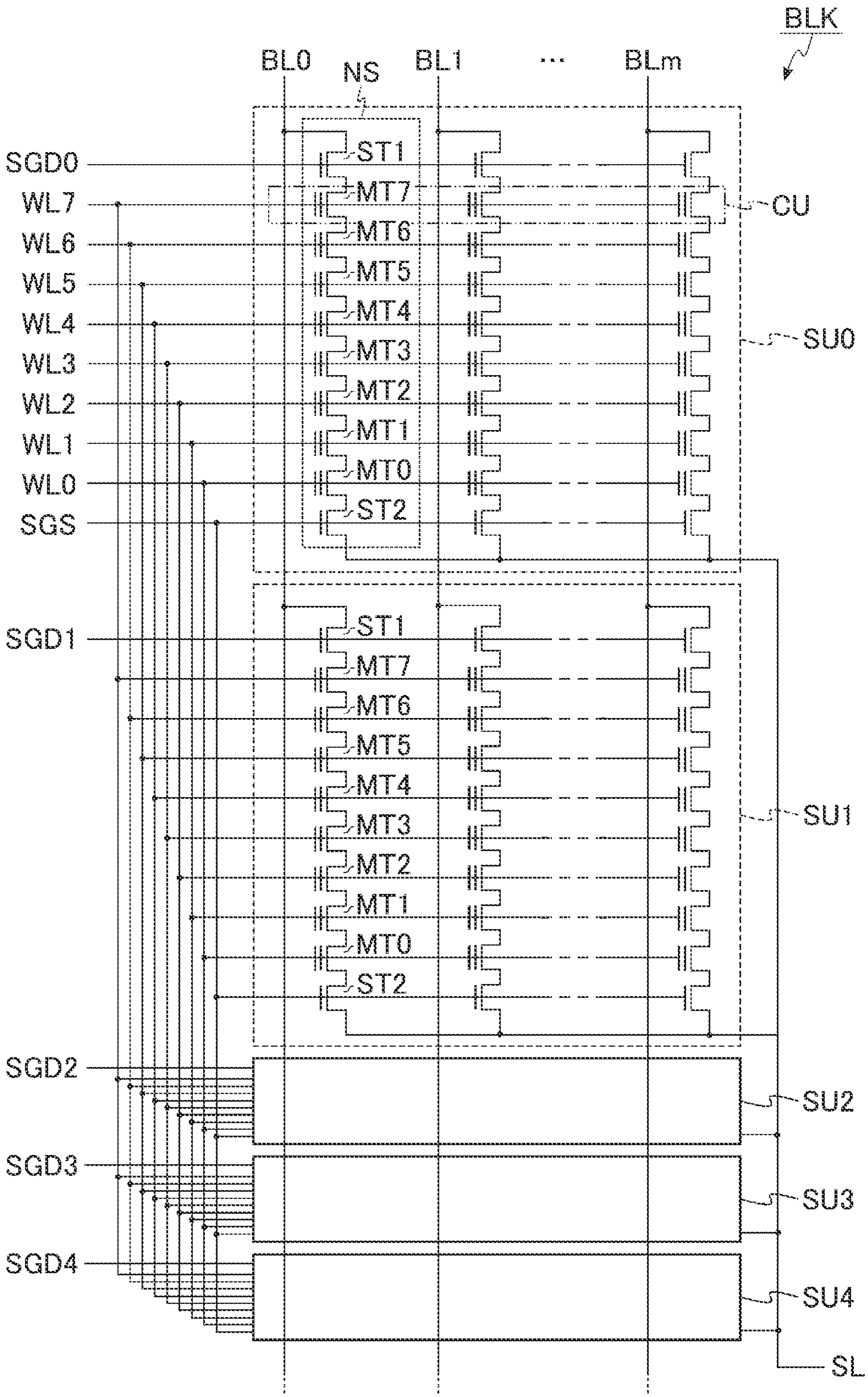
FIG. 2 is a circuit diagram of a memory cell array in a memory device according to a first embodiment.

FIG. 2 is a circuit diagram illustrating an example of the circuit configuration of the memory cell array 10 provided in the memory device 1 according to the first embodiment. FIG. 2 illustrates one block BLK among a plurality of blocks BLK provided in the memory cell array 10. As illustrated in FIG. 2, the block BLK includes, for example, five string units SU0 to SU4. The select gate lines SGD0 to SGD4 and SGS and word lines WL0 to WL7 are provided for each block BLK. The bit lines BL0 to BLm and the source line SL are shared by a plurality of blocks BLK.

Each string unit SU includes a plurality of NAND strings NS. The plurality of NAND strings NS is associated with the bit lines BL0 to BLm, respectively. That is, each bit line BL is shared by NAND strings NS assigned with the same column address among the plurality of blocks BLK. Each NAND string NS is connected between the associated bit line BL and the source line SL. Each NAND string NS includes, for example, memory cell transistors MT0 to MT7 and select transistors ST1 and ST2. Each memory cell transistor MT is a memory cell including a control gate and a charge storage layer and latches (stores) data in a non-volatile manner. Each of the select transistors ST1 and ST2 is used for selecting the string unit SU.

In each NAND string NS, the select transistor ST1, the memory cell transistors MT7 to MT0, and the select transistor ST2 are connected in series in this order. Specifically, the drain and source of the select transistor ST1 are connected to the associated bit line BL and the drain of the memory cell transistor MT7, respectively. The drain and source of the select transistor ST2 are connected to the source of the memory cell transistor MT0 and the source line SL, respectively. The memory cell transistors MT0 to MT7 are connected in series between the select transistors ST1 and ST2.

The select gate lines SGD0 to SGD4 are associated with the string units SU0 to SU4, respectively. Each select gate line SGD is connected to each of a plurality of gates of the select transistor ST1 provided in the associated string unit SU. The select gate line SGS is connected to each of a plurality of gates of the select transistor ST2 provided in the associated block BLK. The word lines WL0 to WL7 are respectively connected to respective control gates of the plurality of memory cell transistors MT0 to MT7 provided in the associated block BLK.

A set of a plurality of memory cell transistors MT connected to a common word line WL in the same string unit SU is referred to as, for example, a "cell unit CU". For example, the storage capacity of the cell unit CU when each memory cell transistor MT stores 1-bit data is defined as "1 page data". The cell unit CU may have a storage capacity of two or more pages of data according to the number of bits of data stored in each memory cell transistor MT.

The circuit configuration of the memory cell array 10 provided in the memory device 1 according to the first embodiment may be another configuration. For example, the number of string units SU provided in each block BLK and the respective numbers of memory cell transistors MT and select transistors ST1 and ST2 provided in each NAND string NS may be designed to be any numbers.

(2: Circuit Configuration of Row Decoder Module 16)

Figure 3:
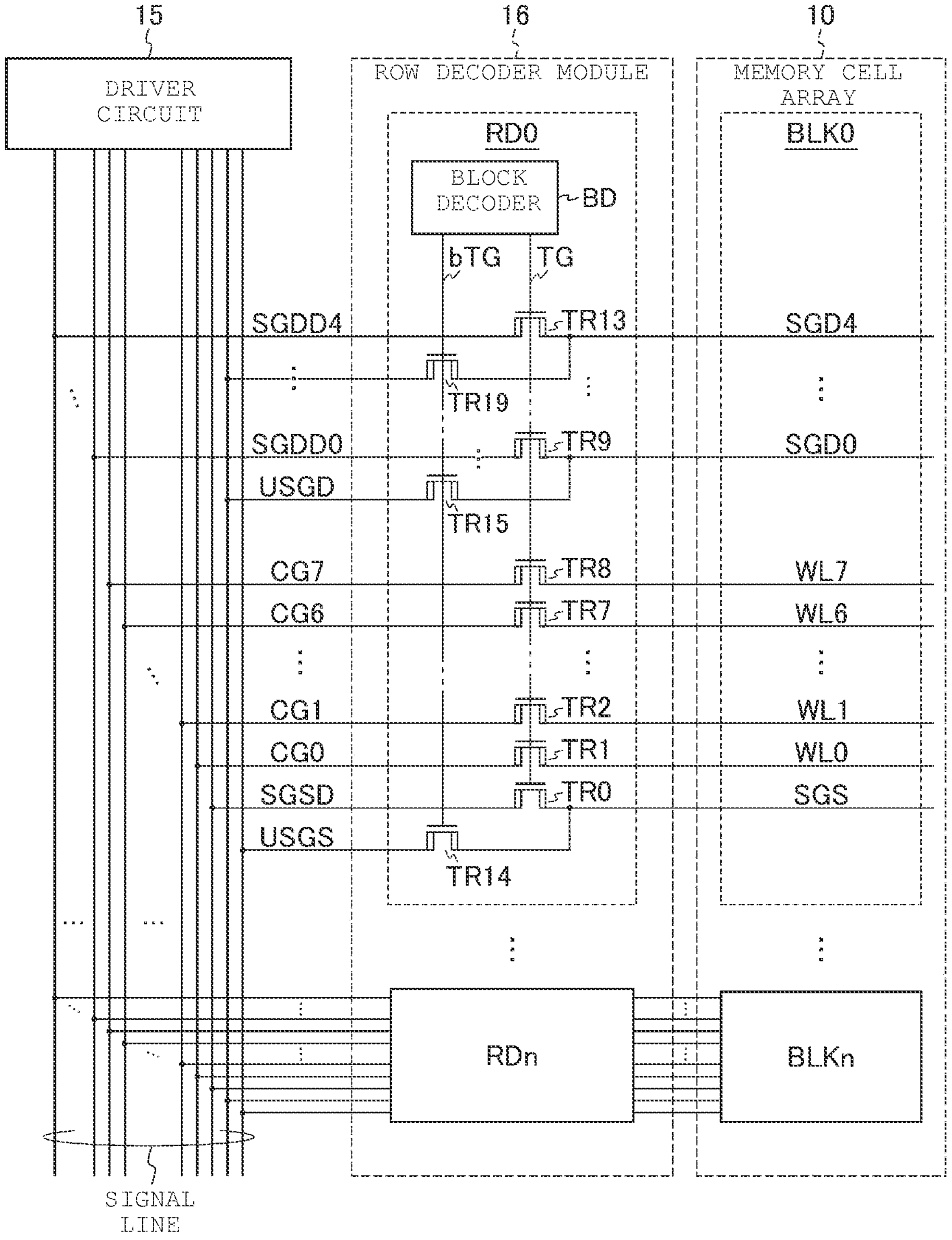
FIG. 3 is a circuit diagram of a row decoder module in a memory device according to a first embodiment.

FIG. 3 is a circuit diagram illustrating an example of the circuit configuration of the row decoder module 16 provided in the memory device 1 according to the first embodiment. FIG. 3 illustrates the connection relationship among the row decoder module 16, the driver circuit 15, and the memory cell array 10, and the detailed circuit configuration of the row decoder RD0. As illustrated in FIG. 3, each row decoder RD and the driver circuit 15 are connected via signal lines CG0 to CG7, SGDD0 to SGDD4, SGSD, USGD, and USGS. Each row decoder RD and the block BLK associated thereto are connected via word lines WL0 to WL7 and select gate lines SGS and SGD0 to SGD4.

Focusing on the row decoder RD0, the connection relationship among the row decoder RD, the driver circuit 15, and the block BLK0 will be described. The configuration of the other row decoders RD is similar to that of the row decoder RD0 except that the associated block BLK is different. The row decoder RD0 includes, for example, transistors TR0 to TR19, transfer gate lines TG and bTG, and a block decoder BD.

Each of the transistors TR0 to TR19 is a high-voltage N-type MOS transistor (also referred to as a "high-voltage transistor"). In the present context, the threshold voltage of a high-voltage transistor is designed to be 10V or higher. The drain and source of the transistor TR0 are connected to the signal line SGSD and the select gate line SGS, respectively. The drains of the transistors TR1 to TR8 are connected to the signal lines CG0 to CG7, respectively. The sources of the transistors TR1 to TR8 are connected to the word lines WL0 to WL7, respectively. The drains of the transistors TR9 to TR13 are connected to the signal lines SGDD0 to SGDD4, respectively. The sources of the transistors TR9 to TR13 are connected to the select gate lines SGD0 to SGD4, respectively. The drain and source of the transistor TR14 are connected to the signal line USGS and select gate line SGS, respectively. Each drain of the transistors TR15 to TR19 is connected to the signal line USGD. The sources of the transistors TR15 to TR19 are connected to the select gate lines SGD0 to SGD4, respectively. Each gate of the transistors TR0 to TR13 is connected to the transfer gate line TG. Each gate of the transistors TR14 to TR19 is connected to the transfer gate line bTG. An inverted signal of the signal input to the transfer gate line TG is input to the transfer gate line bTG.

The block decoder BD is a circuit having a function of decoding block addresses. The block decoder BD applies a predetermined voltage to each of the transfer gate lines TG and bTG based on the decoding result of the block address. Specifically, the block decoder BD corresponding to the selected block BLK applies "H" level and "L" level voltages to the transfer gate lines TG and bTG, respectively. A block decoder BD corresponding to an unselected block BLK applies "L" level and "H" level voltages to the transfer gate lines TG and bTG, respectively. As a result, the voltages of the signal lines CG0 to CG7 are transferred to the word lines WL0 to WL7 of the selected block BLK, respectively, and the voltages of the signal lines SGDD0 to SGDD4 and SGSD are transferred to the select gate lines SGD0 to SGD4 and SGS of the selected block BLK. The voltages of the signal lines USGD and USGS are transferred to the select gate lines SGD and SGS of the unselected block BLK, respectively.

The row decoder module 16 may have another circuit configuration. For example, the number of transistors TR provided in the row decoder module 16 may be changed according to the number of wirings provided in each block BLK. The signal line CG may be called a "global word line" because the signal line CG is shared among a plurality of blocks BLK. The word line WL may be called a "local word line" because the word line WL is provided for each block BLK. Each of the signal lines SGDD and SGSD may be called a "global transfer gate line" because the signal lines SGDD and SGSD are shared among a plurality of blocks BLK. Each of the select gate lines SGD and SGS may be called a "local transfer gate line" because each of the select gate lines SGD and SGS is provided for each block BLK. Hereinafter, a set of high-voltage transistors (transistors TR) provided in each row decoder module 16 is also called a "word line switch unit WLSW".

(3: Circuit Configuration of Sense Amplifier Module 17)

Figure 4:
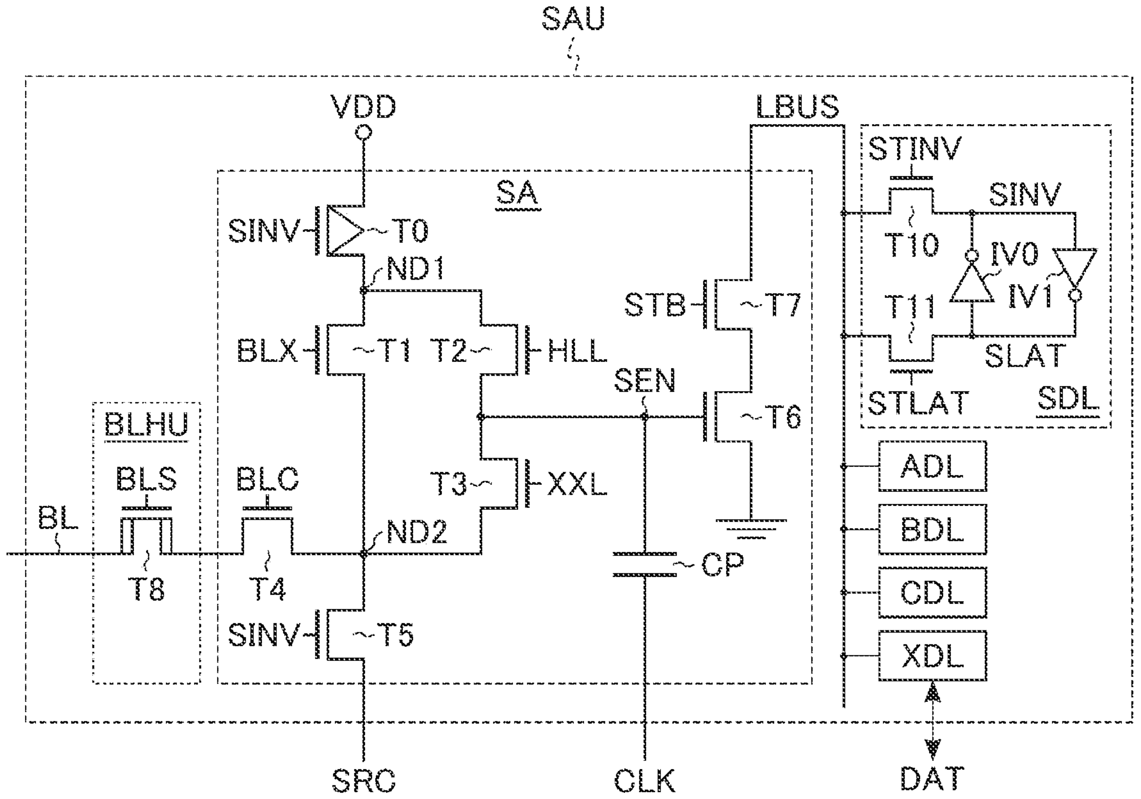
FIG. 4 is a circuit diagram of a sense amplifier module in a memory device according to a first embodiment.

FIG. 4 is a circuit diagram illustrating an example of the circuit configuration of the sense amplifier module 17 provided in the memory device 1 according to the first embodiment. FIG. 4 illustrates an extracted circuit configuration of one sense amplifier unit SAU. As illustrated in FIG. 4, the sense amplifier unit SAU includes, for example, a sense amplifier portion SA, a bit line connection unit BLHU, latch circuits SDL, ADL, BDL, CDL, and XDL, and a bus LBUS. The sense amplifier portion SA and the latch circuits SDL, ADL, BDL, CDL, and XDL are configured to be able to transmit and receive data via the bus LBUS, for example.

The sense amplifier portion SA is a circuit used for determining data based on the voltage of the bit line BL and applying a voltage to the bit line BL. When the control signal STB is asserted during the read operation, the sense amplifier portion SA determines whether the data read from the selected memory cell transistor MT is "0" or "1" based on the voltage of the associated bit line BL. Each of the latch circuits SDL, ADL, BDL, CDL, and XDL is a circuit capable of temporarily storing data. The latch circuit XDL is used to input and output data DAT between the sense amplifier unit SAU and the input and output circuit 11. The latch circuit XDL may also be used as a cache memory. The latch circuit XDL may be shared by a plurality of sense amplifier units SAU.

The sense amplifier portion SA includes transistors T0 to T7, a capacitor CP, and nodes ND1, ND2, SEN, and SRC. The bit line connection unit BLHU is a switch circuit for preventing the high voltage applied to the channel of the NAND string NS in the erase operation from being applied to the circuit in the sense amplifier portion SA. The bit line connection unit BLHU includes a transistor T8. The latch circuit SDL includes inverters IV0 and IV1, transistors T10 and T11, and nodes SINV and SLAT. The transistor T0 is a P-type MOS transistor. Each of the transistors T1 to T8, T10 and T11 is an N-type MOS transistor. The transistor T8 is an N-type MOS transistor (N-type high-voltage transistor) having a higher withstand voltage than the N-type transistor in the sense amplifier portion SA. Hereinafter, a transistor with a lower withstand voltage than a high-voltage transistor will also be referred to as a "low-voltage transistor". The threshold voltage of the low-voltage transistor is lower than that of the high-voltage transistor.

The gate of the transistor T0 is connected to the node SINV. The source of the transistor T0 is connected to the power supply line. The drain of the transistor T0 is connected to the node ND1. The node ND1 is connected to the respective drains of the transistors T1 and T2. The sources of the transistors T1 and T2 are connected to the nodes ND2 and SEN, respectively. The nodes ND2 and SEN are connected to the source and drain of the transistor T3, respectively. The node ND2 is connected to the respective drains of transistors T4 and T5. The source of the transistor T5 is connected to the node SRC. The gate of the transistor T5 is connected to the node SINV. The node SEN is connected to the gate of the transistor T6 and one electrode of the capacitor CP. The source of the transistor T6 is grounded. The drain and source of the transistor T7 are connected to the bus LBUS and the drain of the transistor T6, respectively. The drain of the transistor T8 is connected to the source of the transistor T4. The source of the transistor T8 is electrically connected to the associated the bit line BL.

For example, the power supply voltage VDD is applied to the source of the transistor T0. A ground voltage VSS, for example, is applied to the node SRC. The control signals BLX, HLL, XXL, BLC, and STB are input to respective gates of the transistors T1, T2, T3, T4 and T7. A control signal BLS is input to the gate of the transistor T8. A clock signal CLK is input to the other electrode of the capacitor CP.

The input and output nodes of the inverter IV0 are connected to nodes SLAT and SINV, respectively. The input and output of the inverter IV1 are connected to the nodes SINV and SLAT, respectively. One end and the other end of the transistor T10 are connected to the node SINV and the bus LBUS, respectively. A control signal STINV is input to the gate of the transistor T10. One end and the other end of the transistor T11 are connected to the node SLAT and the bus LBUS, respectively. A control signal STLAT is input to the gate of the transistor T11. The latch circuit SDL latches data in the node SLAT and latches the inverted data of the data stored in the node SLAT in the node SINV.

The circuit configurations of the latch circuits ADL, BDL, CDL, and XDL are similar to the latch circuit SDL. For example, the latch circuit ADL latches data at the node ALAT and the inverted data at the node AINV. A control signal ATINV is input to the gate of the transistor T10 of the latch circuit ADL, and a control signal ATLAT is input to the gate of the transistor T11 of the latch circuit ADL. The latch circuit BDL latches data at the node BLAT and the inverted data at the node BINV. Then, a control signal BTINV is input to the gate of the transistor T10 of the latch circuit BDL, and a control signal BTLAT is input to the gate of the transistor T11 of the latch circuit BDL. The same applies to the latch circuits CDL and XDL, so additional description thereof will be omitted.

Each of the control signals BLX, HLL, XXL, BLC, STB, BLS, STINV, and STLAT, and the clock signal CLK is generated by the sequencer 14. The sense amplifier module 17 may have other circuit configurations. For example, the number of latch circuits provided in each sense amplifier unit SAU may be changed according to the number of bits stored in each memory cell transistor MT. The sense amplifier unit SAU may include an arithmetic circuit capable of executing simple logic operations. The sense amplifier module 17 may determine the data stored in the memory cell transistor MT by appropriately executing arithmetic processing using the latch circuit in the read operation of each page.

<1-1-3> Structure of Memory Device 1

Next, the structure of the memory device 1 according to the first embodiment will be described. In the drawings referred to below, a three-dimensional Cartesian coordinate system is used. The X direction corresponds to the extending direction of the word lines WL. The Y direction corresponds to the extending direction of the bit lines BL. The Z direction corresponds to the vertical direction with respect to the surface of the substrate used as a reference. "Up and down" in the specification is defined based on the direction along the Z direction, and the direction away from the front surface side of the substrate used as a reference is defined as the positive direction (upward). As a reference substrate, for example, the substrate disposed at the bottom in the drawing is used. The front surface of the substrate corresponds to the surface on which elements such as transistors (CMOS circuits) are formed. The back surface of the substrate corresponds to the surface opposite to the front surface.

(1: Appearance of Memory Device 1)

Figure 5:
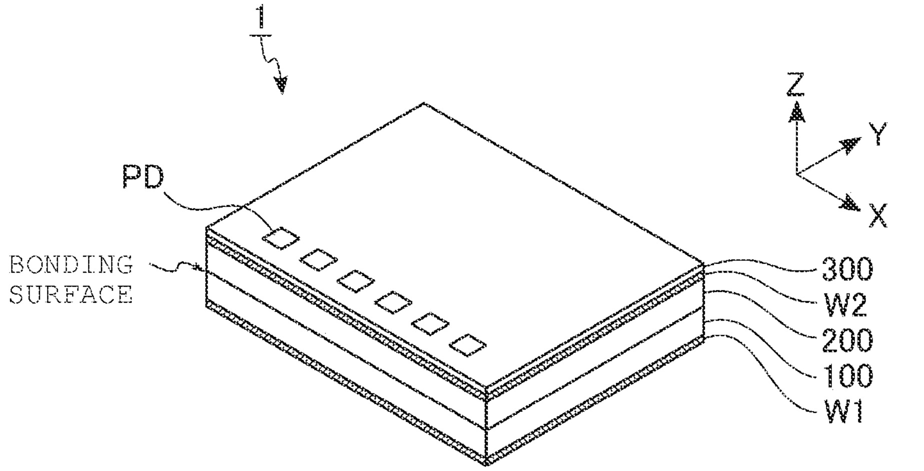
FIG. 5 is a perspective view illustrating an example of an outer appearance of a memory device according to a first embodiment.

FIG. 5 is a perspective view illustrating an example of the appearance of the memory device according to the first embodiment. As illustrated in FIG. 5, the memory device 1 has a structure in which a CMOS substrate W1, circuit layers 100 and 200, a memory substrate W2, and a wiring layer 300 are stacked in this order from the bottom.

The CMOS substrate W1 is a silicon substrate used for forming the CMOS circuit. The memory substrate W2 is a silicon substrate used for forming the memory cell array 10. For example, the input and output circuit 11, the logic controller 12, the register circuit 13, the sequencer 14, the driver circuit 15, the row decoder module 16, the sense amplifier module 17, and the like are located on the CMOS substrate W1. The memory cell array 10 is disposed on the memory substrate W2. A part of CMOS circuits such as the row decoder module 16 and the sense amplifier module 17 may be disposed on the memory substrate W2.

The circuit layer 100 includes a plurality of wiring layers formed using the CMOS substrate W1. The circuit layer 200 includes a plurality of wiring layers formed using the memory substrate W2. The memory device 1 has a structure in which the CMOS substrate W1 and the memory substrate W2 are disposed opposite to each other by bonding processing of the CMOS substrate W1 and the memory substrate W2, and the circuit layer 100 and the circuit layer 200 are in contact with each other. That is, the bonding surface of the memory device 1 corresponds to the contact (boundary) portion between the circuit layer 100 and the circuit layer 200. A plurality of pads PD used for connecting the memory device 1 and the memory controller 2 are provided on the upper surface of the wiring layer 300. The pad PD is connected to, for example, the input and output circuit 11 provided on the CMOS substrate W1.

(2: Planar Layout of Memory Device 1)

Figure 6:
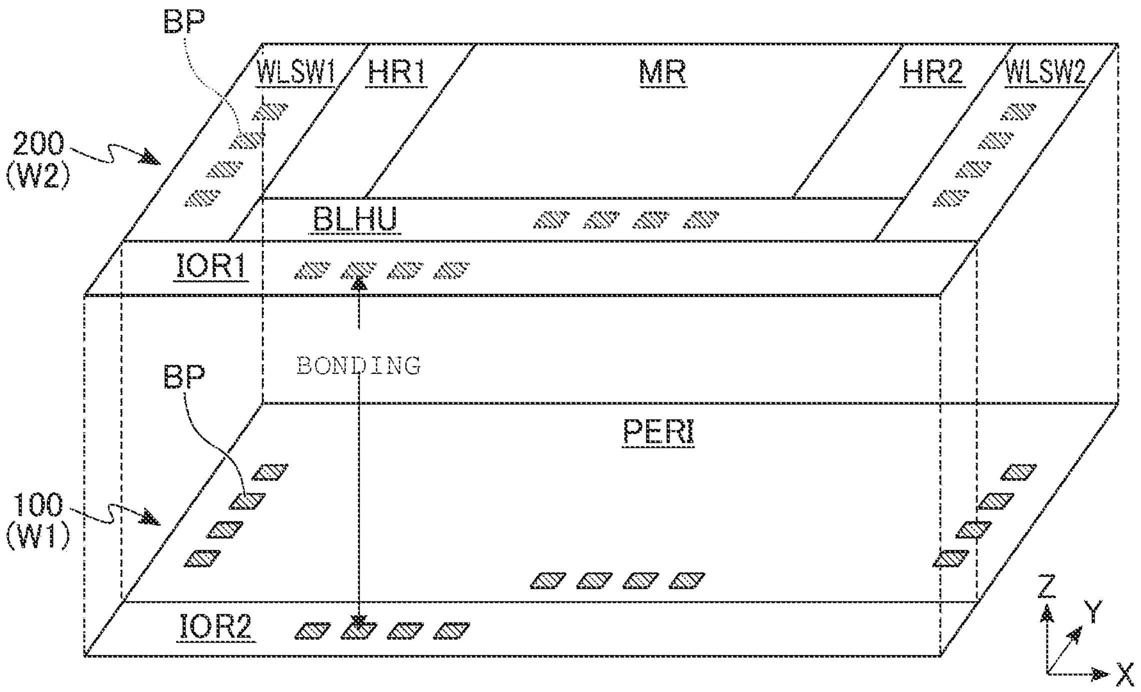
FIG. 6 is a schematic diagram illustrating an example of a planar layout of a memory device according to a first embodiment.

FIG. 6 is a schematic diagram illustrating an example of the planar layout of the memory device 1 according to the first embodiment. FIG. 6 illustrates the layout of the bonding surface between the circuit layer 100 (CMOS substrate W1) and the circuit layer 200 (memory substrate W2) and illustrates coordinate axes with the CMOS substrate W1 as a reference. As illustrated in FIG. 6, the regions of the memory substrate W2 are divided into the memory region MR, lead regions HR1 and HR2, regions of word line switch units WLSW1 and WLSW2, a region of the bit line connection unit BLHU, and an input and output region IOR1. The area of the CMOS substrate W1 is divided into a peripheral circuit area PERI and an input and output region IOR2.

The memory region MR is used for data storage and includes a plurality of NAND strings NS. The memory region MR is disposed between the lead regions HR1 and HR2 and is adjacent to the lead regions HR1 and HR2 in the X direction. The lead region HR is a region used for connecting a contact to the stacked wiring provided in the memory region MR. The lead regions HR1 and HR2 are disposed between the word line switch units WLSW1 and WLSW2 and are adjacent to the word line switch units WLSW1 and WLSW2 in the X direction. A high-voltage transistor (TR) provided in the row decoder RD is disposed in the word line switch unit WLSW. The bit line connection unit BLHU is adjacent to the memory region MR in the Y direction. The bit line connection unit BLHU includes a plurality of high-voltage transistors (T8) as described above. The input and output region IOR1 is adjacent to the word line switch units WLSW1 and WLSW2 and the bit line connection unit BLHU in the Y direction. The input and output region IOR1 includes a circuit associated with the input and output circuit 11.

The peripheral circuit region PERI includes the row decoder module 16 excluding the high-voltage transistor disposed in word line switch unit WLSW, the sense amplifier module 17 excluding the high-voltage transistor disposed in bit line connection units BLHU, and the CMOS circuit of the sequencer 14, and the like. The peripheral circuit region PERI overlaps with the memory region MR, the lead regions HR1 and HR2, the word line switch units WLSW1 and WLSW2, and the bit line connection unit BLHU in the Z direction. The input and output region IOR2 includes the input and output circuit 11 and the like. The input and output region IOR2 overlaps with the input and output region IOR1 in the Z direction.

A plurality of bonding pads BP are provided on the bonding surface between the circuit layer 100 (CMOS substrate W1) and the circuit layer 200 (memory substrate W2). The plurality of bonding pads BP are located in each of the word line switch units WLSW1 and WLSW2, the bit line connection unit BLHU, and the input and output region IOR1. The plurality of bonding pads BP provided on the bonding surface of the circuit layer 100 are located to face the plurality of bonding pads BP provided on the bonding surface of the circuit layer 200. The pair of two bonding pads BP located facing each other between the circuit layer 100 and the circuit layer 200 are bonded by a bonding process ("bonding" in FIG. 6). As a result, the two bonding pads BP located to face each other are electrically connected. The arrangement of the bonding pads BP may be changed as appropriate according to the circuit design of the memory device 1. A bonding pad BP may be referred to as bonding metal. The bonding pads BP may comprise, for example, copper.

(3: Planar Layout of Memory Substrate W2)

Figure 7:
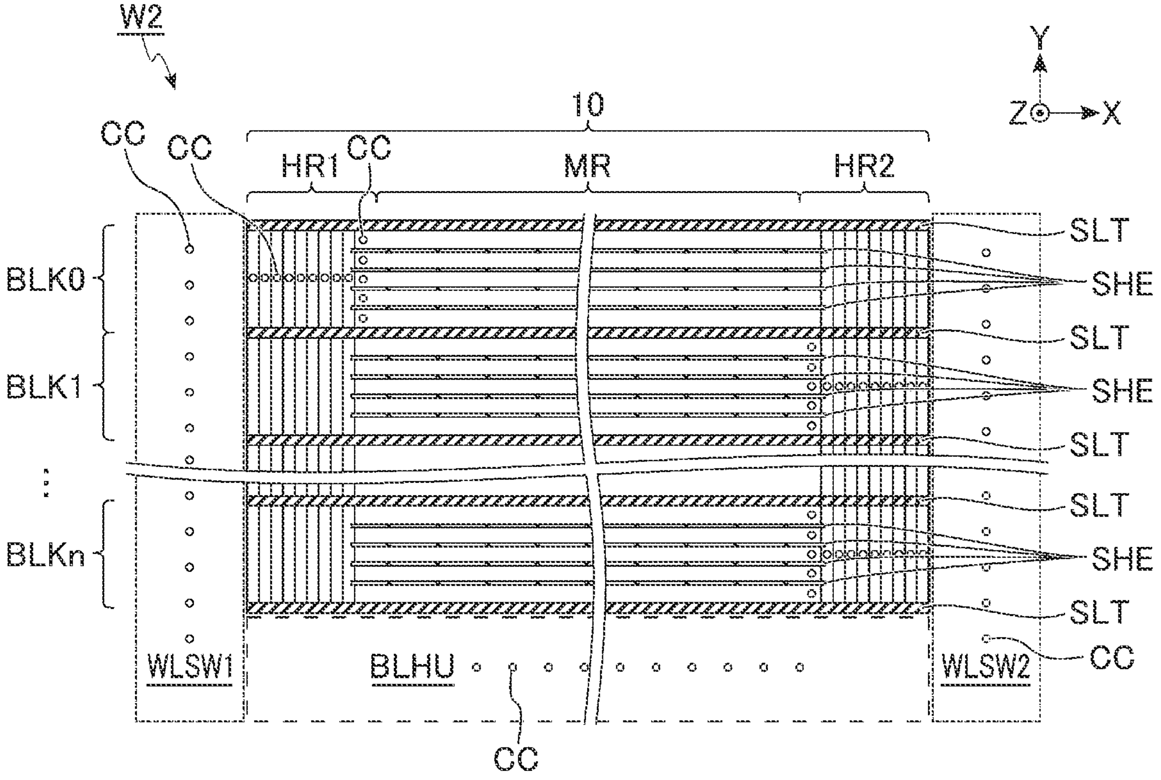
FIG. 7 is a plan view illustrating an example of a planar layout of a memory substrate in a memory device according to a first embodiment.

FIG. 7 is a plan view illustrating an example of a planar layout of the memory substrate W2 provided in the memory device 1 according to the first embodiment. FIG. 7 illustrates the memory cell array 10, the word line switch units WLSW1 and WLSW2, and the bit line connection unit BLHU. As illustrated in FIG. 7, the memory cell array 10 includes a plurality of slits SLT and a plurality of slits SHE. A plurality of contacts CC are provided on the memory substrate W2.

Each slit SLT has a portion extending along the X direction, and crosses the lead region HR1, the memory region MR, and the lead region HR2 along the X direction. The plurality of slits SLT are located in the Y direction. Each slit SLT is a structure in which an insulator is embedded. Each slit SLT separates wirings (for example, the word lines WL0 to WL7 and the select gate lines SGD and SGS) that are otherwise adjacent across the slit SLT. In some examples a conductor may be provided in a slit SLT with an insulator spacer on the side walls to insulate the conductor from the adjacent wirings as appropriate. In the memory cell array 10, the regions partitioned along the Y direction by the slits SLT each correspond to one block BLK.

Each slit SHE has a portion extending along the X direction and crosses the memory region MR along the X direction. A plurality of slits SHE are located in the Y direction. In the present example, four slits SHE are located between two slits SLT adjacent in the Y direction. Each slit SHE is a structure in which an insulator is embedded. Each slit SHE separates wirings (at least select gate lines SGD) that are otherwise adjacent across the slit SHE. In the memory cell array 10, each region partitioned along the Y direction by the slits SLT and SHE corresponds to one string unit SU.

Each end of the stacked wiring (for example, the select gate line SGS, the word lines WL0 to WL7, and the select gate line SGD) provided in the memory cell array 10 has a terrace portion in each of the lead regions HR1 and HR2. The terrace portion corresponds to a portion that does not overlap with an upper wiring layer (conductor layer) with respect to the memory substrate W2. The structure formed by the plurality of terrace portions are similar to steps, terraces, rimstones, and the like. In the present example, a step structure having steps in the X direction is formed by the end of the select gate line SGS, the ends of the word lines WL0 to WL7, and the end of the select gate line SGD.

A contact CC connected to the stacked wiring is connected to the terrace portion of at least one of the lead regions HR1 and HR2. For example, the stacked wirings of even-numbered blocks BLK (BLK0, BLK2, . . . ) are connected to the contact CC provided in lead region HR1. The stacked wirings of odd-numbered blocks BLK (BLK1, BLK3, . . . ) are connected to the contact CC provided in lead region HR2. The memory device 1 may have a structure in which the terrace portion of the lead region HR is omitted. Here, the contact CC connected to the wiring layer with the stacked wiring is provided through the upper conductor layer and separated (insulated). In some examples, the lead region HR may divide the memory region MR in the X direction.

The plurality of contacts CC provided in the word line switch unit WLSW1 are electrically connected to the contacts CC connected to the stacked wiring in the lead region HR1. The plurality of contacts CC provided in the word line switch unit WLSW2 are electrically connected to the contacts CC connected to the stacked wiring in the lead region HR2. Each contact CC of the word line switch units WLSW1 and WLSW2 electrically connected to the stacked wiring is connected to the high-voltage transistor (TR) of the row decoder RD. Each contact CC provided in the bit line connection unit BLHU electrically connects the associated bit line BL and the high-voltage transistor (T8) of the bit line connection unit BLHU.

The planar layout of the memory cell array 10 provided in the memory device 1 according to the first embodiment may be altered from that depicted. For example, the number of slits SHE arranged between two adjacent slits SLT may be designed to be any number. The number of string units SU provided in each block BLK may be changed based on the number of slits SHE located between two adjacent slits SLT. The contacts CC connected to the stacked wiring need not be alternately located in the odd-numbered and even-numbered blocks BLK. The arrangement of the word line switch units WLSW may be changed according to the arrangement of the contacts CC connected to the stacked wiring.

(4: Planar Layout of Memory Region MR)

Figure 8:
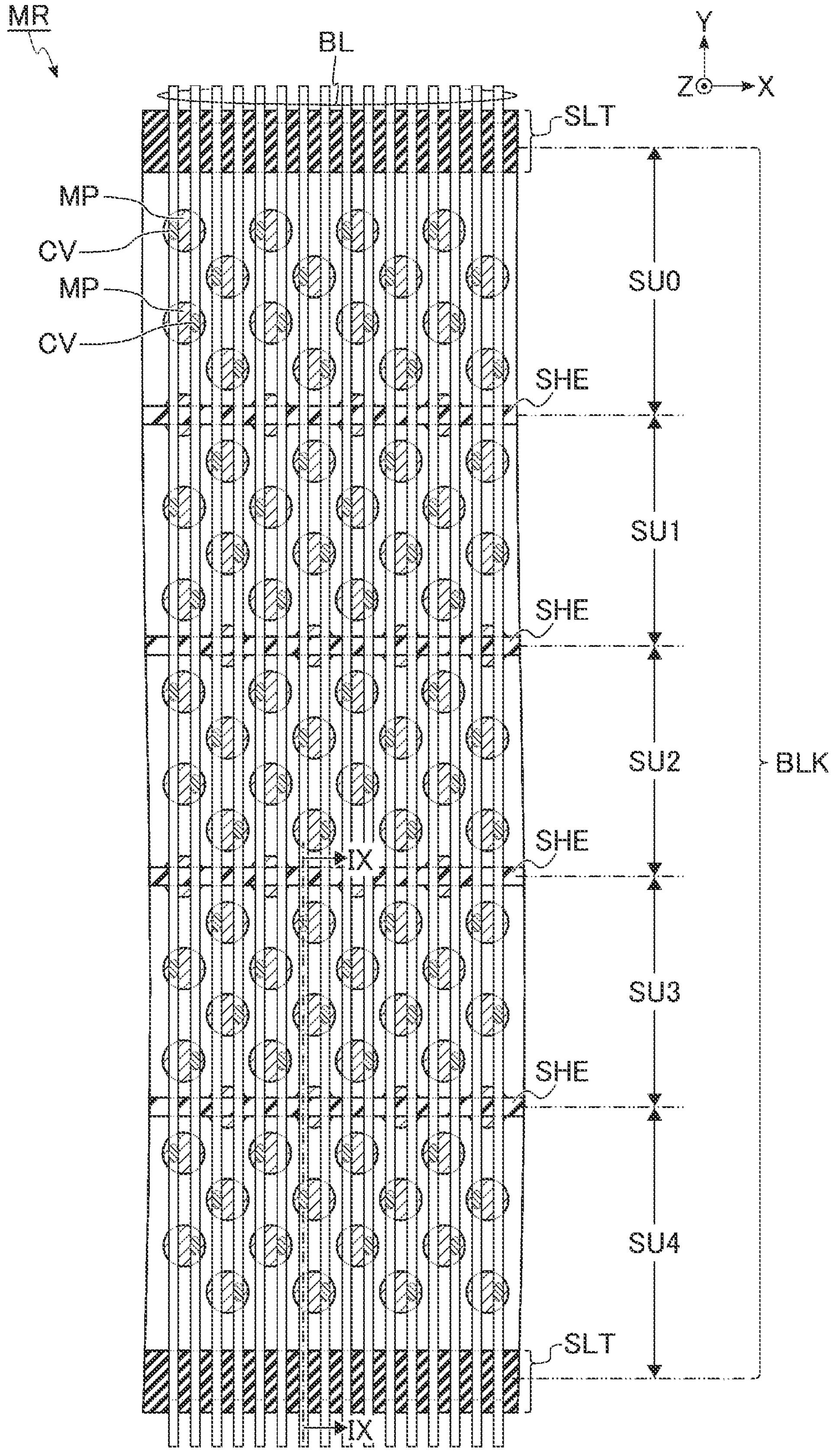
FIG. 8 is a plan view illustrating an example of a planar layout of a memory region of a memory substrate in a memory device according to a first embodiment.

FIG. 8 is a plan view illustrating an example of a planar layout of the memory region MR of the memory substrate W2 provided in the memory device 1 according to the first embodiment. FIG. 8 illustrates a region including one block BLK (string units SU0 to SU4). As illustrated in FIG. 8, the memory device 1 includes a plurality of memory pillars MP, a plurality of contacts CV, and a plurality of bit lines BL in the memory region MR.

Each memory pillar MP functions as one NAND string NS. In this example, a plurality of memory pillars MP are located in a zigzag pattern in 24 rows in a region between two adjacent slits SLT. For example, counting from the top of the drawing, one slit SHE is placed on top of the 5th row of memory pillars MP, the 10th row of memory pillars MP, the 15th row of memory pillars MP, and the 20th row of memory pillars MP, respectively.

Each bit line BL has a portion extending in the Y direction. A plurality of bit lines is aligned in the X direction. Each bit line BL is located to overlap at least one memory pillar MP for each string unit SU. The number of bit lines BL overlapping each memory pillar MP may be designed to be any number. In the present example, two bit lines BL are located to overlap one memory pillar MP. Each memory pillar MP is electrically connected to one bit line BL among a plurality of bit lines BL located in an overlapping manner via a contact CV. The contact CV between the memory pillar MP and the bit line BL, which are in contact with two different select gate lines SGD, may be omitted.

(5: Cross-Sectional Structure Including Memory Region MR)

Figure 9:
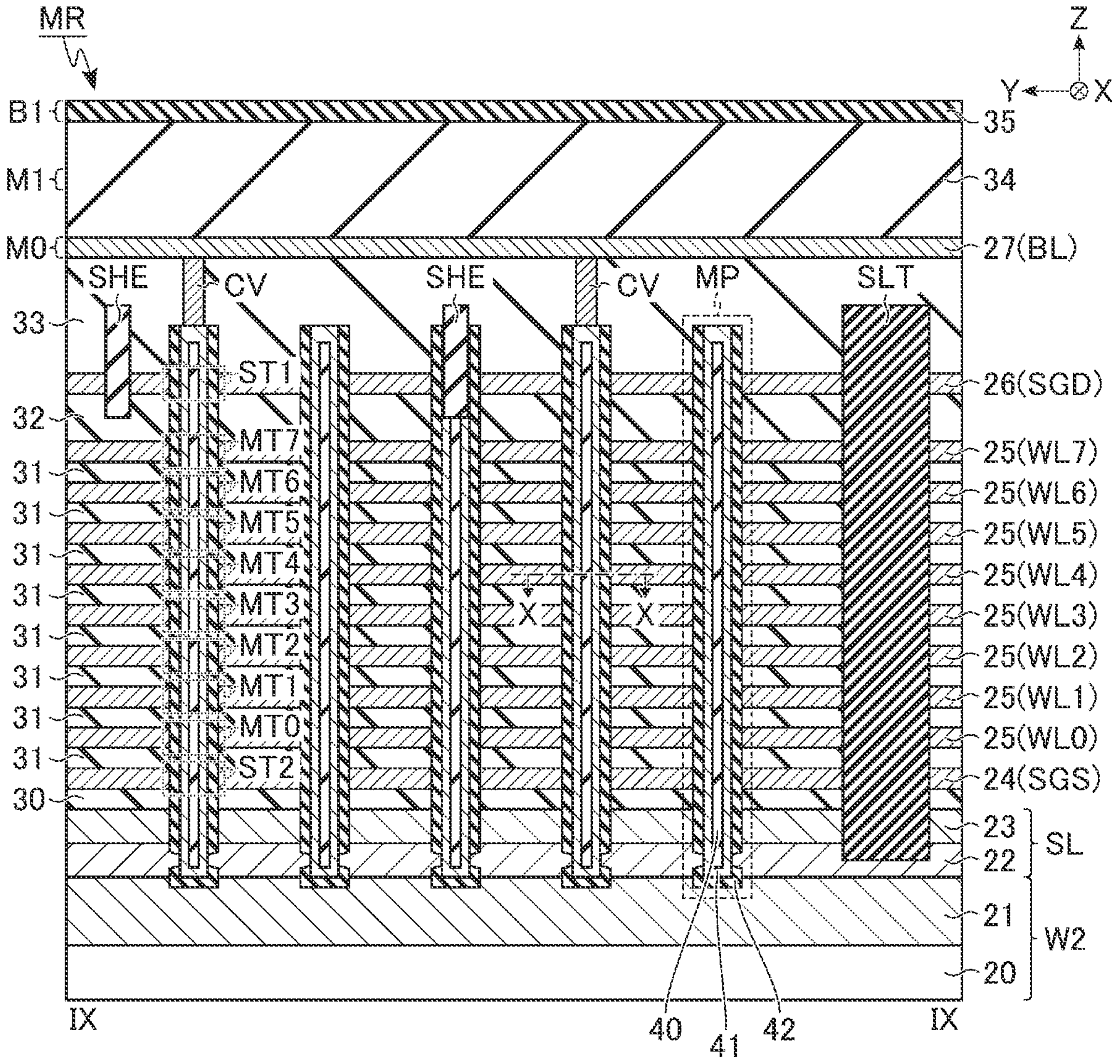
FIG. 9 is a cross-sectional view of a memory region of a memory substrate before bonding for a memory device according to a first embodiment.

FIG. 9 is a cross-sectional view taken along line IX-IX of FIG. 8, illustrating an example of a cross-sectional structure including the memory region MR of the memory substrate W2 before bonding for the memory device 1 according to the first embodiment. FIG. 9 shows an example of the structure of the memory cell array 10 formed on the memory substrate W2 before bonding and illustrates coordinate axes with the memory substrate W2 as a reference. As illustrated in FIG. 9, the memory device 1 includes, for example, a P-type substrate portion 20, an N-type impurity diffusion region 21, semiconductor layers 22 and 23, conductor layers 24 to 27, and insulator layers 30 to 35 in the memory region MR.

In the memory region MR, the N-type impurity diffusion region 21 is provided on the P-type substrate portion 20. The semiconductor layer 22 is provided on the N-type impurity diffusion region 21. The semiconductor layer 23 is provided on the semiconductor layer 22. The insulator layer 30 is provided on the semiconductor layer 23. The conductor layer 24 is provided on the insulator layer 30. The insulator layer 31 and the conductor layer 25 are alternately provided on the conductor layer 24. The insulator layer 32 is provided on the uppermost conductor layer 25. The conductor layer 26 is provided on the insulator layer 32. The insulator layer 33 is provided on the conductor layer 26 (stacked wiring). The conductor layer 27 is provided on the insulator layer 33. The insulator layer 34 is provided on the conductor layer 27. The insulator layer 35 is provided on the insulator layer 34.

The P-type substrate portion 20 and the N-type impurity diffusion region 21 correspond to the memory substrate W2. The P-type substrate portion 20 corresponds to a portion of the memory substrate W2 containing P-type impurities. The N-type impurity diffusion region 21 corresponds to a portion of the memory substrate W2 doped with N-type impurities in the vicinity of the upper surface. The N-type impurity concentration in the N-type impurity diffusion region 21 is higher than the P-type impurity concentration in the N-type impurity diffusion region 21.

Each of the semiconductor layers 22 and 23 has a plate-like portion spreading along the XY plane. A set of the semiconductor layers 22 and 23 functions as a source line SL. The semiconductor layers 22 and 23 are electrically connected to the N-type impurity diffusion region 21. Therefore, the N-type impurity diffusion region 21 electrically connected to the semiconductor layers 22 and 23 in the memory region MR may be regarded as part of the source line SL. Each of the semiconductor layers 22 and 23 is, for example, polysilicon doped with N-type impurities.

Each of the conductor layers 24, 25 and 26 has a plate-like portion spreading along the XY plane. The conductor layer 27 is formed, for example, in a line shape extending in the Y direction. The conductor layer 24 is used as the select gate line SGS. A plurality of conductor layers 25 are used as word lines WL0 to WL7 in order from the memory substrate W2 side. The conductor layer 26 is used as the select gate line SGD. Conductive layer 27 is used as a bit line BL.

The slit SLT has a plate-like portion spreading along the XZ plane. The slit SLT separates the insulator layers 30, 31, 32, the semiconductor layer 23, and the conductor layers 24, 25, 26. A bottom portion of the slit SLT is in contact with the semiconductor layer 22.

Each memory pillar MP extends along the Z direction and penetrates the insulator layers 30, 31, 32, the semiconductor layers 22 and 23, and the conductor layers 24, 25, 26. The bottom portion of the memory pillar MP is in contact with the N-type impurity diffusion region 21. A portion where the memory pillar MP and the conductor layer 24 intersect functions as the select transistor ST2. A portion where the memory pillar MP and the conductor layer 25 intersect functions as the memory cell transistor MT. A portion where the memory pillar MP and the conductor layer 26 intersect functions as the select transistor ST1.

Each memory pillar MP includes, for example, a core member 40, a semiconductor layer 41, and a stacked film 42. The core member 40 is an insulator extending along the Z direction. The semiconductor layer 41 covers the core member 40. The semiconductor layer 41 is in contact with the semiconductor layer 22 via the side surface of the memory pillar MP. The stacked film 42 covers the side and bottom surfaces of the semiconductor layer 41 except for the contact portion between the semiconductor layer 41 and the semiconductor layer 22.

A contact CV is provided on the semiconductor layer 41 of the memory pillar MP. The conductor layer 27 (bit line BL) is in contact with the contact CV. The presently illustrated region depicts two contacts CV corresponding to two memory pillars MP out of five memory pillars MP. For the memory pillars MP that do not overlap the slit SHE in the region which are not shown as connected to a contact CV, a contact CV is connected but not in a region that is illustrated.

The slit SHE has, for example, a portion provided along the XZ plane, and separates at least the conductor layer 26. The upper end of the slit SHE is provided at a height between the upper end of the memory pillar MP and the conductor layer 27. The lower end of the slit SHE is provided at the height of the insulator layer 32. The upper end of the slit SHE and the upper end of the slit SLT may or may not be aligned. The upper end of the slit SHE and the upper end of the memory pillar MP may or may not be aligned.

The wiring layer provided with the conductor layer 27 is hereinafter referred to as "M0". The wiring layer provided with the insulator layer 35 is referred to as "B1". The wiring layer between the wiring layers M0 and B1 is referred to as "M1". The layer having a height in which the semiconductor layer 22 is formed is also referred to as a "source line connection layer". The wiring layer M1 is disposed in the insulator layer 34. A plurality of bonding pads BP are provided on the wiring layer B1. The surfaces of the plurality of bonding pads BP are exposed on the memory substrate W2 before bonding.

(6: Cross-Sectional Structure of Memory Pillar MP)

Figure 10:
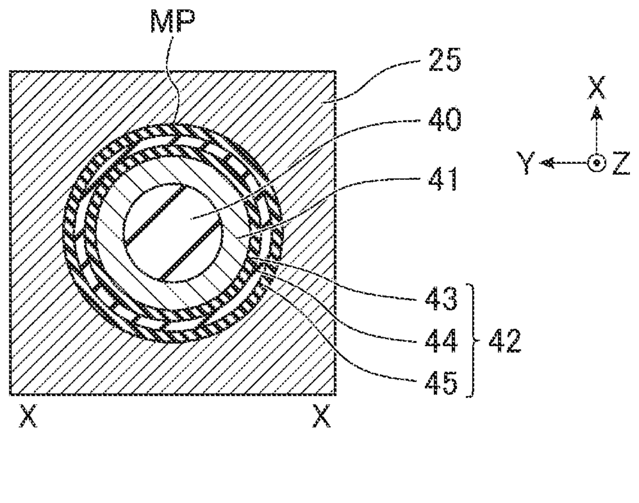
FIG. 10 is a cross-sectional view of a memory pillar of a memory device according to a first embodiment.

FIG. 10 is a cross-sectional view taken along line X-X of FIG. 9 illustrating an example of a cross-sectional structure including a memory pillar MP of the memory device 1 according to the first embodiment. FIG. 10 illustrates a cross-section including a memory pillar MP and the conductor layer 25 and parallel to the surface of the memory substrate W2. As illustrated in FIG. 10, the stacked film 42 includes a tunnel insulating film 43, an insulating film 44, and a block insulating film 45.

The core member 40 is provided at the center portion of the memory pillar MP. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 45 surrounds the side surface of the insulating film 44. The conductor layer 25 surrounds the side surface of the block insulating film 45. The semiconductor layer 41 functions as channels (current paths) of the memory cell transistors MT0 to MT7 and the select transistors ST1 and ST2. Each of the tunnel insulating film 43 and the block insulating film 45 comprises silicon oxide, for example. The insulating film 44 is used as a charge storage layer of the memory cell transistor MT, and comprises silicon nitride, for example. Thereby, each memory pillar MP functions as one NAND string NS.

(7: Overview of Cross-Sectional Structure of Memory Device 1)

Figure 11:
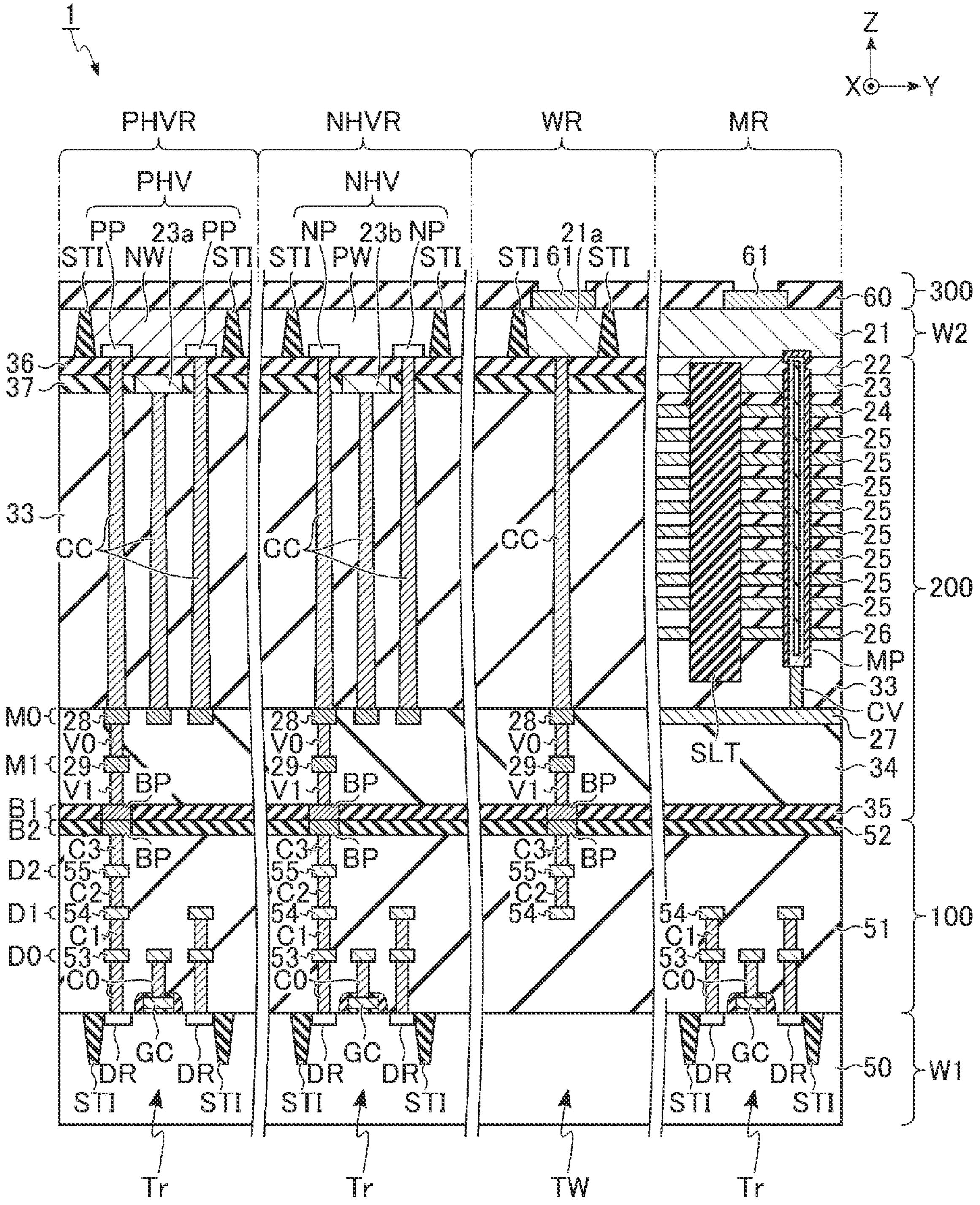
FIG. 11 is a cross-sectional view of a memory device according to a first embodiment.

FIG. 11 is a cross-sectional view illustrating an overview of the cross-sectional structure of the memory device 1 according to the first embodiment. FIG. 11 shows a cross section of the memory device 1 including the memory region MR and regions WR, NHVR, and PHVR, and displays the coordinate axes with respect to the CMOS substrate W1. FIG. 11 illustrates the structure of the circuit layer 200 in a memory region MR is inverted upside down with respect to the orientation depicted in FIG. 9 to correspond to the state after the CMOS substrate W1 and the memory substrate W2 are bonded to one another. As illustrated in FIG. 11, a plurality of transistors Tr are provided on the CMOS substrate W1.

The CMOS substrate W1 has an impurity diffusion region (a well region) in the substrate portion 50 positioned according to the circuit design of the memory device 1. A shallow trench isolation (STI) feature is formed in the upper surface of the CMOS substrate W1. An active region used for forming the transistor Tr is defined by the region surrounded by the STI in plan view. In the active region of the CMOS substrate W1, an impurity diffusion region DR is formed corresponding to the source region and the drain region of the transistor Tr. For example, if the transistor Tr is an N-type transistor, a P-type well region is provided as the active region, and an N-type impurity diffusion region is provided as the impurity diffusion region DR. If the transistor Tr is a P-type transistor, an N-type well region is provided as the active region, and a P-type impurity diffusion region is provided as the impurity diffusion region DR.

An insulator layer 51 is provided on the substrate portion 50 of the CMOS substrate W1. An insulator layer 52 is provided on the insulator layer 51. A wiring layer of the circuit layer 100 is formed in the insulator layers 51 and 52. The circuit layer 100 includes a plurality of gate electrodes GC, a plurality of contacts C0, C1, C2, and C3, a plurality of conductor layers 53, 54 and 55, and a plurality of bonding pads BP. Each gate electrode GC is the gate portion of an associated transistor Tr. Each gate electrode GC is provided between adjacent impurity diffusion regions DR and above the well region via a gate insulating film. Each contact C0 is provided on the associated impurity diffusion region DR or gate electrode GC. The heights of the upper surfaces of the plurality of contacts C0 are uniform. Each conductor layer 53 is provided on the associated contact C0. Each contact C1 is provided on the associated conductor layer 53. Each conductor layer 54 is provided on the associated contact C1. Each contact C2 is provided on the associated conductor layer 54. Each conductor layer 55 is provided on the associated contact C2. Each contact C3 is provided on the associated conductor layer 55. The bonding pads BP of the circuit layer 100 are provided on the associated contacts C3. The wiring layers provided with the conductor layers 53, 54, and 55 are hereinafter referred to as "D0", "D1" and "D2", respectively. The wiring layers D0 to D2 are disposed in the insulator layer 51. A wiring layer provided with the insulator layer 52 and the bonding pads BP of the circuit layer 100 is referred to as "B2".

In the memory substrate W2 after bonding, the P-type substrate portion 20 is removed. Therefore, in the memory substrate W2 after bonding, the N-type impurity diffusion region 21 is provided from the front surface to the back surface of the memory substrate W2. The memory substrate W2 has an impurity diffusion region according to the circuit design of the memory device 1. For example, an STI is formed on the memory substrate W2. The STI formed on the memory substrate W2 divides the memory substrate W2 into different regions. In a region surrounded by the STI in plan view, an active region used for forming the N-type high-voltage transistor NHV and an active region used for forming the P-type high-voltage transistor PHV are defined. In the present example, the memory substrate W2 includes a P-type well region PW in the region NHVR as an active region of the N-type high-voltage transistor NHV, and an N-type well region NW in the region PHVR as an active region of the P-type high-voltage transistor PHV. That is, the P-type well region PW in the region NHVR and the N-type well region NW in the region PHVR are provided at height position corresponding to the N-type impurity diffusion region 21 in the memory region MR.

In the P-type well region PW in the region NHVR, N-type impurity diffusion regions NP are provided respectively corresponding to the source region and the drain region of the N-type high-voltage transistor NHV. In the N-type well region NW in the region PHVR, P-type impurity diffusion regions PP are provided respectively corresponding to the source region and the drain region of the P-type high-voltage transistor PHV. The memory substrate W2 has an N-type impurity diffusion region 21*a* surrounded by STI in plan view in the region WR. The N-type impurity diffusion region 21*a* is insulated from the active regions of the N-type high-voltage transistor NHV and the P-type high-voltage transistor PHV and the N-type impurity diffusion region 21 in the memory region MR by STIs. The N-type impurity diffusion region 21*a* has, for example, the same composition as the N-type impurity diffusion region 21 in the memory region MR.

The circuit layer 200 includes insulator layers 36 and 37, a plurality of conductor layers 28 and 29, a plurality of contacts CC, V0 and V1, and a plurality of bonding pads BP. The insulator layer 36 is provided under the memory substrate W2 in each of the regions PHVR, NHVR, and WR. The insulator layer 37 is provided under the insulator layer 36 in each of the regions PHVR, NHVR, and WR. The thickness of the insulator layer 37 is approximately equal to the thickness of the semiconductor layer 23. The semiconductor layer 23 has a portion (semiconductor layer 23*a*) functioning as the gate electrode of the P-type high-voltage transistor PHV in the region PHVR, and a portion (semiconductor layer 23*b*) functioning as the gate electrode of the N-type high-voltage transistor NHV in the region NHVR. The semiconductor layers 23*a* and 23*b* and the semiconductor layer 23 each comprise, for example, polysilicon with approximately the same thickness. The semiconductor layers 23*a* and 23*b* in the regions PHVR and NHVR are provided at height position corresponding to the semiconductor layer 23 in the memory region MR. A portion of the insulator layer 36 between the semiconductor layer 23*a* and the N-type well region NW functions as a gate insulating film of the P-type high-voltage transistor PHV. A portion of the insulator layer 36 between the semiconductor layer 23*b* and the P-type well region PW functions as a gate insulating film of the N-type high-voltage transistor NHV.

Each contact CC in the region PHVR is provided under the associated P-type impurity diffusion region PP or semiconductor layer 23*a*. Each contact CC in the region NHVR is provided under the associated N-type impurity diffusion region NP or semiconductor layer 23*b*. The plurality of contacts CC are provided extending along the Z direction to penetrate the insulator layers 36 and 37 and the insulator layer 33 under the insulator layer 37, and the heights of the lower surface of the plurality of contacts CC are aligned. Each conductor layer 28 is provided in the wiring layer M0 and provided under the associated contact CC. Each contact V0 is provided under the associated conductor layer 28. Each conductor layer 29 is provided in the wiring layer M1 and provided under the associated contact V0. Each contact V1 is provided under the associated conductor layer 29. The bonding pads BP of the circuit layer 200 are provided in the wiring layer B1 and provided under the associated contacts V1.

The wiring layer 300 includes an insulator layer 60 and a plurality of conductor layers 61. The insulator layer 60 and the plurality of conductor layers 61 are provided on the memory substrate W2. The conductor layer 61 provided in the memory region MR is in contact with and electrically connected to the N-type impurity diffusion region 21. The conductor layer 61 provided in the region WR is in contact with and electrically connected to the N-type impurity diffusion region 21*a*. The insulator layer 60 covers, for example, a portion of the upper surface of the memory substrate W2 where the conductor layer 61 is not provided and a portion of the conductor layer 61. Aluminum (Al), for example, is used as the conductor layer 61. Although not specifically illustrated, other wirings and contacts can be connected on the conductor layer 61, and a plurality of pads PD used for connecting the memory device 1 and the memory controller 2 may be provided above the insulator layer 60.

In the memory region MR, a transistor Tr may be disposed below the memory pillar MP (memory cell array 10). The region WR includes a through wiring portion TW. The through wiring portion TW is a conductive portion that electrically connects the wiring provided on the upper surface (wiring layer 300) of the memory substrate W2 and the wiring of the circuit layer 100. For example, the through wiring portion TW is used as part of a power supply line for supplying power supply voltage to the CMOS substrate W1. In the present example, the conductor layer 54 of the circuit layer 100 and the conductor layer 61 of the wiring layer 300 are electrically connected to each other through the contacts CC, V0, V1, C2, and C3 and the conductor layers 28, 29, 54, and 55, the bonding pads BP of the circuit layers 100 and 200, and the N-type impurity diffusion region 21*a*. The through wiring portion TW may include a plurality of contacts and conductor layers connected in parallel.

The N-type high-voltage transistor NHV in the region NHVR and the P-type high-voltage transistor PHV in the region PHVR may be connected to elements and wirings formed on the CMOS substrate W1, or may be connected to elements or wirings formed on the memory substrate W2 according to the design of the memory device 1. In the present example, in the region PHVR, the drain end or source end of the P-type high-voltage transistor PHV is connected to the drain end or the source end of the transistor Tr formed on the CMOS substrate W1 via the contacts CC, V0, V1, C0, C1, C2, and C3 and the conductor layers 28, 29, 53, 54, and 55, and the respective bonding pads BP of the circuit layers 100 and 200. In the present example, in the region NHVR, the drain end or source end of the N-type high-voltage transistor NHV is connected to the drain end or the source end of the transistor Tr formed on the CMOS substrate W1 via the contacts CC, V0, V1, C0, C1, C2, and C3 and the conductor layers 28, 29, 53, 54, and 55, and the bonding pads BP of the circuit layers 100 and 200, respectively.

In the memory device 1 according to the first embodiment, the P-type well region PW of the N-type high-voltage transistor NHV and the N-type well region NW of the P-type high-voltage transistor PHV is surrounded by insulator (combination of the STIs, the insulator layer 36, and the insulator layer 60). In other words, the N-type high-voltage transistor NHV and the P-type high-voltage transistor PHV are insulated from each other and separated into islands by the STIs and the insulator layer 60. That is, in the first embodiment, the N-type high-voltage transistor NHV and the P-type high-voltage transistor PHV are both provided with a silicon on insulator (SOI) structure. The structures of the N-type high-voltage transistor NHV and the P-type high-voltage transistor PHV are different from the structure of the transistor Tr having a non-SOI structure that is provided in the CMOS circuit. In the high-voltage transistor thus having the silicon on insulator (SOI) structure, the N-type impurity diffusion regions NP of the N-type high-voltage transistor NHV and the P-type impurity diffusion regions PP of the P-type high-voltage transistor PHV may be provided from the front surface to the back surface of the memory substrate W2, similarly to the P-type well region PW and the N-type well region NW.

(8: Cross-Sectional Structure Including Word Line Switch Unit WLSW)

Figure 12:
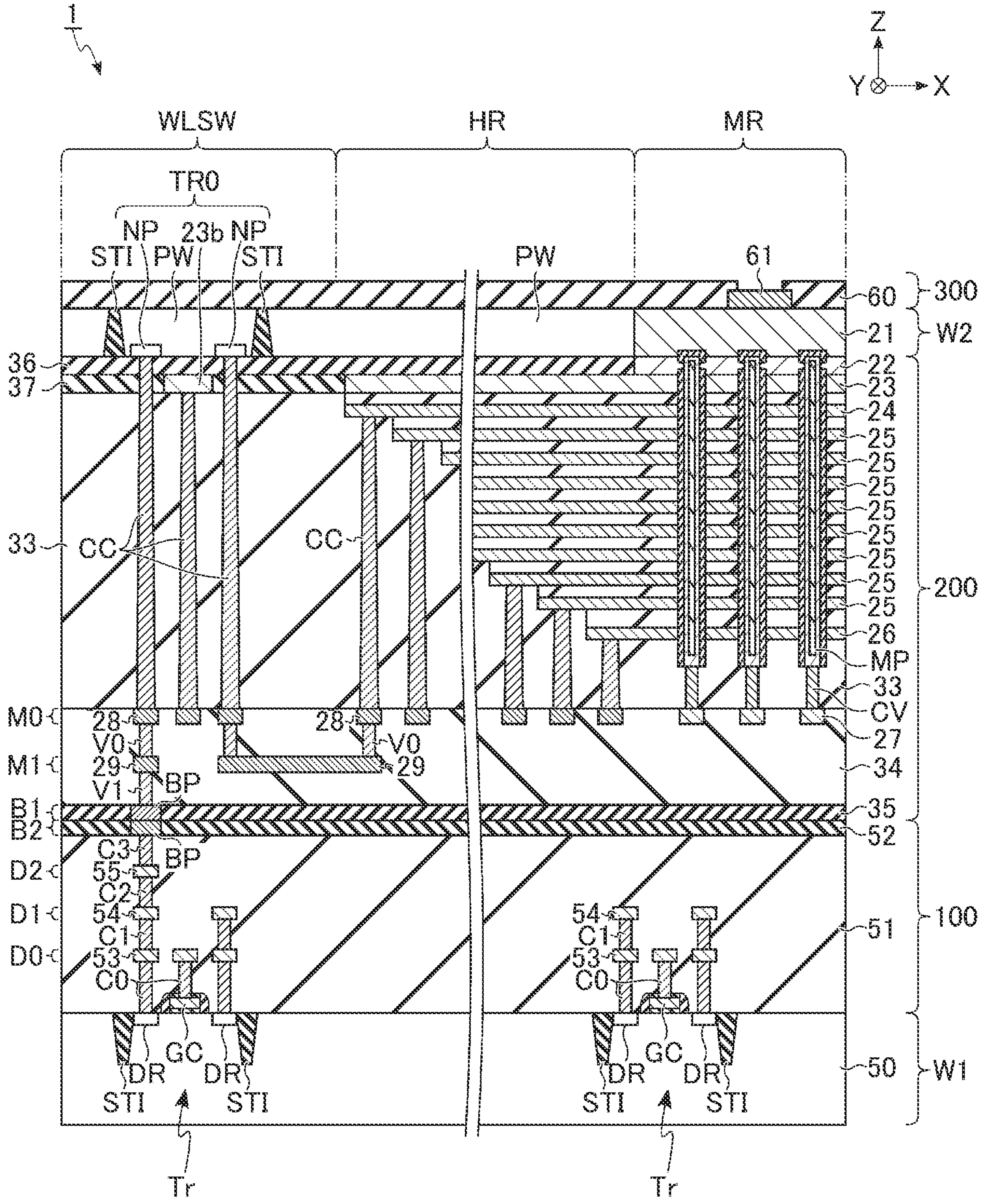
FIG. 12 is a cross-sectional view including a word line switch unit in a memory device according to a first embodiment.

FIG. 12 is a cross-sectional view illustrating an example of a cross-sectional structure including the word line switch unit WLSW in the memory device 1 according to the first embodiment. FIG. 12 illustrates the connection between the stacked wiring of the memory cell array 10 and the row decoder module 16 provided on the CMOS substrate W1. In the following, the connection between the conductor layer 24 (select gate line SGS) of the stacked wiring and the row decoder module 16 will be described as an example.

As illustrated in FIG. 12, the conductor layer 24 is connected to the N-type impurity diffusion region NP of one of the transistors TR0 (N-type high-voltage transistor NHV) provided on the memory substrate W2 via the contacts CC and V0 and the conductor layers 28 and 29. The other N-type impurity diffusion region NP of the transistor TR0 is connected to the impurity diffusion region DR of the transistor Tr provided on the CMOS substrate W1 via the contacts CC, V0, V1, and C0 to C3, the conductor layers 28, 29, and 53 to 55, and the respective bonding pads BP of circuit layers 100 and 200. Although not specifically illustrated in FIG. 12, the gate electrode (semiconductor layer 23*b*) of the transistor TR0 may be connected to the wiring provided in the CMOS substrate W1 through the bonding pads BP of the circuit layers 100 and 200, similarly to the other N-type impurity diffusion region NP of the transistor TR0. The conductor layers 25 and 26 of the stacked wiring other than the conductor layer 24 may similarly be connected to the circuit provided on the CMOS substrate W1 via the high-voltage transistor provided on the memory substrate W2.

(9: Cross-Sectional Structure Including Bit Line Connection Unit BLHU)

Figure 13:
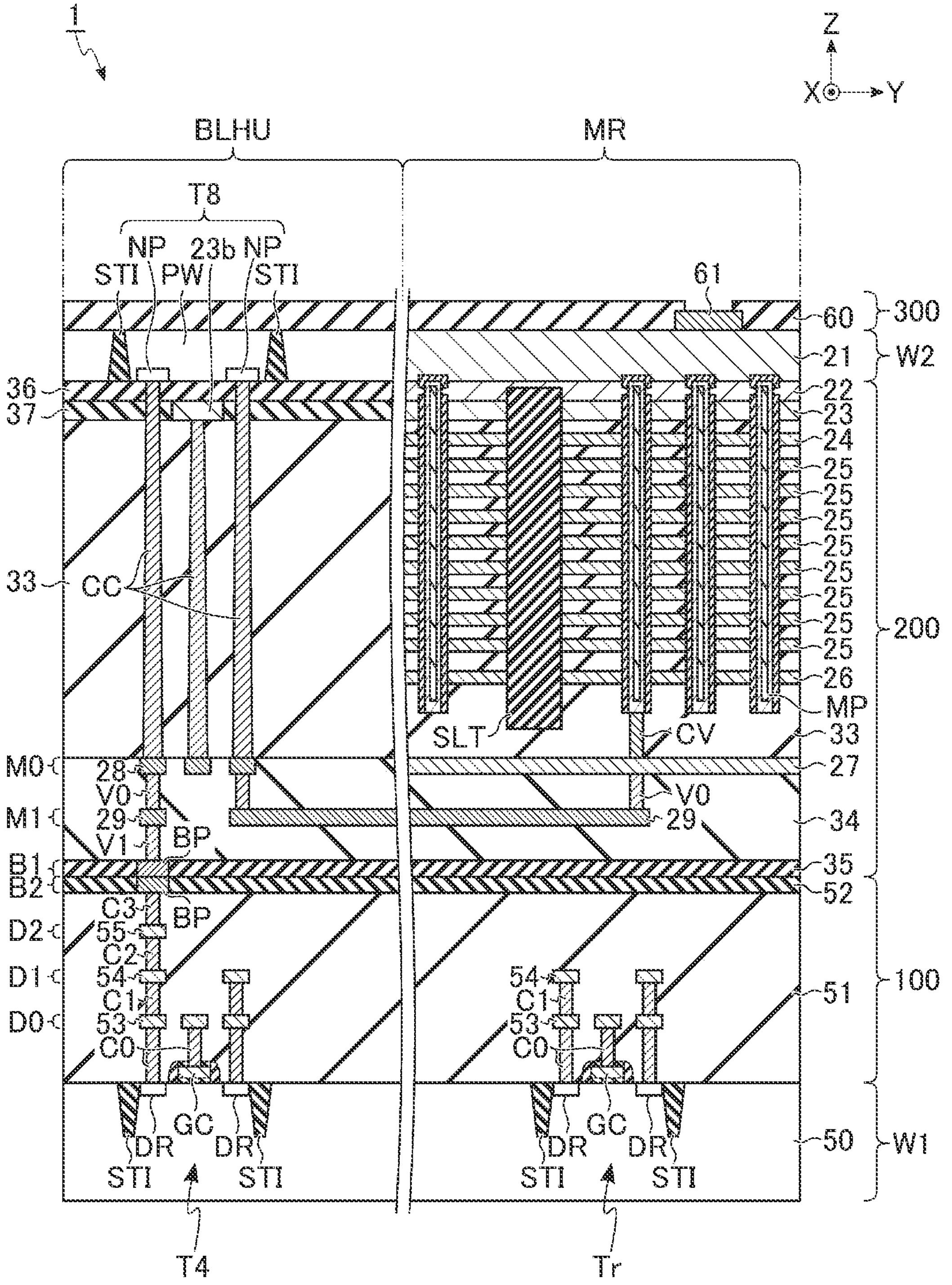
FIG. 13 is a cross-sectional view including a bit line connection unit in a memory device according to a first embodiment.

FIG. 13 is a cross-sectional view illustrating an example of a cross-sectional structure including the bit line connection unit BLHU in the memory device 1 according to the first embodiment. FIG. 13 illustrates the connection between the conductor layer 27 (bit line BL) connected to the memory cell array 10 and the sense amplifier module 17 provided on the CMOS substrate W1.

As illustrated in FIG. 13, the conductor layer 27 is connected to the conductor layer 29 provided in the wiring layer M1 via the contact V0. The conductor layer 29 connected to the conductor layer 27 is connected to one N-type impurity diffusion region NP of the transistor T8 (N-type high-voltage transistor NHV) provided on the memory substrate W2 via the contacts CC and V0 and the conductor layer 28 at the bit line connection unit BLHU. The other N-type impurity diffusion region NP of the transistor T8 is connected to the impurity diffusion region DR of the transistor T4 provided on the CMOS substrate W1 via the contacts CC, V0, V1, and C0 to C3, the conductor layers 28, 29, and 53 to 55, and the respective bonding pads BP of circuit layers 100 and 200. That is, the bit line BL is connected to the circuit provided on the CMOS substrate W1 via the high-voltage transistor provided on the memory substrate W2. Although not specifically illustrated, the gate electrode (semiconductor layer 23*b*) of the high-voltage transistor provided in the bit line connection unit BLHU may be connected to the wiring provided in the CMOS substrate W1 through the bonding pads BP of the circuit layers 100 and 200, similarly to the other N-type impurity diffusion region NP of the transistor T8.

<1-2> Method for Manufacturing Memory Device 1

A method for manufacturing the memory device 1 will be described below.

<1-2-1> Manufacturing Process of Memory Substrate W2 Before Bonding

FIG. 14 is a flowchart illustrating an example of a manufacturing process of the memory substrate W2 before bonding for the memory device 1 according to the first embodiment. FIGS. 15 to 26 illustrate an example of the cross-sectional structure during the manufacturing of the memory substrate W2 before bonding for the memory device 1 according to the first embodiment and display coordinate axes with the memory substrate W2 as a reference. In each cross-sectional structure of the memory device 1 during manufacturing, the memory region MR and regions WR, NHVR, and PHVR corresponding to the regions illustrated in FIG. 11 are depicted. Hereinafter, as a method of manufacturing the memory device 1 according to the first embodiment, the manufacturing process of the memory substrate W2 before bonding will be described with reference to FIG. 14 as appropriate.

When the P-type silicon substrate to be used as the memory substrate W2 is prepared, the series of processes illustrated in FIG. 14, that is, the pre-processing of the memory substrate W2 begins (start).

Figure 15:
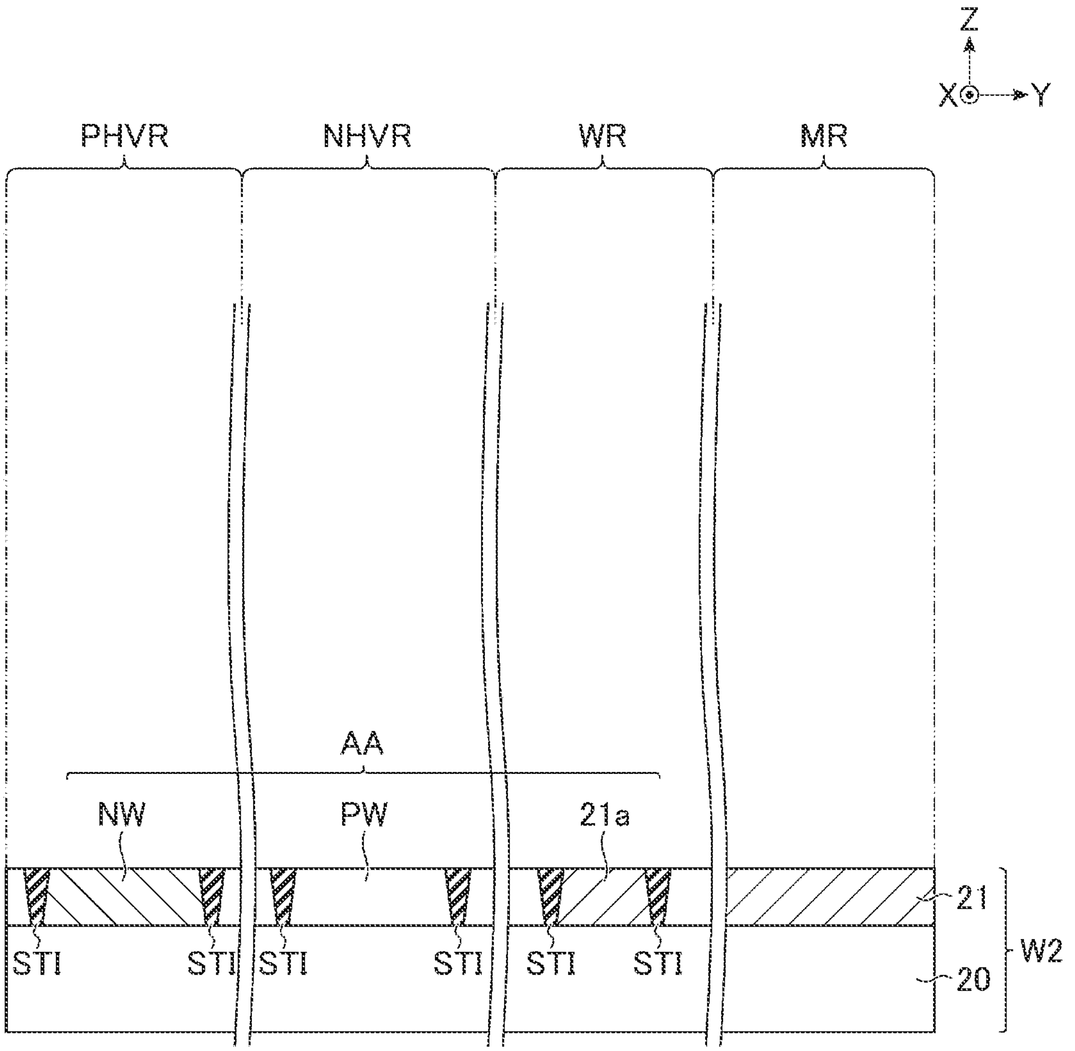
FIGS. 15 to 26 are cross-sectional views illustrating aspects of a manufacturing method of a memory device according to a first embodiment.

As illustrated in FIG. 15, the active area AA is formed on the memory substrate W2 (S11). Specifically, the N-type impurity diffusion regions 21 and 21*a* and the N-type well region NW are formed by a photolithography process for forming a mask with an opening corresponding to the active area AA and the like followed by an N-type impurity ion implantation process. If the N-type impurity concentration in the N-type impurity diffusion regions 21 and 21*a* and the N-type impurity concentration in the N-type well region NW are different, then separate mask formations and the ion implantation processes can be executed for the N-type impurity diffusion regions 21 and 21*a*, and the N-type well region NW, respectively. If the P-type impurity concentration of the memory substrate W2 and the P-type impurity concentration of the P-type well region PW are designed to be equivalent, the ion implantation process of the P-type impurity into the P-type well region PW may be omitted. After this, a slit is formed in a position corresponding to the STI by photolithography and etching processes, and an insulator is embedded in the slit to form the STI.

Figure 16:
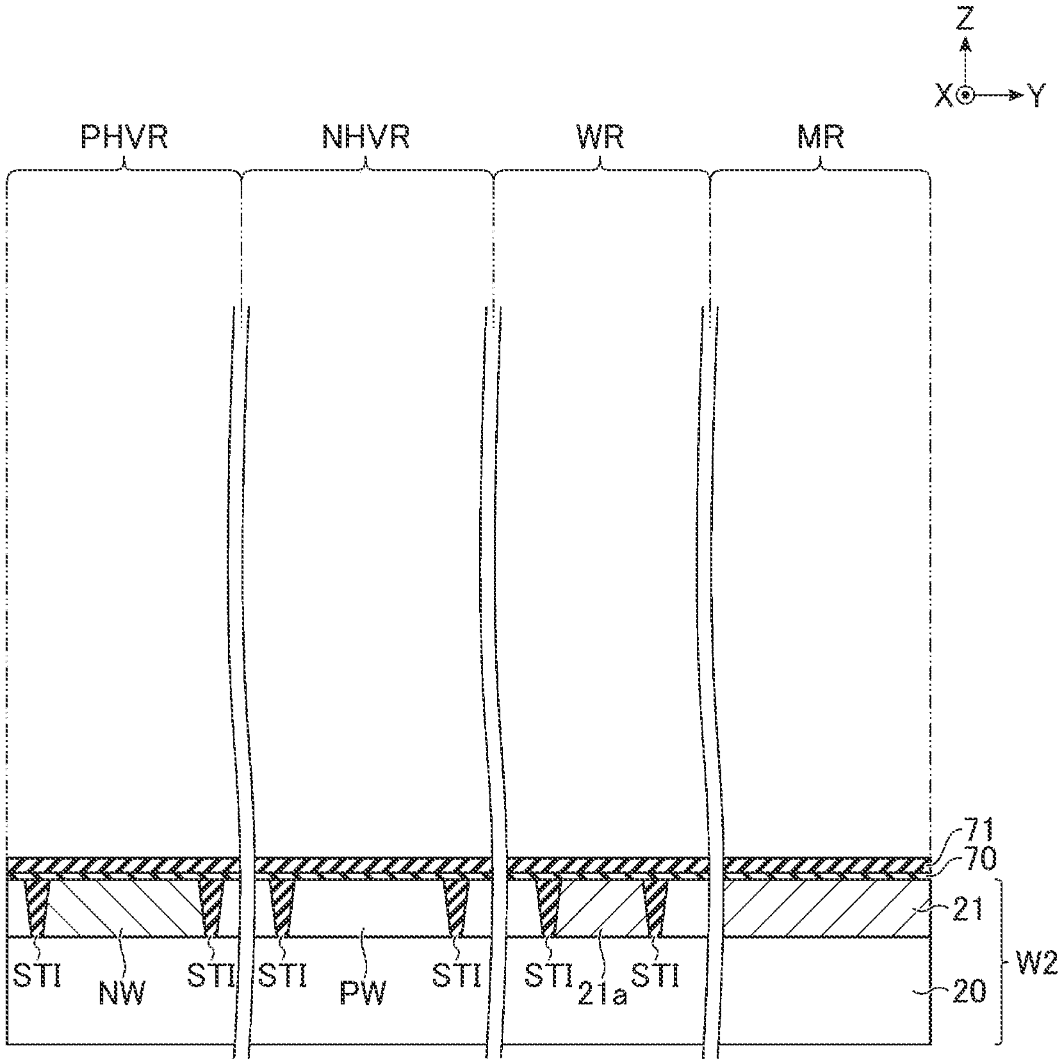
Figure 17:
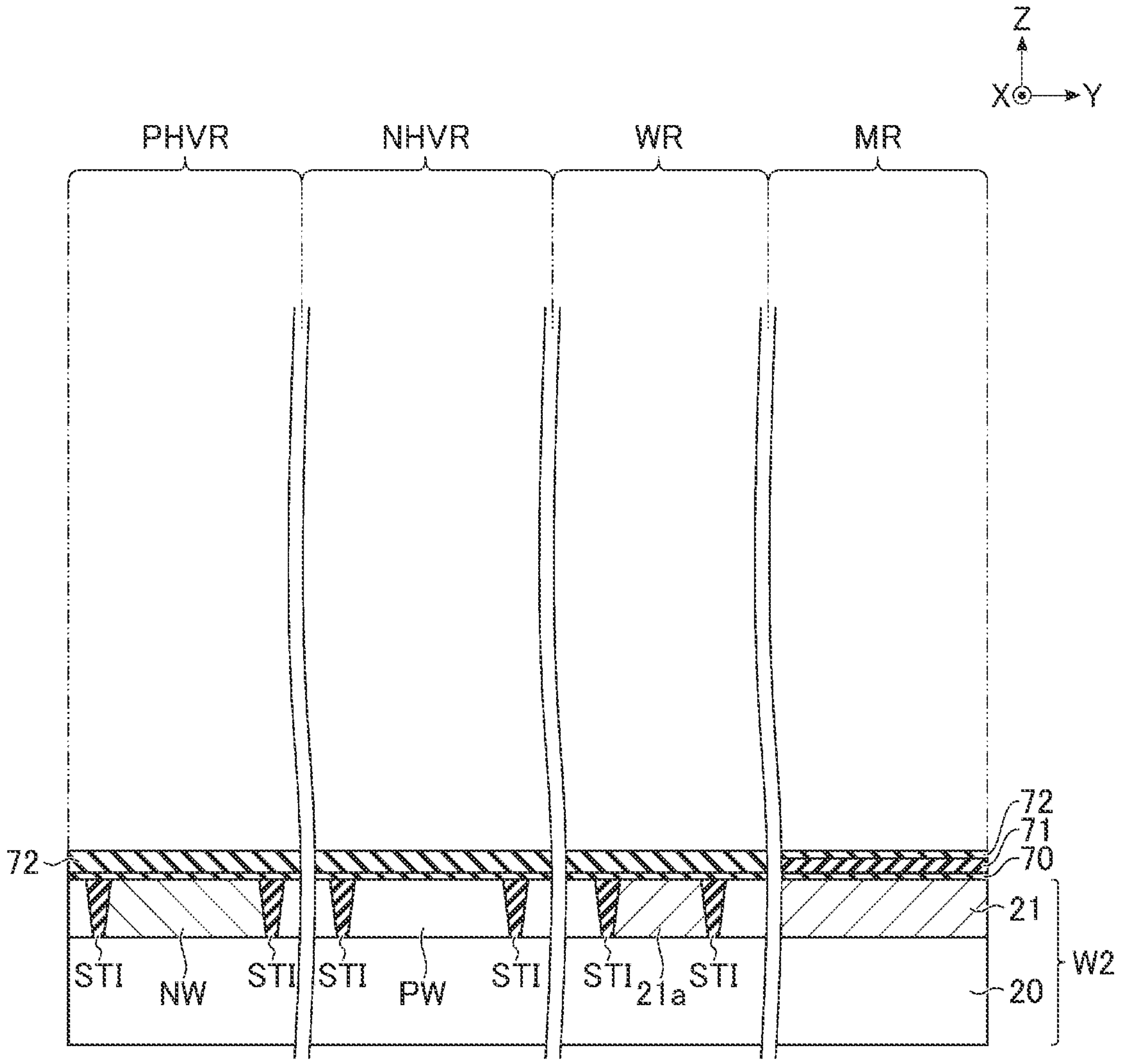

Next, a source line connection layer is formed (S12). Specifically, first, as illustrated in FIG. 16, an insulator layer 70 and a sacrificial member 71 are formed in this order on the memory substrate W2. The insulator layer 70 is, for example, silicon oxide (SiO). The sacrificial member 71 is, for example, silicon nitride (SiN). Then, the sacrificial members 71 formed in the regions WR, NHVR, and PHVR are removed by photolithography and etching processes. An insulator layer 72 is then formed as illustrated in FIG. 17. The insulator layer 72 is, for example, silicon oxide. In the present example, the thickness of the set of the insulator layers 70 and 72 formed in the regions WR, NHVR, and PHVR and the thickness of the set including the insulator layers 70 and 72 and the sacrificial member 71 formed in the memory region MR may be the same or may be different. To align the upper surfaces of the insulator layer 72 in the memory region MR and the regions WR, NHVR, and PHVR, for example, a planarization process such as chemical mechanical polishing (CMP) is performed after the insulator layer 72 is formed. The set of the insulator layers 70 and 72 formed in regions WR, NHVR, and PHVR corresponds to the insulator layer 36 illustrated in FIG. 11.

Figure 18:
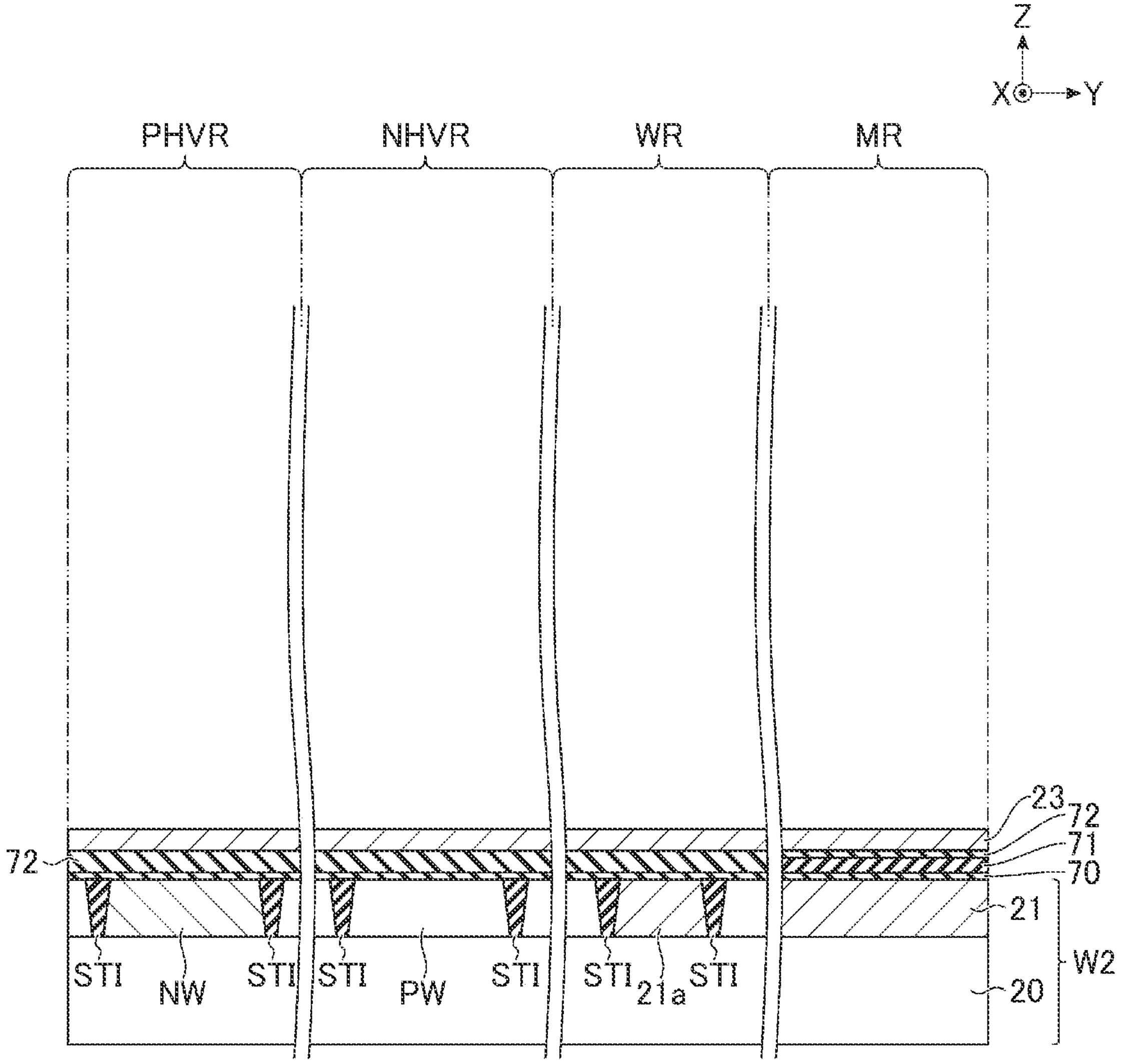

Next, as illustrated in FIG. 18, the semiconductor layer 23 is formed (S13). The semiconductor layer 23 is provided on the insulator layer 72 in each of the memory region MR and the regions WR, NHVR, and PHVR.

Figure 19:
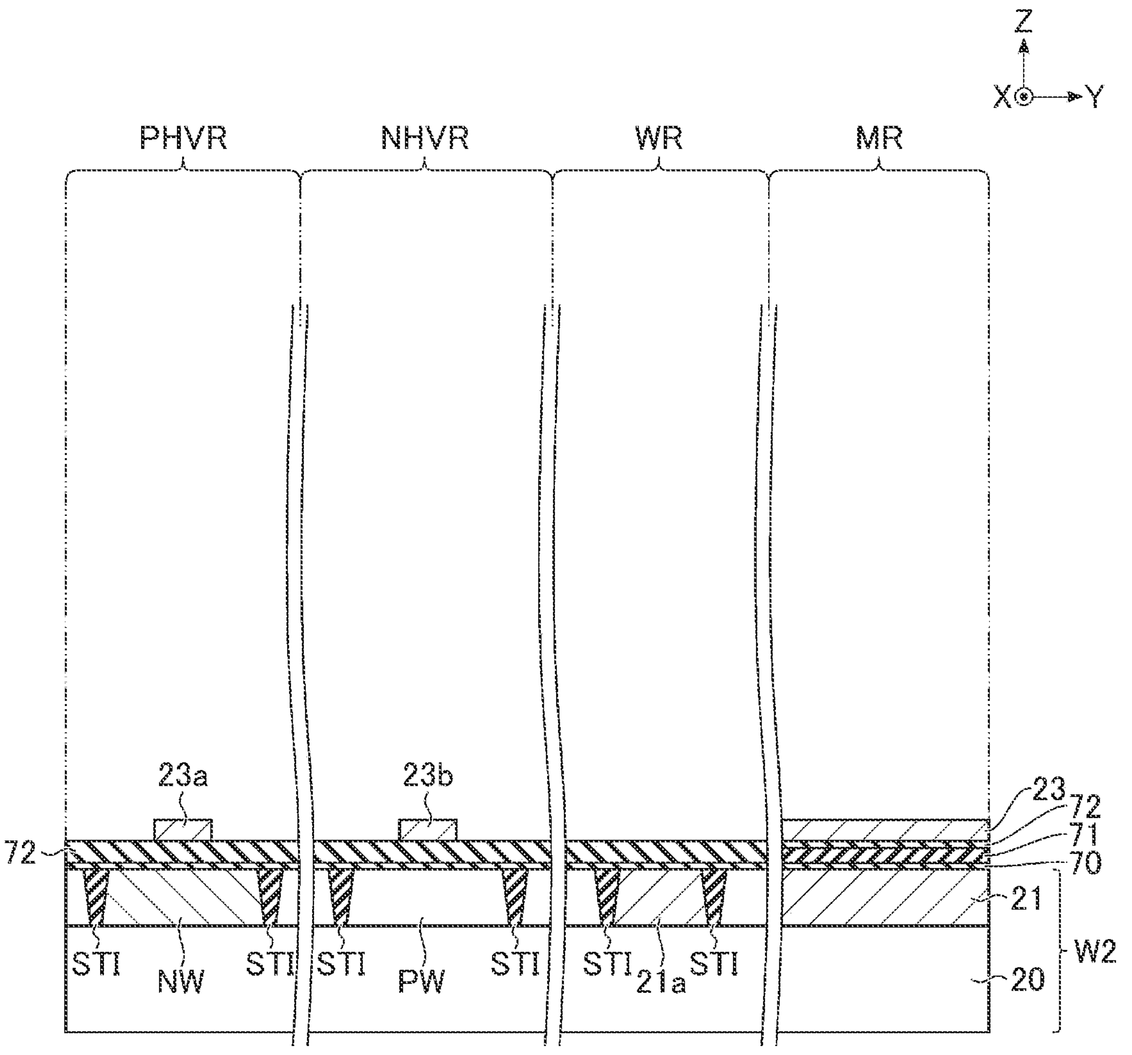

Next, as illustrated in FIG. 19, the semiconductor layer 23 is processed to form the semiconductor layers 23*a* and 23*b* corresponding to the gate electrodes of the high-voltage transistor (S14). Specifically, for example, a mask is formed by a photolithography process to cover the memory region MR and the portions of the regions NHVR and PHVR that are used as the gate electrodes of the high-voltage transistors. The semiconductor layer 23 in the openings of the mask is removed by an etching process through the mask. As a result, a structure is formed in which the semiconductor layer 23 remains in the memory region MR, the semiconductor layer 23*a* (the gate electrode of the P-type high-voltage transistor PHV) remains in the region PHVR, and the semiconductor layer 23*b* (the gate electrode of the N-type high-voltage transistor NHV) remains in the region NHVR.

Figure 20:
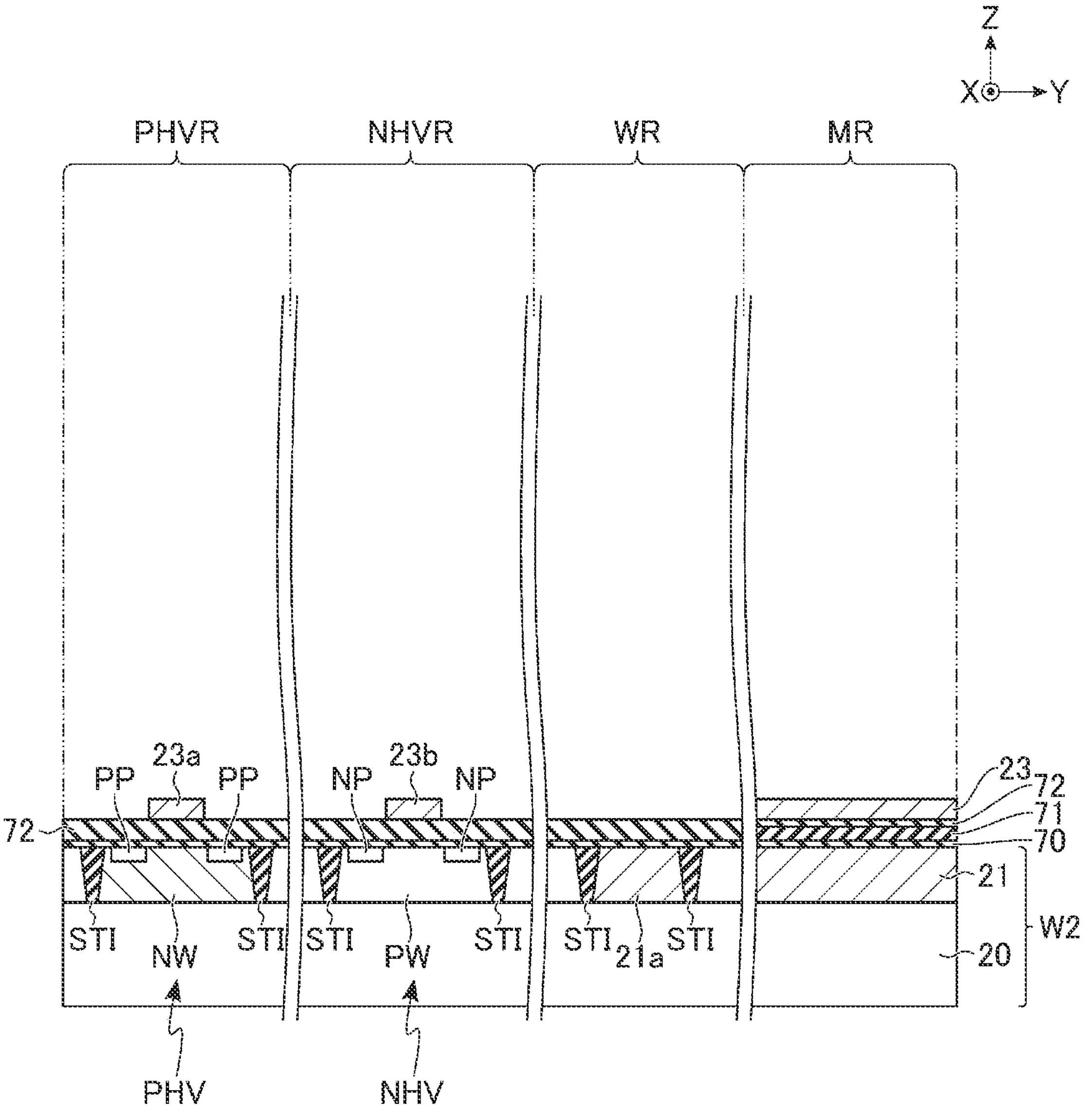
Figure 21:
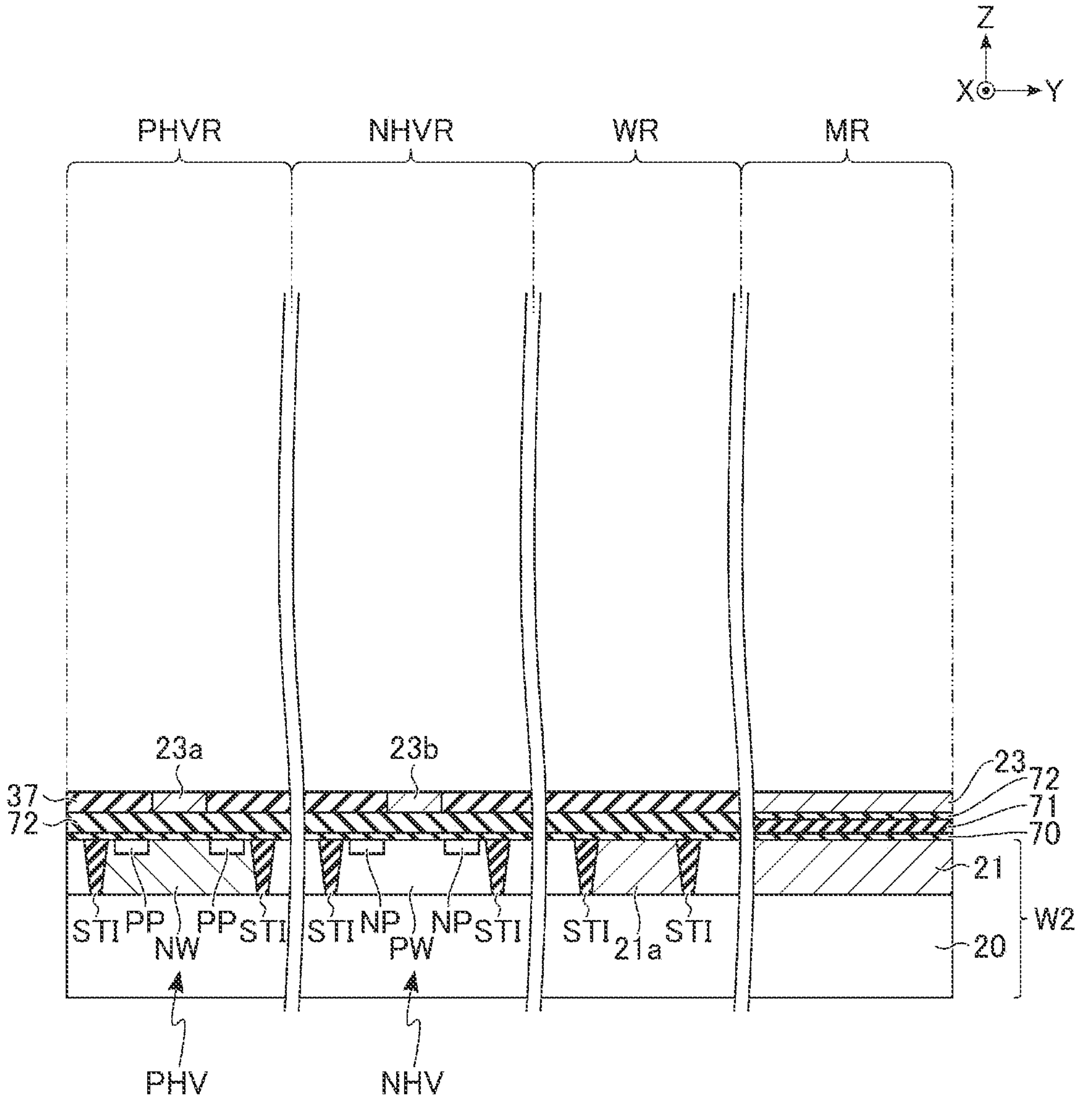

Next, as illustrated in FIG. 20, an impurity diffusion region for each high-voltage transistor is formed (S15). Specifically, the P-type impurity diffusion region PP is formed by a photolithography process for forming a mask with an opening corresponding to the P-type high-voltage transistor PHV followed by a P-type impurity ion implantation process. Similarly, the N-type impurity diffusion region NP is formed by a lithography process for forming a mask with an opening corresponding to the N-type high-voltage transistor NHV followed by an N-type impurity ion implantation process. The insulator layer 37 is embedded in the portion where the semiconductor layer 23 has been removed. A CMP process using the semiconductor layer 23 as an etching stopper forms the structure in which the upper surfaces of the semiconductor layers 23, 23*a*, and 23*b* and the insulator layer 37 are aligned (level) as illustrated in FIG. 21.

Figure 22:
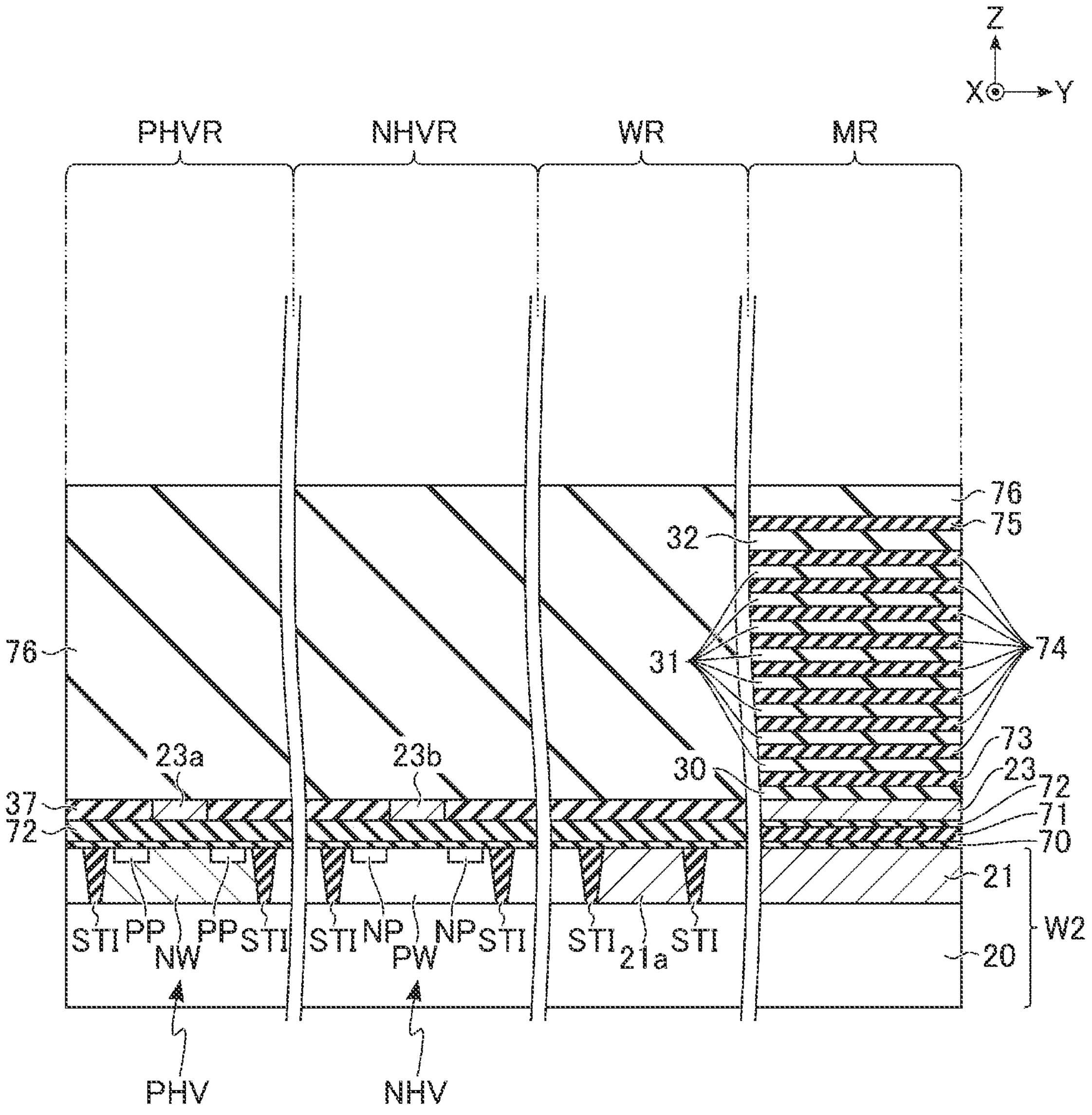

Next, as illustrated in FIG. 22, an ONON stacked structure is formed (S16). The ONON stacked structure is stacked layers of oxide (0) and nitride (N) materials and is used to form the stacked wiring of the memory cell array 10. The ONON structure has insulator layers and sacrificial members that are alternately stacked. Specifically, first, the insulator layer 30 and the sacrificial member 73 are formed in this order. Next, insulator layers 31 and sacrificial members 74 are alternately formed. An insulator layer 32 and a sacrificial member 75 are formed in this order on the uppermost sacrificial member 74. After that, by appropriately processing the ONON stacked structure formed in this manner, a step structure can be formed in the lead region HR. Then, the remaining portions of the ONON stacked structure are covered with an insulator layer 76, and the upper surface of the insulator layer 76 is planarized. The sacrificial members 73, 74, 75 are, for example, silicon nitride (SiN).

Figure 23:
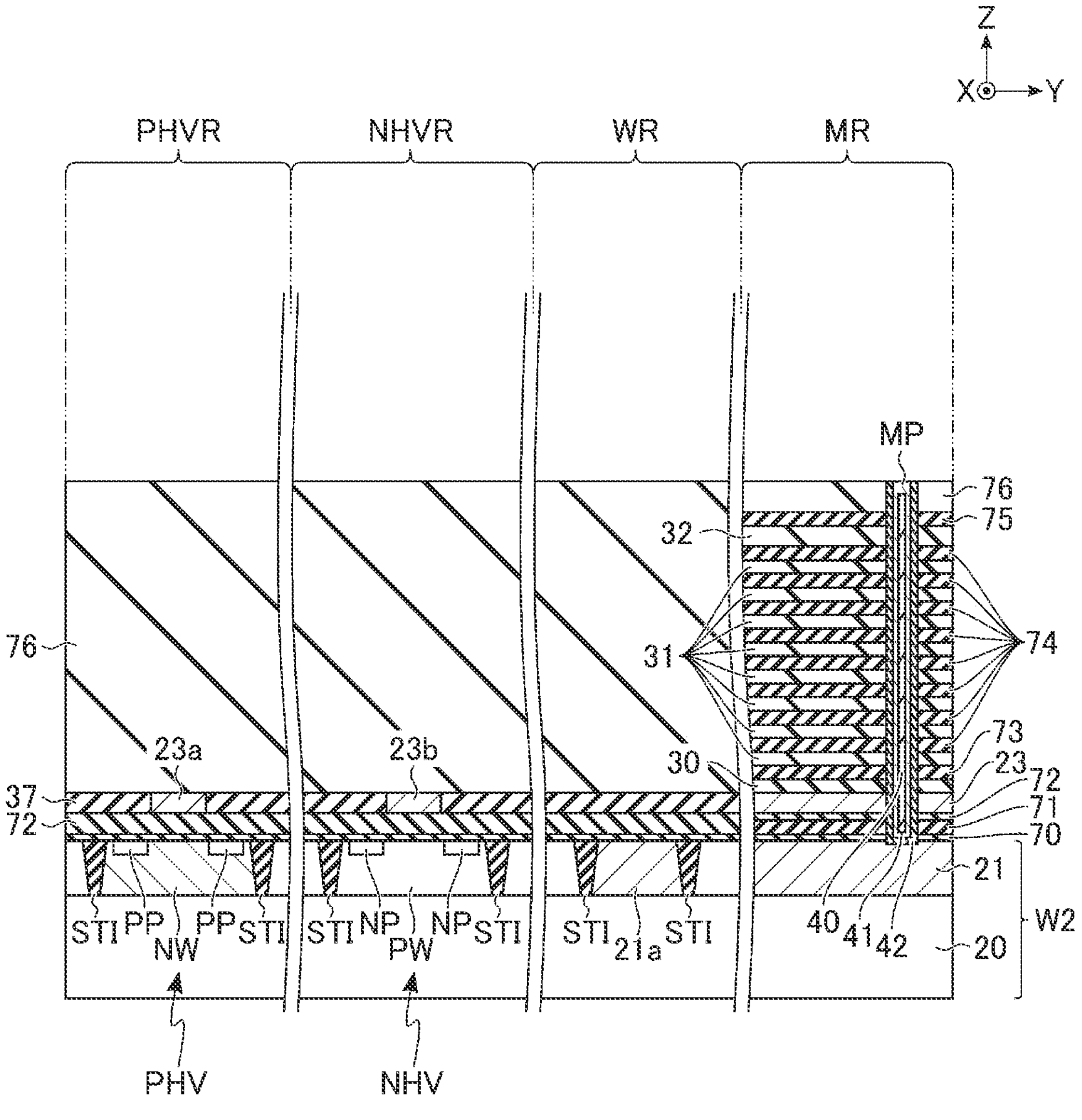

Next, as illustrated in FIG. 23, memory pillars MP are formed (S17). First, a mask having openings in regions corresponding to the memory pillars MP is formed by a photolithography process or the like. By an anisotropic etching process using the mask, a memory hole is formed. The memory hole extends through each of the insulator layer 70, sacrificial member 71, insulator layer 72, semiconductor layer 23, insulator layers 30, 31, 32, sacrificial members 73, 74, 75, and insulator layer 76, and a portion of the N-type impurity diffusion region 21 is exposed at the bottom of the memory hole. The stacked film 42 (that is, the block insulating film 45, the insulating film 44, and the tunnel insulating film 43), the semiconductor layer 41, and the core member 40 are formed in this order on the side and bottom surfaces of the memory hole. After that, a portion of the core member 40 provided above the memory hole is removed, and the semiconductor layer 41 is formed on the portion where the core member 40 has been removed.

Next, a replacement process is executed (S18). In the replacement process, after the insulator layer 77 covering the upper part of the memory pillar MP is formed, the process of forming the slit SLT is performed. Then the process of forming the source line SL and the process of forming the stacked wiring portion are sequentially performed by a replacement process.

Figure 24:
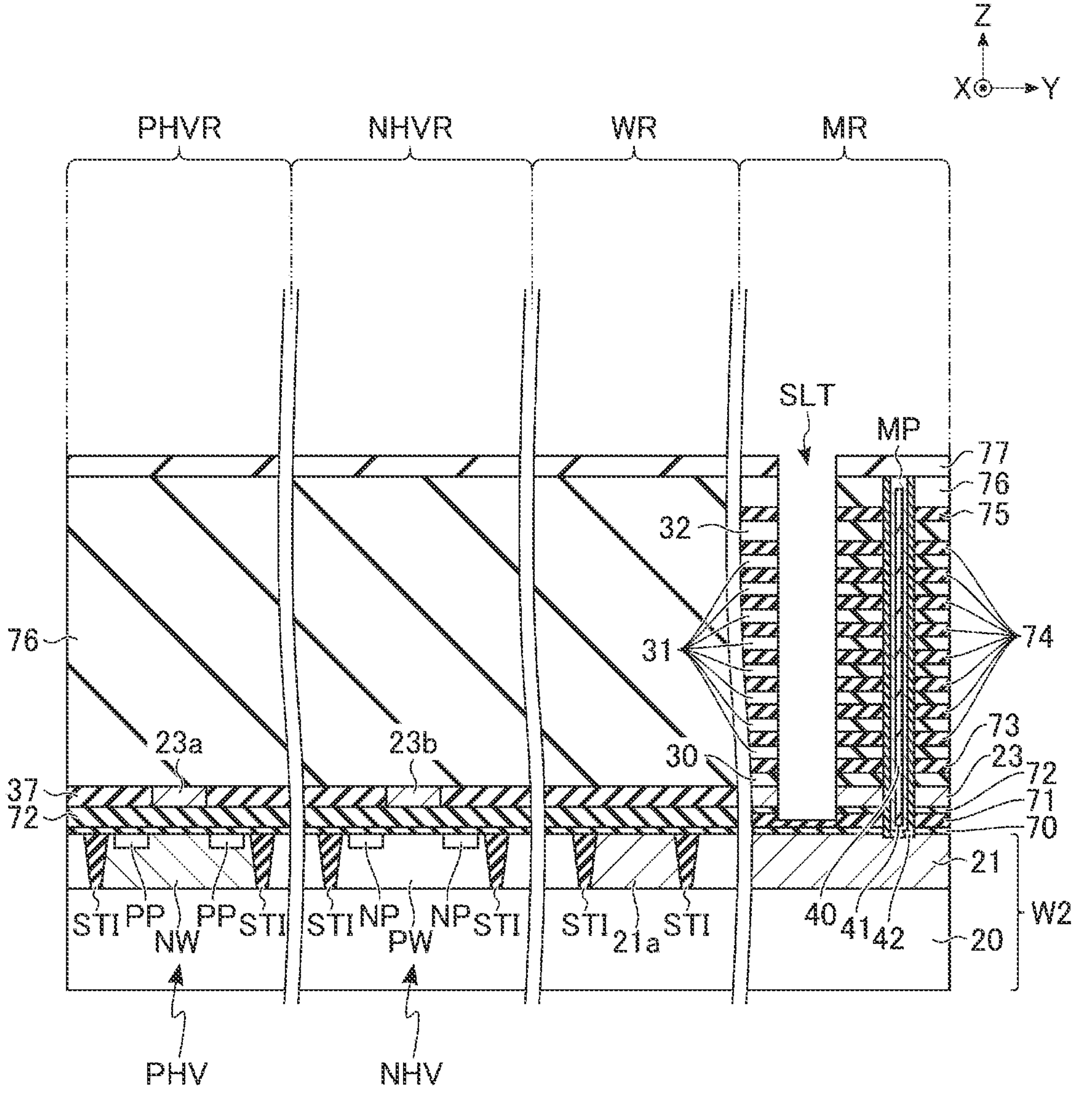

A slit SLT is formed as illustrated in FIG. 24 by photolithography and etching processes. The slit SLT divides the insulator layer 72, the semiconductor layer 23, the insulator layers 30 to 32, the sacrificial members 73 to 75, and the insulator layers 76 and 77. The sacrificial member 71 is exposed at the bottom portion of the slit SLT.

Next, a replacement process for the source line SL is performed. The sacrificial member 71 is selectively removed through the slit SLT by wet etching, for example. Subsequently, the insulator layers 70 and 72 and part of the stacked film 42 on the side surface of the memory pillar MP are selectively removed through the slit SLT in the source line connection layer, for example, by wet etching. A conductor (for example, silicon) is then embedded (formed) in the space left in the source line connection layer. The conductor forms the semiconductor layer 22 and electrically connects the semiconductor layer 22 and the semiconductor layer 41 in the memory pillar MP.

Figure 25:
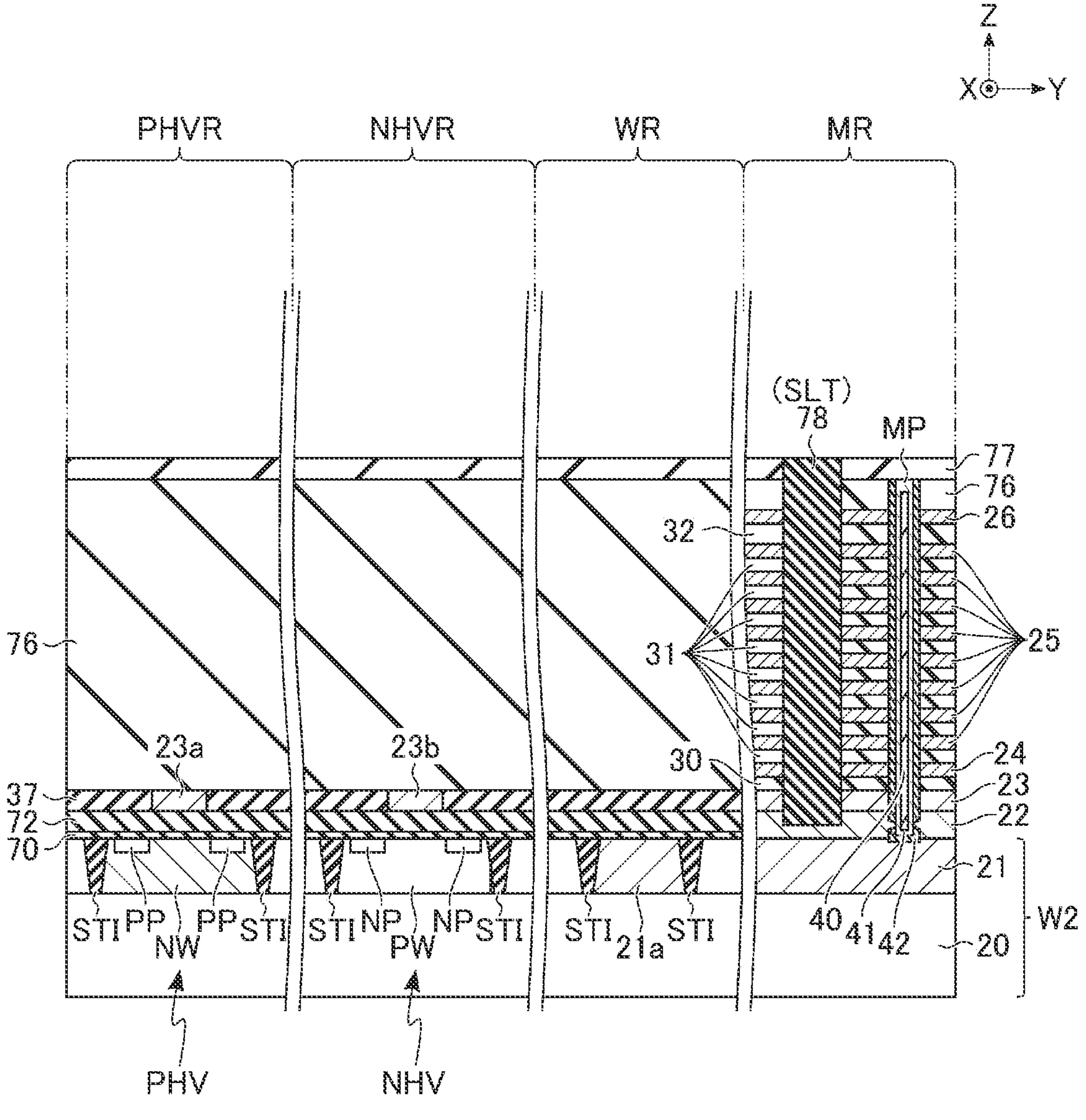

Next, a replacement process for the stacked wiring portion is executed. A protective film (for example, a silicon oxide film) is first formed on the portion of the semiconductor layer 22 exposed at the bottom portion of the slit SLT. By wet etching with hot phosphoric acid or the like, the stacked sacrificial members 73 to 75 are selectively removed through the slit(s) SLT. A conductor is then embedded (formed) in the space from which the sacrificial members 73 to 75 have been removed. Chemical vapor deposition (CVD), for example, is used to form the conductor in this process. After that, the conductor that might have been formed in the slit SLT is removed by an etch-back process, and the conductor formed in the adjacent wiring layers is separated into distinct layers. Thus, the conductor layer 24 functioning as a select gate line SGS, the conductor layers 25 functioning as word lines WL, and the conductor layer 26 functioning as a select gate line SGD are formed. After that, as illustrated in FIG. 25, an insulator 78 is embedded in the slit SLT.

Figure 26:
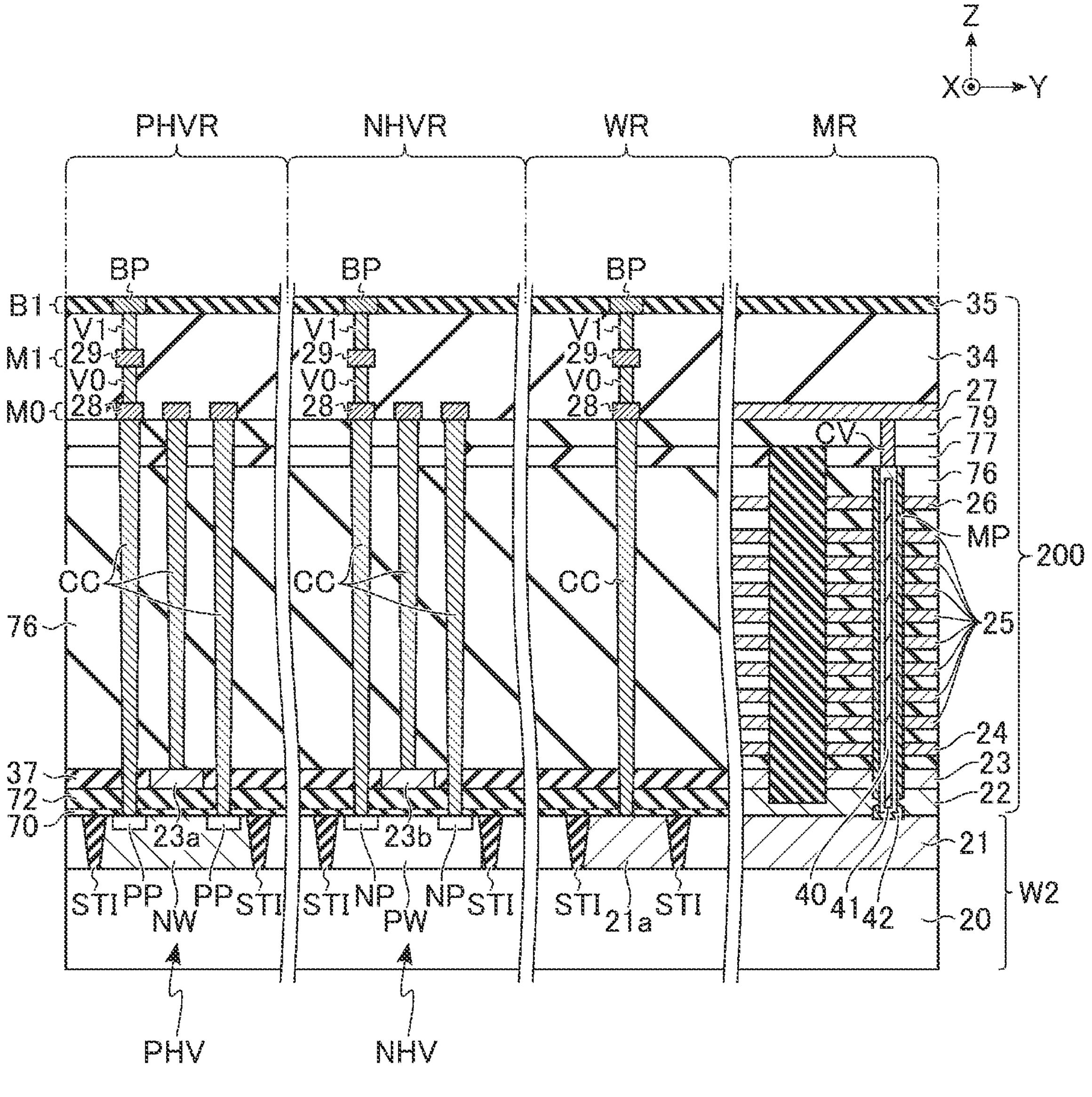

Next, contacts and wiring of the circuit layer 200 are formed (S19). Specifically, an insulator layer 79 is formed on the insulator layer 77. A mask having openings corresponding to the plurality of contacts CC is formed by a photolithography process or the like. A plurality of contact holes corresponding to the plurality of contacts CC are formed by an anisotropic etching process using the mask. Each contact hole is provided extending through at least the insulator layers 76, 77, and 79. The bottom portion of the contact holes reach one of the surface portion of the memory substrate W2, the semiconductor layer 23*a*, the semiconductor layer 23*b*, or a terrace portion of the stacked wiring. A conductor is then embedded in each contact hole to form the plurality of contacts CC. The insulator layers 76, 77, and 79 formed by the series of processes in FIG. 14 correspond in general to the insulator layer 33 illustrated in FIG. 11. In the process of S19, the contacts CV connected to each memory pillar MP are formed in the insulator layers 76, 77 and 79 along with the plurality of contacts CC. After that, as illustrated in FIG. 26, the structure from the wiring layer M0 to the wiring layer B1 is formed.

When the process of S19 is completed, the series of processes of FIG. 14 is completed, that is, the pre-processing for the memory substrate W2 is completed (end). After the pre-processing of the memory substrate W2 is completed, the surfaces of the plurality of bonding pads BP of the circuit layer 200 are exposed in the wiring layer B1.

<1-2-2> Manufacturing Process After Bonding CMOS Substrate W1 and Memory Substrate W2

Figure 27:
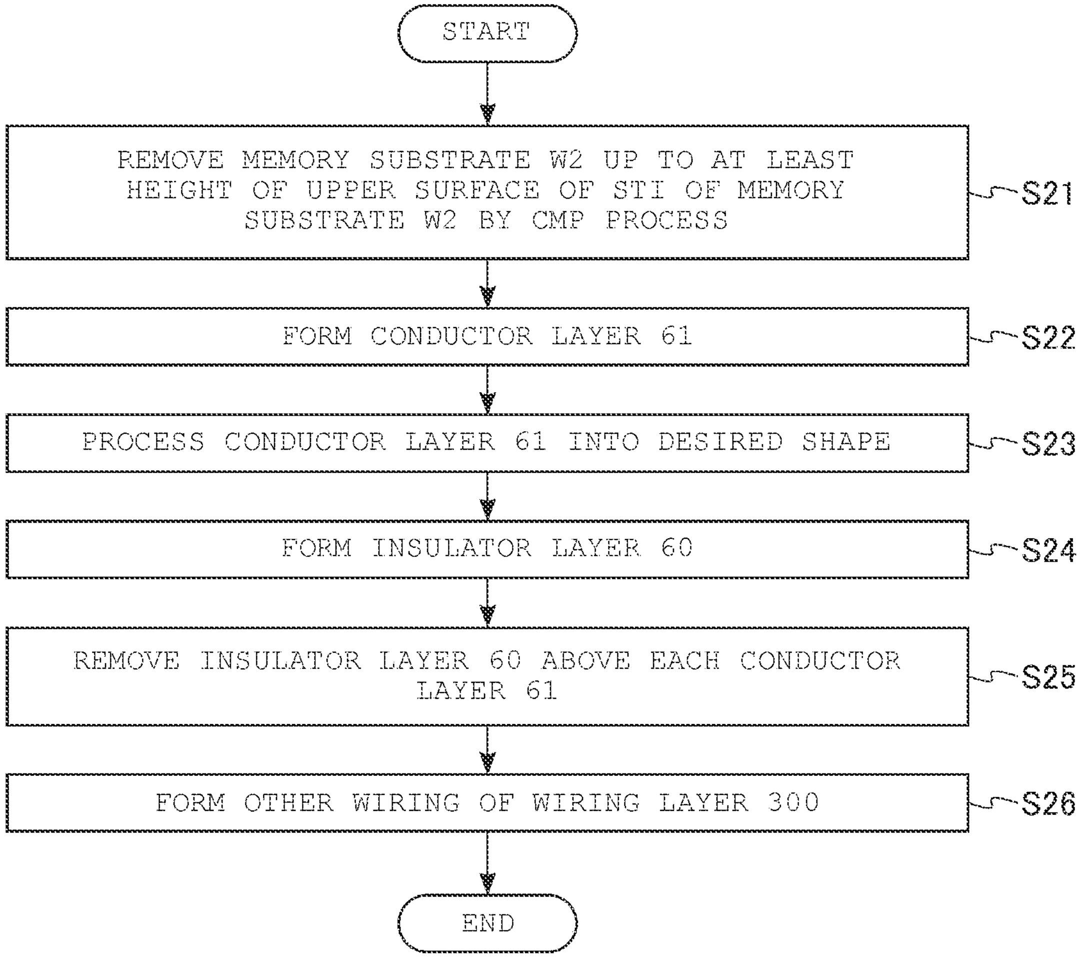
FIG. 27 is a flowchart illustrating an example of a manufacturing process after bonding a CMOS substrate and a memory substrate for a memory device according to a first embodiment.

FIG. 27 is a flowchart illustrating an example of the manufacturing process after bonding the CMOS substrate W1 and the memory substrate W2 for the memory device 1 according to the first embodiment. FIGS. 28 to 31 illustrate cross sections illustrating an example of the cross-sectional structure of the memory device 1 according to the first embodiment during manufacturing and display coordinate axes with the CMOS substrate W1 as a reference. Hereinafter, as a method of manufacturing the memory device 1 according to the first embodiment, the manufacturing process after bonding the CMOS substrate W1 and the memory substrate W2 will be described with reference to FIG. 27 as appropriate.

Figure 28:
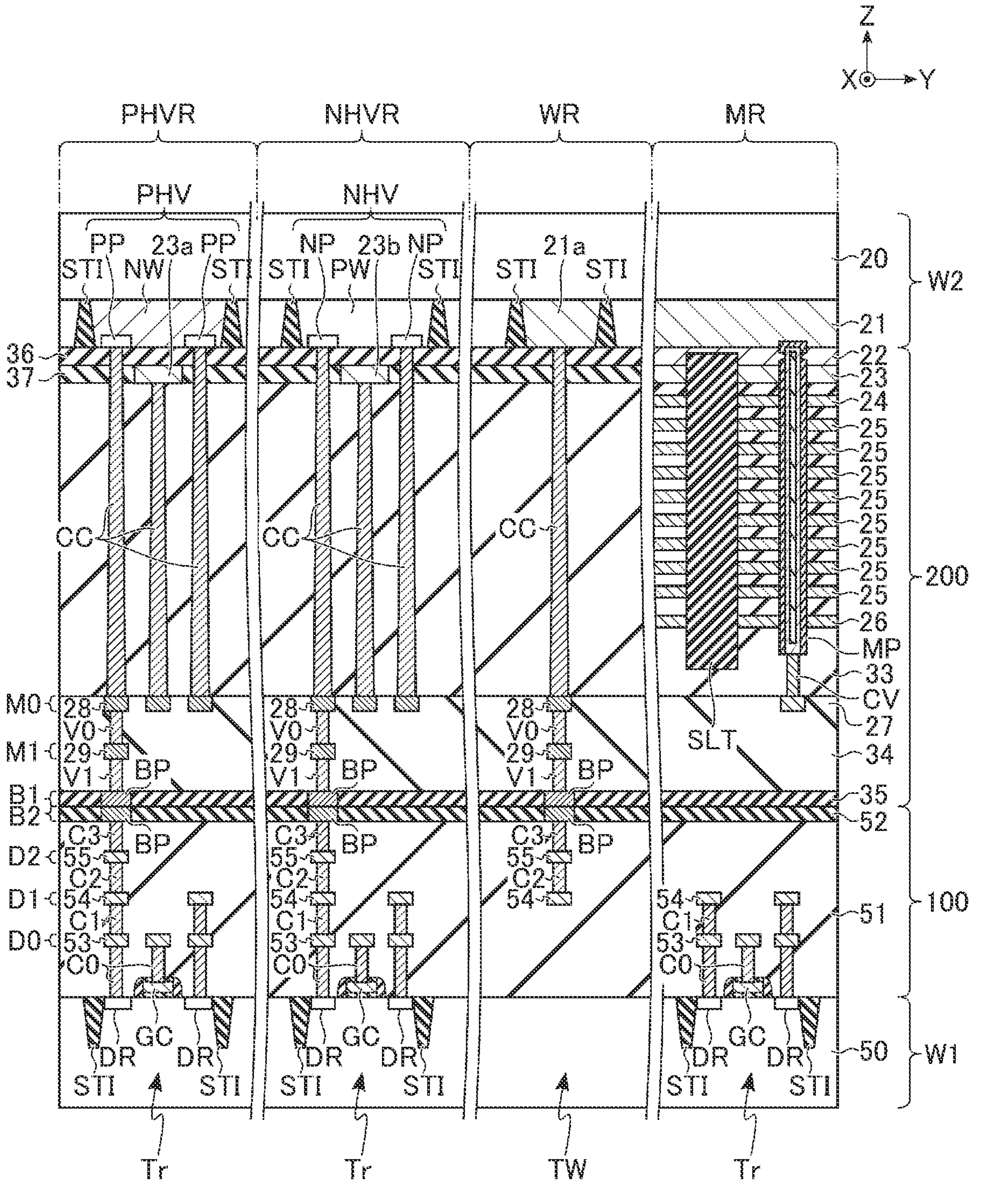
FIGS. 28 to 31 are cross-sectional views illustrating aspects of a manufacturing method of a memory device according to a first embodiment.

When a substrate (bonded substrate) is prepared in which the CMOS substrate W1 in which the pre-processing has been completed and the memory substrate W2 in which the pre-processing has been completed are bonded together as illustrated in FIG. 28, the series of processes illustrated in FIG. 27 begin (start). The upper surface of the P-type substrate portion 20 of the memory substrate W2 is exposed on the upper surface of the bonded substrate.

Figure 29:
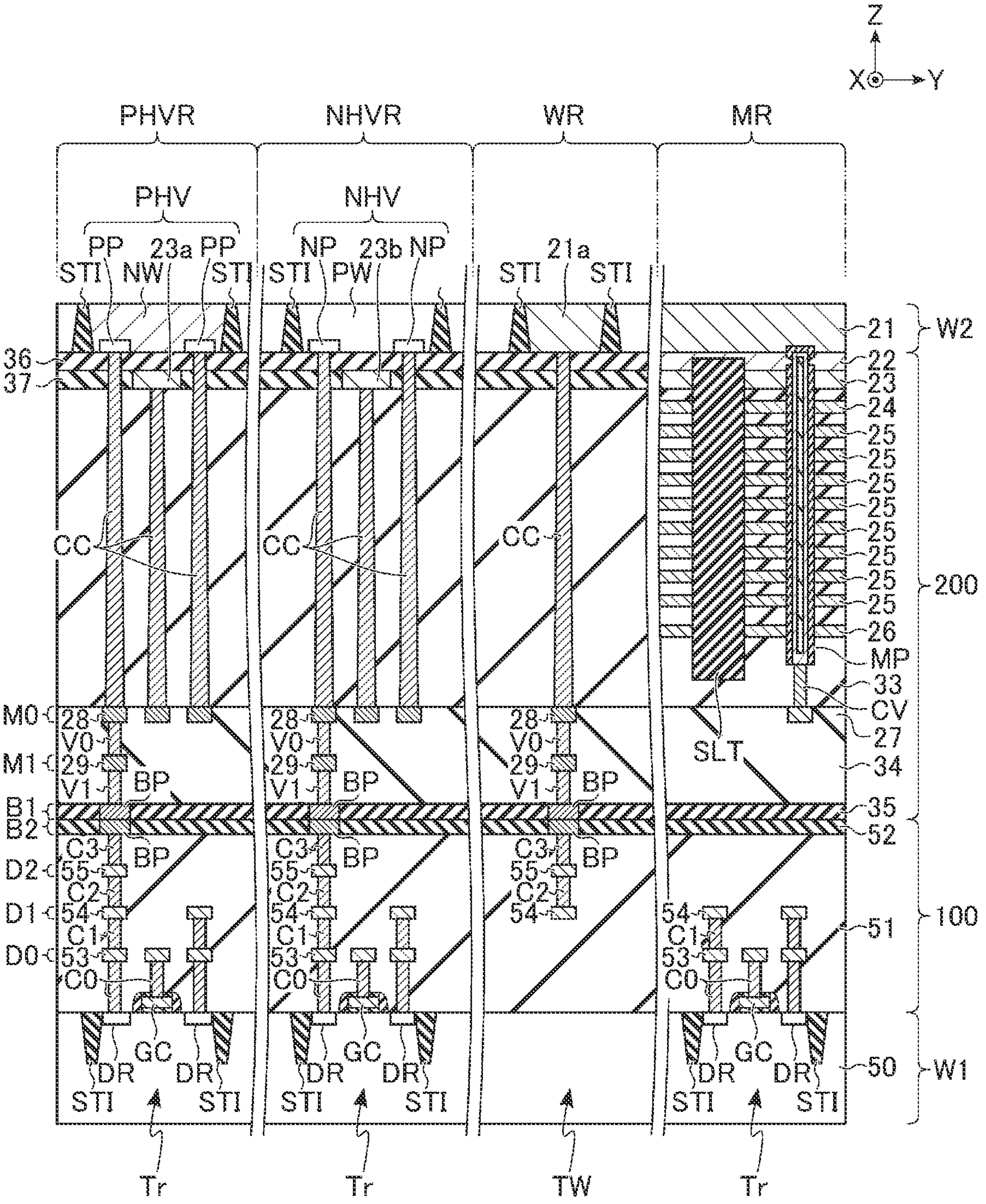

As illustrated in FIG. 29, the memory substrate W2 first is removed by the CMP process to at least the height of the upper end portion of the STI of the memory substrate W2 (S21). That is, in the process of S21, the P-type substrate portion 20 is removed by the CMP process using the STI of the memory substrate W2 as a stopper. As a result, a structure is formed in which the upper surface of the N-type well region NW of the region PHVR, the upper surface of the P-type well region PW of the region NHVR, the upper surface of the N-type impurity diffusion region 21*a* of the region WR, and the upper surface of the STI of the memory substrate W2 are aligned in height.

Figure 30:
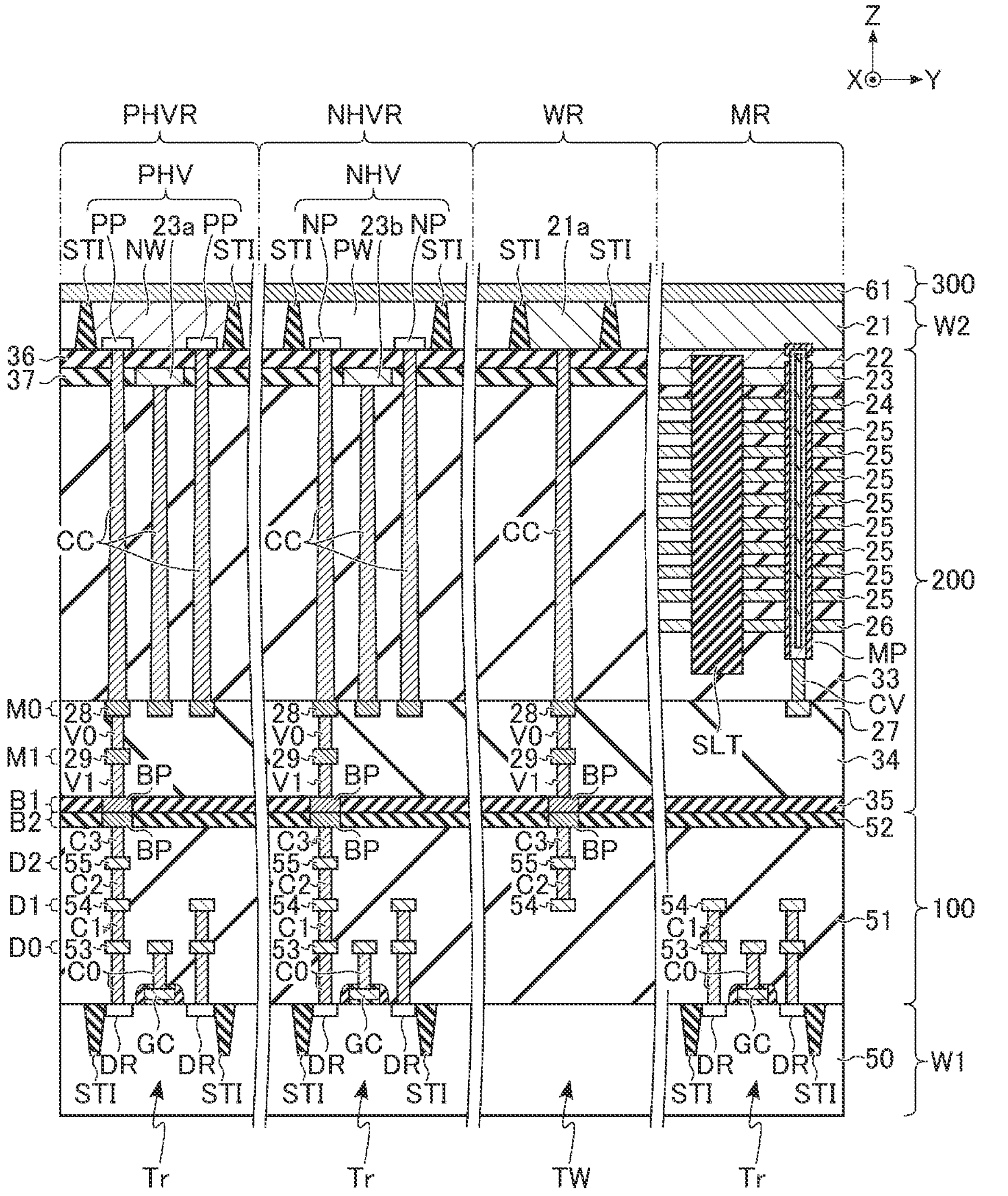

Next, as illustrated in FIG. 30, the conductor layer 61 is formed (S22). The conductor layer 61 contacts and is electrically connected to at least the N-type impurity diffusion regions 21 and 21*a*.

Next, the conductor layer 61 is processed into a desired shape (S23). In the process of S23, for example, a photolithography process is used to form a mask that covers the portions of the conductor layer 61 that are connected to the N-type impurity diffusion region 21 in the memory region MR and to the N-type impurity diffusion region 21*a* in the region WR. The conductor layer 61 provided in the openings of the mask is removed by an anisotropic etching process using the mask.

Figure 31:
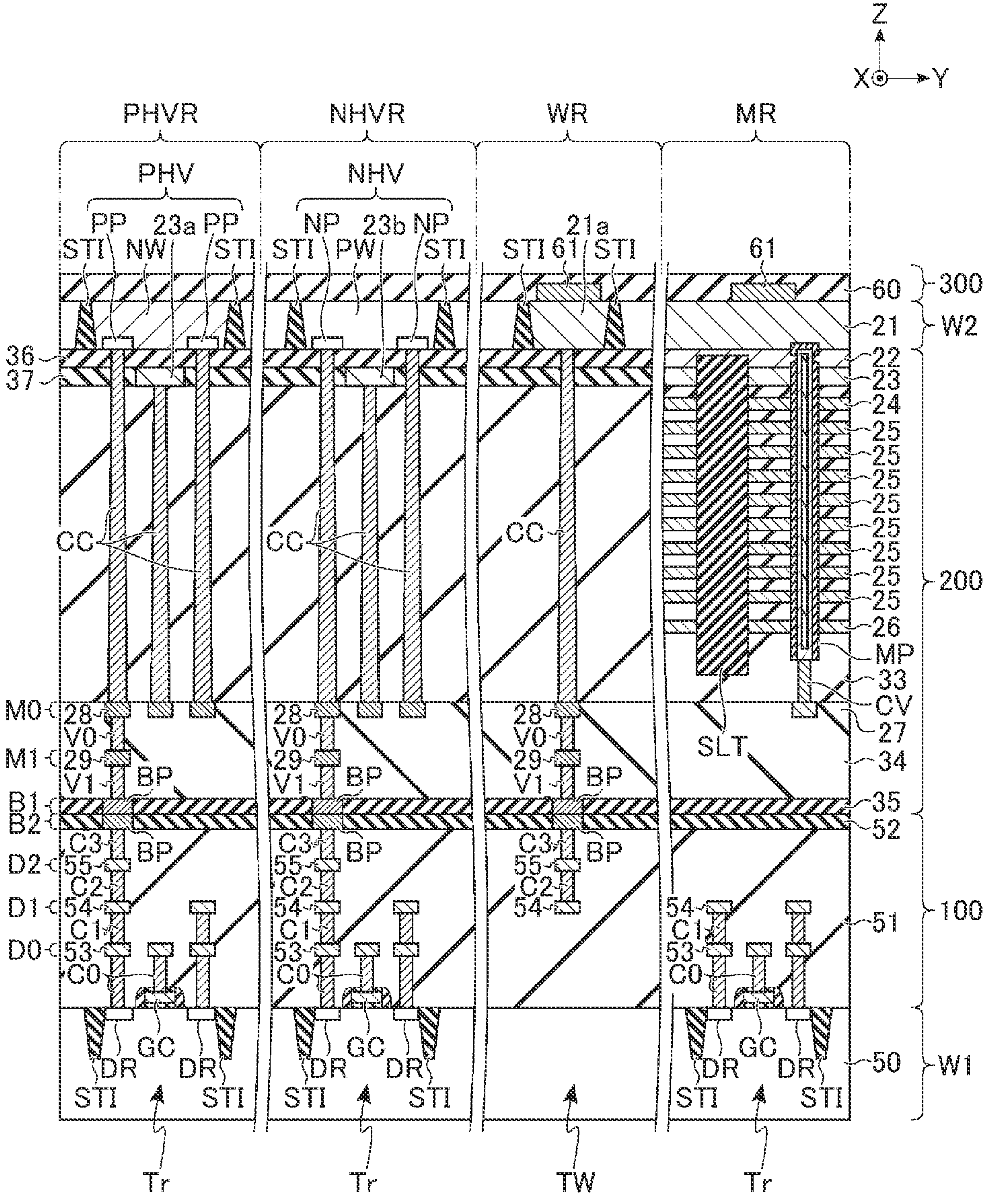

Next, as illustrated in FIG. 31, the insulator layer 60 is formed on the memory substrate W2 (S24). By forming the insulator layer 60, a structure is formed in which the conductor layer 61 in the memory region MR and the conductor layer 61 in the region WR are each covered with the insulator layer 60. The N-type well region NW of the region PHVR is surrounded by the insulator set including the insulator layers 36 and 60 and the STI, except for the portion where the contact CC is connected. The P-type well region PW of the region NHVR is surrounded by the insulator set including the insulator layers 36 and 60 and the STI, except for the portion where the contact CC is connected.

Next, the insulator layer 60 above each conductor layer 61 is removed (S25). As a result, the upper surface of each conductor layer 61 is exposed and the structure illustrated in FIG. 11 is formed.

Next, other wiring of the wiring layer 300 is formed (S26). Thereby, for example, wirings and pads connected to the conductor layer 61 are formed.

When the process of S26 is completed, the series of processes in FIG. 27 is completed, that is, the structure of the memory device 1 is completed (end).

<1-3> Effect of First Embodiment

Figure 32:
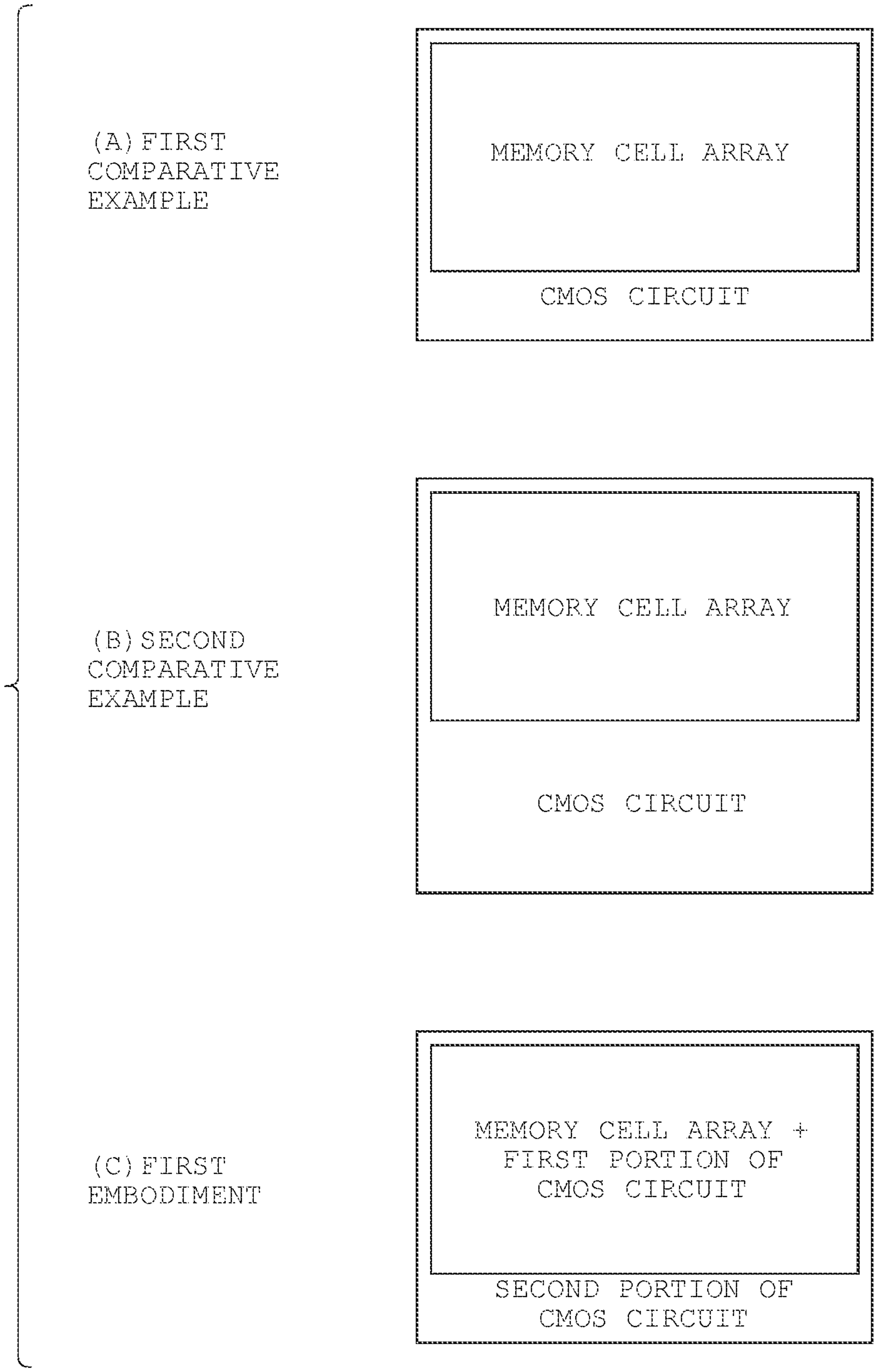
FIG. 32 illustrates examples of circuit layouts for a first comparative example, a second comparative example, and a first embodiment.

According to the memory device 1 according to the first embodiment, the manufacturing cost of the memory device can be reduced. Details of the effects of the first embodiment will be described below with reference to FIG. 32 as appropriate. Parts (A), (B), and (C) in FIG. 32 schematically illustrate an example of the circuit layout in the first comparative example, the second comparative example, and the first embodiment, respectively.

A memory device having a structure in which memory cells are stacked three-dimensionally is known. Such a memory device can increase the storage capacity of the memory device by, for example, increasing the number of stacked memory cells. As a memory device structure, a structure in which a substrate (CMOS substrate) on which a CMOS circuit is formed and a substrate (memory substrate) on which a memory cell array is formed are bonded together is known. Such a structure can reduce the chip area of the memory device and reduce the manufacturing cost of the memory device. The chip area of the memory substrate and the chip area of the CMOS substrate are preferably designed to be equivalent as in the first comparative example illustrated in part (A) of FIG. 32.

However, when the number of stacked memory cells increases, the number of transistors used in the row decoder module 16 and the sense amplifier module 17 also generally increases. An increase in the number of stacked layers of memory cells causes an increase in the area of the CMOS circuit. When the area of the CMOS circuit increases, that is, when the size of the CMOS substrate increases, the chip size of the memory device is governed by the chip size of the larger CMOS substrate as in the second comparative example shown in part (B) of FIG. 32. Therefore, in a memory device having a bonded structure, it is difficult to design the chip size of the CMOS substrate and the chip size of the memory substrate to be equivalent.

In the memory device 1 according to the first embodiment, part of the CMOS circuit is formed on the memory substrate W2 side. In other words, in the first embodiment, the memory substrate W2 includes the memory cell array 10 and the first portion of the CMOS circuit, and the CMOS substrate W1 includes the second portion of the CMOS circuit. For example, in the memory device 1 according to the first embodiment, the transistor TR of the word line switch unit WLSW of the row decoder module 16 and the transistor T8 of the bit line connection unit BLHU of the sense amplifier module 17 are formed on the memory substrate W2 side. In other words, among the CMOS circuits provided in the memory device 1, the high-voltage transistors of the word line switch unit WLSW and the bit line connection unit BLHU are formed on the same plane (substrate) as the memory substrate W2, that is, the memory cell array 10.

As a result, as illustrated in part (C) of FIG. 32, the memory device 1 according to the first embodiment can prevent the transistors of the CMOS circuit from protruding significantly from the region overlapping the memory substrate W2. In other words, in the memory device 1 according to the first embodiment, the area expansion of the CMOS substrate W1 can be reduced, and the CMOS substrate W1 and the memory substrate W2 can be designed to have the substantially equivalent chip size. Therefore, the memory device 1 according to the first embodiment can reduce an increase in chip size of the memory device 1.

In the memory device 1 according to the first embodiment, the structure of the transistors provided on the memory substrate W2 is different from the structure of the transistors provided on the CMOS substrate W1. Specifically, the transistor provided on the memory substrate W2 has an SOI structure by being surrounded by the insulator layers 36 and 60 and the STI. In other words, in the memory device 1 according to the first embodiment, the active regions of the transistors provided on the memory substrate W2 can be isolated by the STI of the memory substrate W2 and the back insulating film (insulator layer 60) of the memory substrate W2. Therefore, the transistor provided on the memory substrate W2 can greatly reduce leakage current compared to the non-SOI structure transistor provided on the CMOS substrate W1. Since leakage current can be reduced, the withstand voltage between STIs can be increased.

The memory device 1 according to the first embodiment does not have a CMOS circuit above the memory substrate W2 with the CMOS substrate W1 as a reference. Therefore, in the memory device 1 according to the first embodiment, the number of wiring layers can be reduced and the film thickness of the chip can be reduced as compared with the case where the CMOS circuit is provided above the memory substrate W2. Therefore, the memory device 1 according to the first embodiment can reduce manufacturing costs.

<2> Second Embodiment

The memory device 1 according to a second embodiment has a configuration in which a plurality of planes are provided, and some high-voltage transistors of at least one plane are provided on the memory substrate W2. The second embodiment will be described below.

<2-1> Configuration

<2-1-1> Overall Configuration of Memory Device 1

Figure 33:
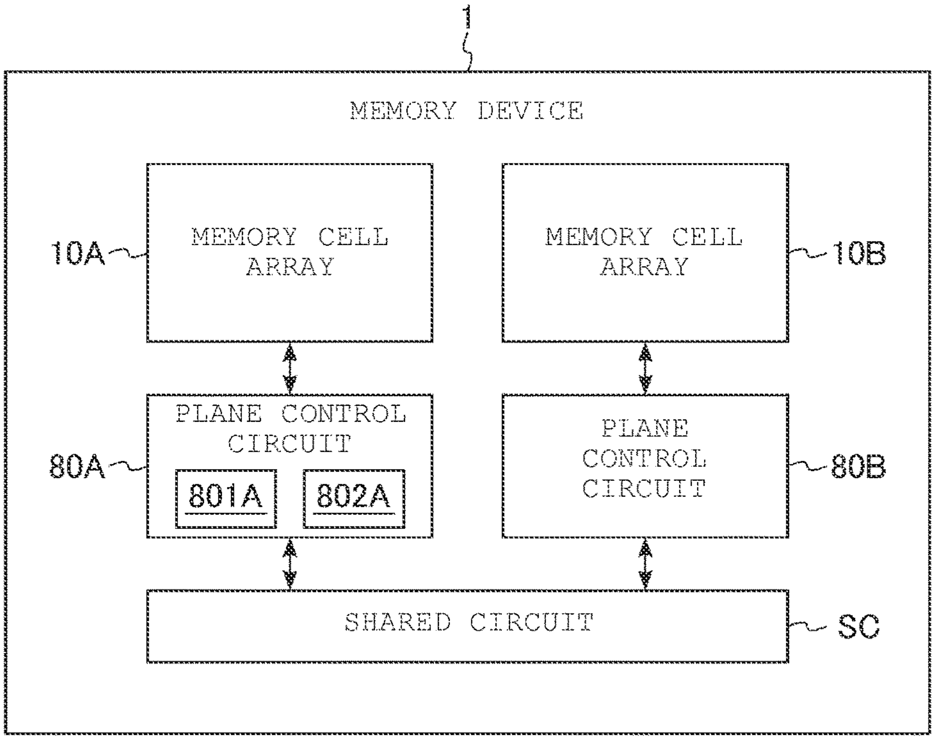
FIG. 33 is a block diagram of a memory device according to a second embodiment.

FIG. 33 is a block diagram illustrating an example of the configuration of the memory device 1 according to the second embodiment. As illustrated in FIG. 33, the memory device 1 according to the second embodiment includes a plurality of planes. Specifically, the memory device 1 according to the second embodiment includes memory cell arrays 10A and 10B, plane control circuits 80A and 80B, and a shared circuit SC.

The memory cell arrays 10A and 10B are controlled by the plane control circuits 80A and 80B, respectively. The plane control circuit 80A includes the row decoder module 16 and the sense amplifier module 17, which are associated with the memory cell array 10A. The plane control circuit 80B includes the row decoder module 16 and the sense amplifier module 17, which are associated with the memory cell array 10B. In the present example, the plane control circuit 80A is divided, and the plane control circuit 80A includes a first portion 801A and a second portion 802A.

The shared circuit SC is a CMOS circuit shared by a plurality of planes. Specifically, the shared circuit SC is connected to each of the plane control circuits 80A and 80B. The shared circuit SC includes the input and output circuit 11, the logic controller 12, the register circuit 13, and the sequencer 14, for example. In the memory device 1 according to the second embodiment, the combination of the plane control circuit 80 and the CMOS circuits assigned to the shared circuit SC may be changed according to the design of the memory device 1. The memory device 1 according to the second embodiment may have three or more planes.

<2-1-2> Structure of Memory Device 1

Next, the structure of the memory device 1 according to the second embodiment will be described.

(1: Planar Layout of Memory Device 1)

Figure 34:
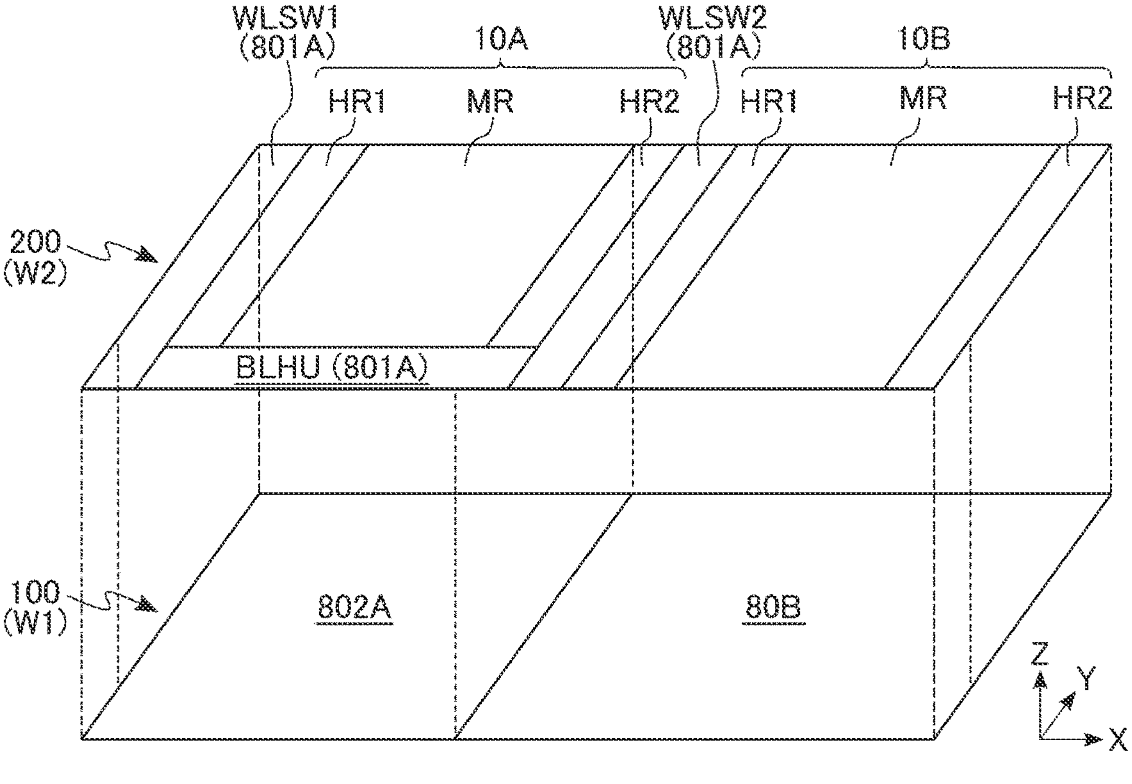
FIG. 34 is a schematic diagram illustrating an example of a planar layout of a memory device according to a second embodiment.

FIG. 34 is a schematic diagram illustrating an example of a planar layout of the memory device 1 according to the second embodiment. FIG. 34 illustrates the layout of the bonding surface between the circuit layer 100 (CMOS substrate W1) and the circuit layer 200 (memory substrate W2) according to the second embodiment and displays coordinate axes with the CMOS substrate W1 as a reference. In FIG. 34, the illustration of the input and output region IOR is omitted. As illustrated in FIG. 34, the memory substrate W2 includes the memory region MR and the lead regions HR1 and HR2 corresponding to the memory cell array 10A, and the memory region MR and the lead regions HR1 and HR2 corresponding to the memory cell array 10B.

In the second embodiment, the word line switch units WLSW1 and WLSW2 and the bit line connection unit BLHU corresponding to the memory cell array 10A are located on the memory substrate W2, as in the first embodiment. The word line switch units WLSW1 and WLSW2 and the bit line connection unit BLHU corresponding to the memory cell array 10A correspond to a first portion 801A of the plane control circuit 80A. A second portion 802A of the plane control circuit 80A is disposed on the CMOS substrate W1. Meanwhile, the plane control circuit 80B corresponding to the memory cell array 10B is disposed exclusively on the CMOS substrate W1. That is, the word line switch unit WLSW and the bit line connection unit BLHU corresponding to the memory cell array 10B are provided not on the memory substrate W2 but on the CMOS substrate W1.

In the second embodiment, the circuit area associated with each plane differs between the CMOS substrate W1 and the memory substrate W2. In the present example, by locating the first portion 801A of the plane control circuit 80A on the memory substrate W2, the total area including the memory region MR associated with the memory cell array 10A, the lead regions HR1 and HR2, and the first portion 801A of the plane control circuit 80A may be larger than the area of the second portion 802A of the plane control circuit 80A. On the other hand, the total area of the memory region MR and the lead regions HR1 and HR2, which are associated with the memory cell array 10B, may be designed to be smaller than the area of the plane control circuit 80B. Thereby, the total area of the portions associated with the memory cell arrays 10A and 10B in the CMOS substrate W1 and the total area of the portions associated with the memory cell arrays 10A and 10B in the memory substrate W2 may be designed to be substantially equal. Thus, in the second embodiment, the area of the memory cell array 10A and the area of the memory cell array 10B may be different.

(2: Cross-Sectional Structure of Memory Device 1)

Figure 35:
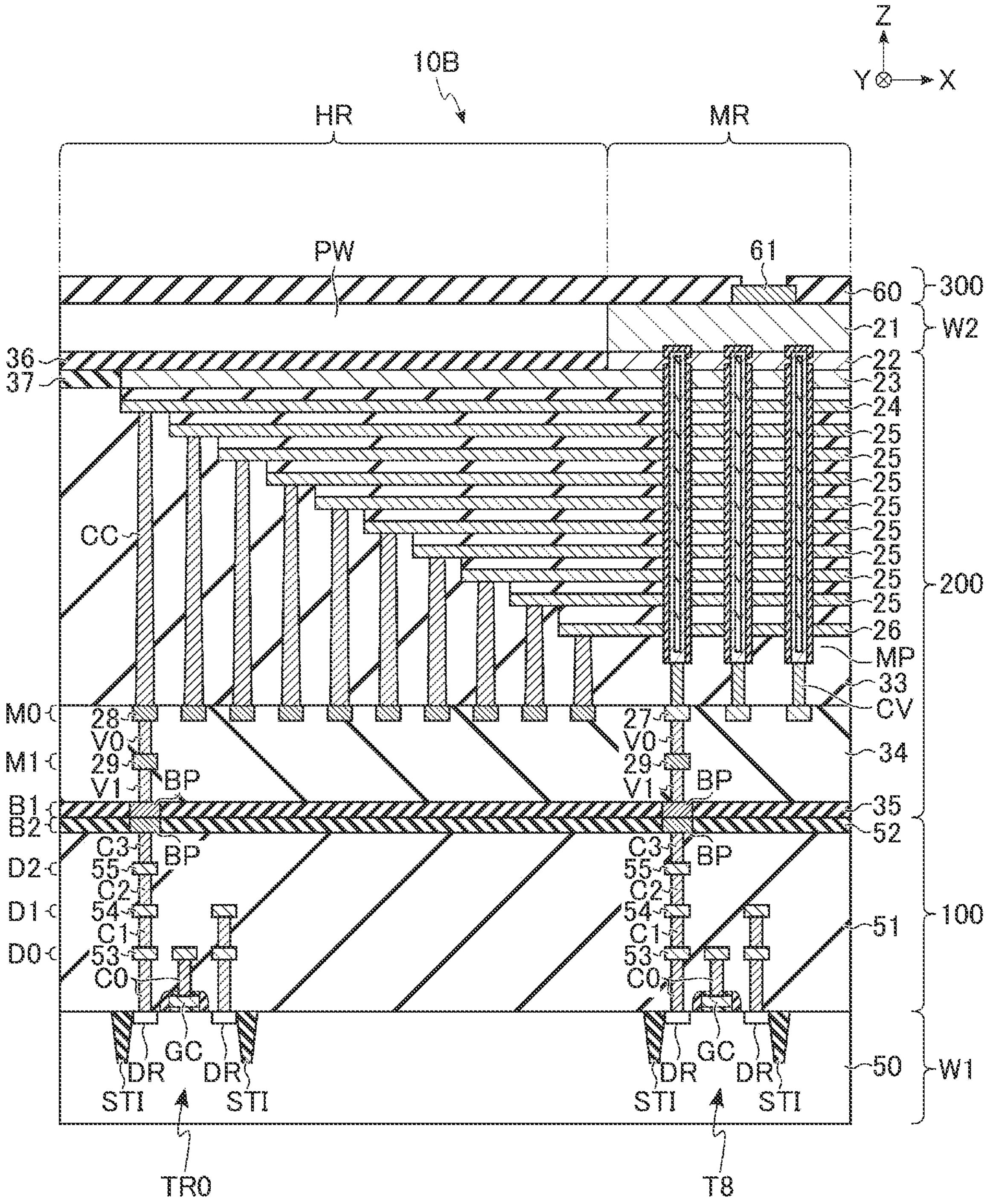
FIG. 35 is a cross-sectional view of a memory device according to a second embodiment.

FIG. 35 is a cross-sectional view illustrating an example of the cross-sectional structure of the memory device 1 according to the second embodiment. FIG. 35 illustrates a cross section of the memory device 1 including the memory region MR and lead region HR corresponding to the memory cell array 10B. In the following, the connection between the conductor layer 24 (select gate line SGS) and the row decoder module 16 and the connection between the conductor layer 27 (bit line BL) and the sense amplifier module 17 among the stacked wiring of the memory cell array 10B are described as examples.

As illustrated in FIG. 35, in the memory cell array 10B, each stacked wiring and each bit line BL are connected not to the transistors provided on the memory substrate W2 but to the transistors provided on the CMOS substrate W1.

Specifically, the conductor layer 24 (select gate line SGS) of the memory cell array 10B is connected to the impurity diffusion region DR of the transistor TR0 provided on the CMOS substrate W1 via the contacts CC, V0, V1, and C0 to C3, the conductor layers 28, 29, and 53 to 55, and the respective bonding pads BP of the circuit layers 100 and 200. Although illustration is omitted, the conductor layers 25 and 26 other than the conductor layer 24 among the stacked wiring are similarly connected to the circuit provided on the CMOS substrate W1 via the respective bonding pads BP of the circuit layers 100 and 200.

The conductor layer 27 (bit line BL) of the memory cell array 10B is connected to the impurity diffusion region DR of the transistor T8 provided on the CMOS substrate W1 via the contacts CC, V0, V1, and C0 to C3, the conductor layers 28, 29, and 53 to 55, and the respective bonding pads BP of the circuit layers 100 and 200. Other configurations of the memory device 1 according to the second embodiment are similar to those of the first embodiment.

<2-2> Effects of Second Embodiment

Figure 36:
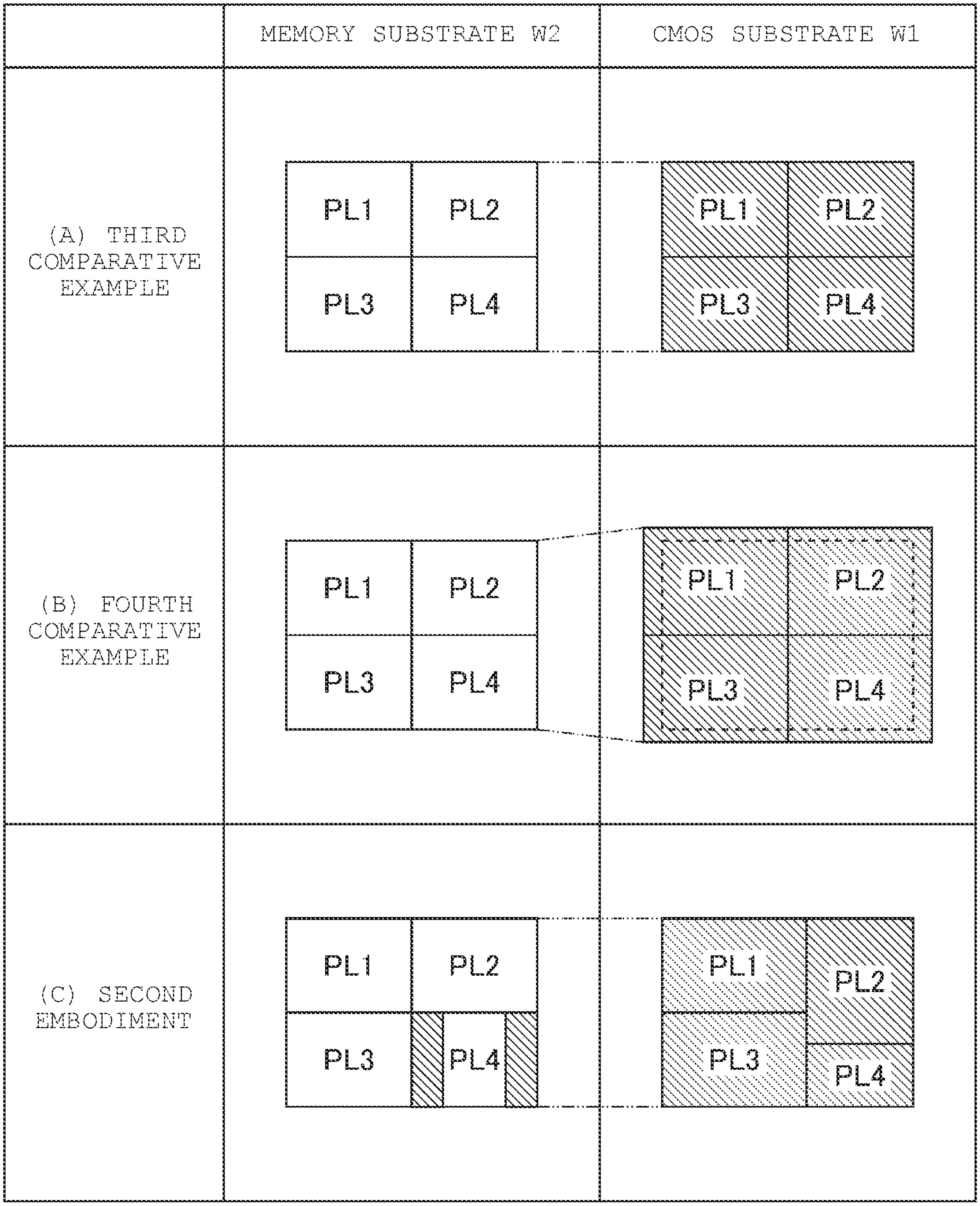
FIG. 36 illustrates examples of circuit layouts for a third comparative example, a fourth comparative example, and a second embodiment.

The memory device 1 according to the second embodiment includes the memory cell array 10A in which a part of the associated CMOS circuit is provided on the memory substrate W2, and the memory cell array 10B in which the associated CMOS circuit is provided only on the CMOS substrate W1. Parts (A), (B), and (C) in FIG. 36 schematically illustrate an example of the circuit layout in the third comparative example, the fourth comparative example, and the second embodiment, respectively. The effect of the second embodiment will be described below using the case where the memory device 1 has four planes PL1 to PL4 as an example.

The third comparative example corresponds to the case where the memory cell array 10 and the CMOS circuit are provided with the same area. As illustrated in part (A) of FIG. 36, in the third comparative example, the CMOS substrate W1 and the memory substrate W2 may be designed with substantially the same area, and thus, the chip size of the memory device 1 can be reduced.

The fourth comparative example corresponds to a case where the number of stacked memory cells is increased and the area of the CMOS circuit is larger than that of the memory cell array 10. As illustrated in part (B) of FIG. 36, in the fourth comparative example, as the area of the CMOS circuit increases, the area of the CMOS substrate W1 becomes larger than the area of the memory substrate W2. Therefore, the chip size of the memory device 1 in the fourth comparative example becomes large in proportion to the chip size of the CMOS substrate W1.

On the other hand, in the second embodiment, a plane PL4 in which part of the CMOS circuit is provided on the memory substrate W2 as in the first embodiment, and planes PL1 to PL3 in which the memory cell array 10 and the CMOS circuit are provided on different substrates are provided. In the second embodiment, as illustrated in part (C) of FIG. 36, in the CMOS substrate W1, the area of the CMOS circuits corresponding to the plane PL4 may be designed to be smaller than the area of the CMOS circuits corresponding to the other planes PL.

As a result, the total area of the memory cell arrays 10 of the planes PL1 to PL4 and a part of the CMOS circuits of the plane PL4 on the memory substrate W2 is designed to be substantially equal to the total area of the CMOS circuits of the planes PL1 to PL3 and the remaining part of the CMOS circuits of the plane PL4 on the CMOS substrate W1. In other words, the memory device 1 according to the second embodiment includes a plane PL having the structure described in the first embodiment and a plane PL in which the memory cell array 10 and the CMOS circuits are each provided on a substrate different from one another. Thereby, the area of the memory substrate W2 and the area of the CMOS substrate W1 may be designed to be substantially equal. Therefore, the memory device 1 according to the second embodiment can reduce the chip size of the memory device 1 and reduce the manufacturing cost of the memory device 1.

In the second embodiment, the size of the memory cell array 10 of a plane having the structure described in the first embodiment may be different from the size of the memory cell array 10B described with reference to FIG. 35. The memory device 1 according to the second embodiment includes a plurality of planes PL, and the plurality of planes PL includes at least one plane PL having the structure described in the first embodiment. For example, two or three out of the four planes PL1 to PL4 illustrated in part (C) of FIG. 36 may have the structure described for the first embodiment.

<3> Others

Figure 37:
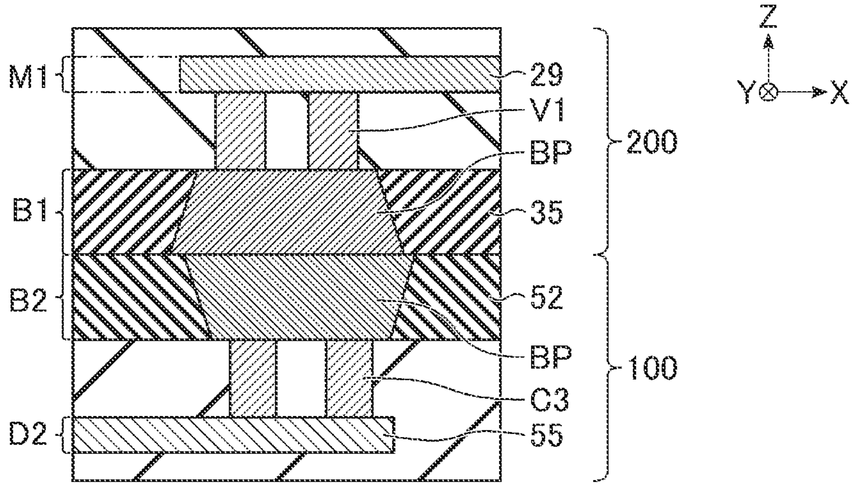
FIG. 37 is a cross-sectional view of a bonding portion of two combined bonding pads.

FIG. 37 is a cross-sectional view illustrating an example of a cross-sectional structure of a bonding portion of two combined bonding pads BP. FIG. 37 illustrates bonding pads BP of the circuit layer 100, bonding pads BP of the circuit layer 200, and some contacts and wirings connected to the bonding pads BP. As illustrated in FIG. 37, the two bonding pads BP located to face each other have different taper shapes based on the etching direction during formation. Specifically, the bonding pad BP formed using the CMOS substrate W1 has a reverse taper shape. The bonding pad BP formed using the memory substrate W2 has a taper shape. The bonding pad BP formed in a reverse taper shape can be regarded as having a taper shape when the CMOS substrate W1 is used as a reference because the bonding pad BP is turned upside down and bonded by the bonding process.

The pair of two bonding pads BP located to face each other may be bonded at a slight shift with a shift (offset) amount determined by the alignment process during the bonding process. Therefore, the upper surface of the bonding pad BP of the circuit layer 100 and the bottom surface of the bonding pad BP of the circuit layer 200 may form a step. The pair of two bonding pads BP located to face each other may have a distinct boundary or may be integrated (melded) to such an extent as to lack a distinct boundary. The bonding pad BP and the contacts V1 and C3 connected to the bonding pad BP may be integrally formed. The bonding pad BP of the circuit layer 100 may be connected to the conductor layer 55 via a plurality of contacts C3. Similarly, the bonding pads BP of the circuit layer 200 may be connected to the conductor layer 29 via a plurality of contacts V1.

Various modifications may be made with respect to each described embodiment. The circuit configuration, planar layout, and cross-sectional structure of the memory device 1 may be changed as appropriate. For example, one lead region HR may be provided. The memory device 1 may include a plurality of memory regions MR. The arrangement of the memory region MR, lead region HR, word line switch unit WLSW, bit line connection unit BLHU, and peripheral circuit region PERI may be varied as appropriate. The memory device 1 may include a plurality of memory substrates W2 and a plurality of CMOS substrates W1. A memory pillar MP may have a structure in which two or more pillars are connected to one another in the Z direction. The memory pillar MP may have a structure in which a pillar corresponding to the select gate line SGD and a pillar corresponding to the word line WL are connected. Each contact may be connected by a plurality of contacts linked to one another in the Z direction. A conductor layer may be inserted in the connecting portion of the plurality of contacts. The number of wiring layers and contacts provided in the memory device 1 may be changed as appropriate.

In the drawings, the case where the memory pillars MP have the same diameter in the Z direction is depicted, but the present disclosure is not limited thereto. The memory pillar MP may have a taper shape, a reverse taper shape, or a bowing shape. Similarly, each of the slits SLT and SHE may have a taper shape, a reverse taper shape, or a bowing shape. Similarly, each contact may have a taper shape, a reverse taper shape, or a bowing shape. Each cross-sectional structure of the memory pillars MP and each contact may be circular or elliptical.

In the specification, "bonding the first substrate and the second substrate" corresponds to bonding the circuit layer (100) formed on the first substrate (CMOS substrate W1) and the circuit layer (200) formed on the second substrate (memory substrate W2) facing each other. The memory cell array 10 may also be referred to as a "memory circuit". Each of STI and slits SLT and SHE may be referred to as an "insulating member". As used herein, "connected" indicates electrically connected, and does not exclude another element being therebetween. "Electrically connected" may cover being physically connected even via an insulator as long as the electrical connection can operate in substantially the same manner as a case without an insulator therebetween. A "taper shape" refers to a shape that narrows with distance from a reference position. A "reverse taper shape" indicates a shape that becomes thicker with distance from a reference position. A "column" refers to a structure provided in a hole formed in the manufacturing process of the memory device 1. A "diameter" refers to the inner diameter of a hole or the like in a cross section substantially parallel to the surface of the substrate. A "width" refers to the size of a component in, for example, the X or Y direction. A "semiconductor layer" may also be referred to as a "conductor layer".

A "region" herein may be considered as a portion provided in a substrate of reference. For example, if the CMOS substrate W1 is defined to include the memory region MR and the lead region HR, the memory region MR and the lead region HR are each associated with different regions above the CMOS substrate W1. A "height" corresponds to, for example, the distance in the Z direction between the aspect to be measured and the CMOS substrate W1. As the reference for the "height", configurations other than the CMOS substrate W1 may be used depending on context. A "plane position" indicates the position of the component in the planar layout. A "top (planar) view" corresponds to, for example, viewing the CMOS substrate W1 from the memory substrate W2 side.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:

a first substrate with a first circuit layer on a front surface, the first circuit layer including a CMOS circuit;

a second substrate having a front surface facing the front surface of the first substrate, the second substrate being provided with a second circuit layer on the front surface contacting the first circuit layer, and the second circuit layer including a memory circuit and transistors of a silicon-on-insulator (SOI) structure; and a first insulator layer on a back surface of the second substrate, wherein the second substrate includes:

a first insulating member in contact with the first insulator layer and dividing the second substrate into regions including well regions in each of which a transistor is formed;

the second circuit layer includes:

a second insulator layer on the front surface of the second substrate, and a gate electrode of one of the transistors facing one of the well regions with the second insulator layer being between the gate electrode and the one of the well regions; and the transistors are separated into islands by the first insulating member.

2. The memory device according to claim 1, wherein transistors in the CMOS circuit are different from the island-shaped insulating SOI structure of the transistors in the well regions of the second substrate.

3. The memory device according to claim 1, wherein the second circuit layer further includes:

a plurality of contacts extending in a first direction and having lower surfaces at the same height, the plurality of contacts including a contact coupled to the one of the well regions and a contact coupled to the gate electrode.

4. The memory device according to claim 1, wherein the second substrate includes a first impurity diffusion region including an N-type impurity, the first impurity diffusion region extending from the front surface to the back surface of the second substrate, the second circuit layer further includes:

a first semiconductor layer below the first impurity diffusion region in the first direction, a second semiconductor layer under the first semiconductor layer in the first direction, a plurality of word lines stacked in the first direction below the second semiconductor layer, and a memory pillar extending in the first direction and intersecting the plurality of word lines to form memory cells, the first semiconductor layer and the second semiconductor layer function a source line in the memory circuit, and the thickness of the second semiconductor layer along the first direction is substantially equal to the thickness of the gate electrode along the first direction.

5. The memory device according to claim 4, wherein the height of a lower surface of the second semiconductor layer is substantially the same as the height of a lower surface of the gate electrode.

6. The memory device according to claim 4, wherein each of the plurality of word lines is electrically connected to the CMOS circuit via one of the transistors of the second circuit layer.

7. The memory device according to claim 4, wherein the second circuit layer further includes a bit line extending in a second direction intersecting with the first direction, the bit line being below the plurality of word lines in the first direction and electrically connected to the memory pillar, and the bit line is also being electrically connected to the CMOS circuit via at least one of the transistors of the second circuit layer.

8. The memory device according to claim 4, further comprising:

a first conductor layer on the back surface of the second substrate, wherein the second substrate includes a second impurity diffusion region including an N-type impurity from the front surface to the back surface of the second substrate, and the first conductor layer is electrically connected to the CMOS circuit through the second impurity diffusion region.

9. The memory device according to claim 8, wherein the first conductor layer is used to supply a power supply voltage to the CMOS circuit.

10. The memory device according to claim 8, wherein the second impurity diffusion region is insulated and spaced from the first impurity diffusion region.

11. The memory device according to claim 4, wherein the memory pillar includes a third semiconductor layer extending in the first direction, and the first semiconductor layer is in contact with the third semiconductor layer via a side surface of the memory pillar.

12. The memory device according to claim 1, wherein the second substrate is provided with a plurality of memory cell arrays, and the plurality of memory cell arrays includes a first memory cell array with a memory circuit connected to the CMOS circuit via one of the transistors of the SOI structure and a second memory cell array with a memory circuit connected to the CMOS circuit by none of the transistors of the SOI structure.

13. The memory device according to claim 12, wherein the first and second circuit layers include:

a first control circuit configured to control the first memory cell array; and a second control circuit configured to control the second memory cell array, the first control circuit has a first portion on the first substrate and a second portion on the second substrate, the second control circuit is on the first substrate, and the total area of the second control circuit and the first portion of the first control circuit is the same as the total area of the first memory cell array, the second memory cell array, and the second portion of the first control circuit.

14. The memory device according to claim 13, wherein the area of the first memory cell array is different from the area of the second memory cell array.

15. The memory device according to claim 1, wherein the transistors are high-voltage transistors.

16. The memory device according to claim 1, wherein the CMOS circuit is not above the second substrate.

17. The memory device according to claim 1, wherein the first circuit layer includes a second conductor layer, the second circuit layer includes a third conductor layer in contact with the second conductor layer, the second conductor layer and the third conductor layer are connected in series between the transistors and the CMOS circuit, the second conductor layer has a reverse taper shape, and the third conductor layer has a taper shape.

18. A memory device, comprising:

a first substrate with a first circuit layer on a front surface, the first circuit layer including a CMOS circuit; and a second substrate having a front surface facing the front surface of the first substrate in a first direction, the second substrate being provided with a second circuit layer on the front surface contacting the first circuit layer, and the second circuit layer including a first-type transistor and a memory circuit, wherein the second substrate includes:

a first impurity diffusion region including N-type impurities, the first impurity diffusion region extending from the front surface to a back surface of the second substrate, and a well region insulated and spaced from the first impurity diffusion region, the second circuit layer includes:

a first semiconductor layer below the first impurity diffusion region, a second semiconductor layer under the first semiconductor layer, a plurality of word lines stacked in the first direction below the second semiconductor layer, a memory pillar extending in the first direction and intersecting with the plurality of word lines to form memory cell transistors, and a gate electrode of the first-type transistor facing the well region, the well region functioning as an active region of the first-type transistor, the first-type transistor being different from the memory cell transistor, the first impurity diffusion region, the first semiconductor layer, and the second semiconductor layer function as a source line in the memory circuit, the well region is at a position corresponding to the first impurity diffusion region in the first direction, and the gate electrode is at a position corresponding to the second semiconductor layer in the first direction.

19. The memory device according to claim 18, wherein a first portion of the memory circuit is electrically connected to the CMOS circuit via the first-type transistor.

20. A memory device, comprising:

a first substrate with a first circuit layer on a front surface, the first circuit layer including a CMOS circuit; and a second substrate having a front surface facing the front surface of the first substrate, the second substrate being provided with a second circuit layer on the front surface contacting the first circuit layer, and the second circuit layer including a memory circuit and transistors of a silicon-on-insulator (SOI) structure, wherein the second substrate is provided with a plurality of memory cell arrays, the plurality of memory cell arrays includes a first memory cell array with a memory circuit connected to the CMOS circuit via one of the transistors of the SOI structure and a second memory cell array with a memory circuit connected to the CMOS circuit by none of the transistors of the SOI structure, the first and second circuit layers include:

a first control circuit configured to control the first memory cell array; and a second control circuit configured to control the second memory cell array, the first control circuit has a first portion on the first substrate and a second portion on the second substrate, the second control circuit is on the first substrate, and the total area of the second control circuit and the first portion of the first control circuit is the same as the total area of the first memory cell array, the second memory cell array, and the second portion of the first control circuit.

* * * * *